(12) United States Patent
Kawato et al.

(10) Patent No.: US 8,882,918 B2
(45) Date of Patent: Nov. 11, 2014

(54) VAPOR DEPOSITION APPARATUS

(75) Inventors: Shinichi Kawato, Osaka (JP); Satoshi Inoue, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/876,573

(22) PCT Filed: Sep. 26, 2011

(86) PCT No.: PCT/JP2011/071909
§ 371 (c)(1),
(2), (4) Date: Mar. 28, 2013

(87) PCT Pub. No.: WO2012/043487
PCT Pub. Date: Apr. 5, 2012

(65) Prior Publication Data
US 2013/0186335 A1  Jul. 25, 2013

(30) Foreign Application Priority Data
Sep. 29, 2010  (JP) .................. 2010-219712

(51) Int. Cl.
*C23C 16/00*  (2006.01)
*C23C 14/24*  (2006.01)
*C23C 14/12*  (2006.01)
*H05B 33/10*  (2006.01)
*C23C 14/04*  (2006.01)
*C23C 14/56*  (2006.01)
*H01L 51/00*  (2006.01)

(52) U.S. Cl.
CPC ............ *H05B 33/10* (2013.01); *C23C 14/24* (2013.01); *C23C 14/12* (2013.01); *H01L 51/001* (2013.01); *C23C 14/042* (2013.01); *C23C 14/562* (2013.01)
USPC ........... 118/720; 118/718; 118/719; 118/726; 118/729

(58) Field of Classification Search
USPC ......................................... 118/719
See application file for complete search history.

(56) References Cited

U.S. PATENT DOCUMENTS

2009/0017192 A1 * 1/2009 Matsuura ...................... 427/66
2010/0212596 A1 * 8/2010 Eida et al. ................... 118/729

(Continued)

FOREIGN PATENT DOCUMENTS

JP  58-221272 A  12/1983
JP  2004-31444 A  1/2004

(Continued)

OTHER PUBLICATIONS

International Search Report received for PCT Patent Application No. PCT/JP2011/071909, mailed on Nov. 22, 2011, 5 pages (2 pages of English Translation and 3 pages of PCT Search Report).

*Primary Examiner* — Parviz Hassanzadeh
*Assistant Examiner* — Nathan K Ford
(74) *Attorney, Agent, or Firm* — Morrison & Foerster LLP

(57) ABSTRACT

A vapor deposition apparatus (50) includes: a mask unit (54) including a vapor deposition source (70), a vapor deposition mask (60), and a mask holding member (80); a substrate holder (52); and at least either a mask unit moving mechanism (55) or a substrate moving mechanism (53), with a roller (83) provided in a surface of one of (A) the substrate holder (52) and (B) the mask holding member (80) which faces the other one of (A) the substrate holder (52) and (B) the mask holding member (80).

22 Claims, 26 Drawing Sheets

(56) References Cited

U.S. PATENT DOCUMENTS

| | | |
|---|---|---|
| 2010/0297348 A1 | 11/2010 | Lee et al. |
| 2011/0033964 A1 | 2/2011 | Oh et al. |
| 2011/0045617 A1* | 2/2011 | Kang et al. ............ 438/22 |
| 2011/0165327 A1 | 7/2011 | Park et al. |
| 2011/0262625 A1 | 10/2011 | Park et al. |

FOREIGN PATENT DOCUMENTS

| | | |
|---|---|---|
| JP | 2004-127998 A | 4/2004 |
| JP | 2004-349101 A | 12/2004 |
| JP | 2010-140852 A | 6/2010 |
| JP | 2011-32579 A | 2/2011 |
| JP | 2011-140717 A | 7/2011 |

* cited by examiner

FIG. 4
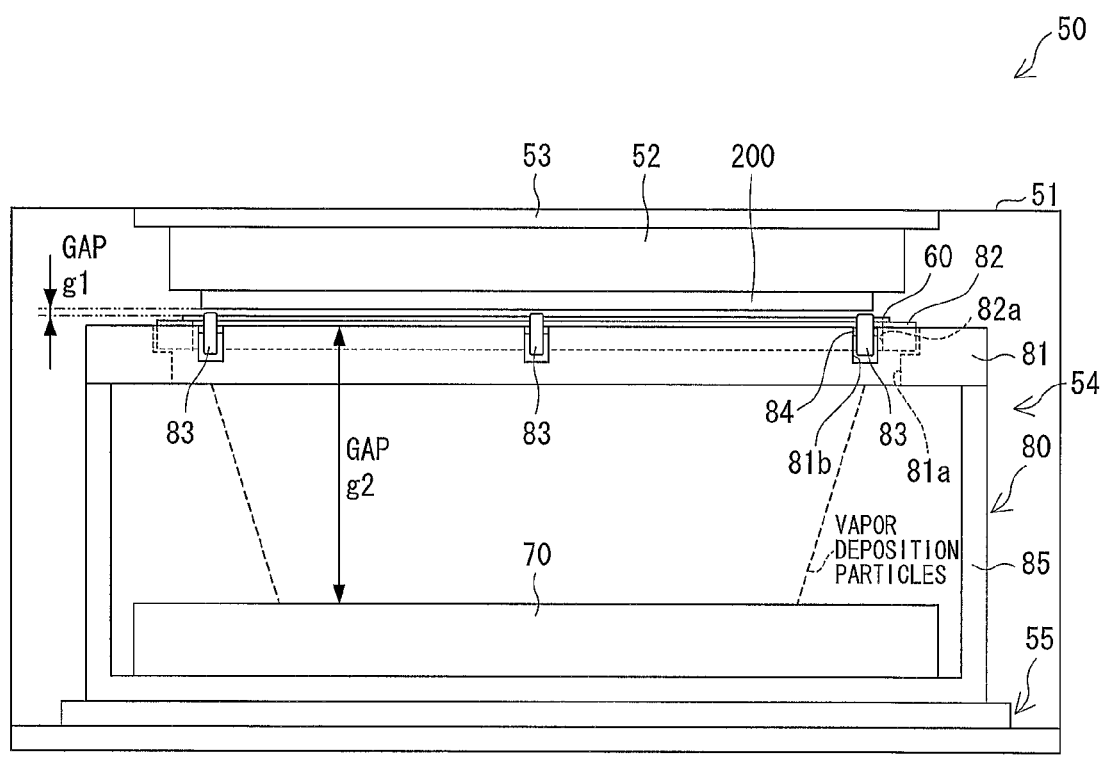
Y:SCANNING DIRECTION

F I G. 6
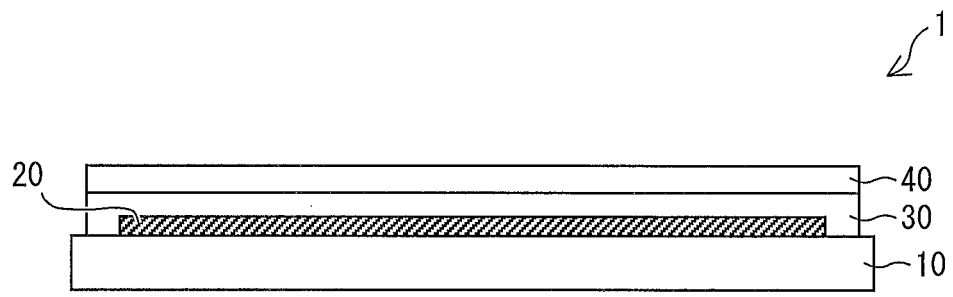

F I G. 1 0
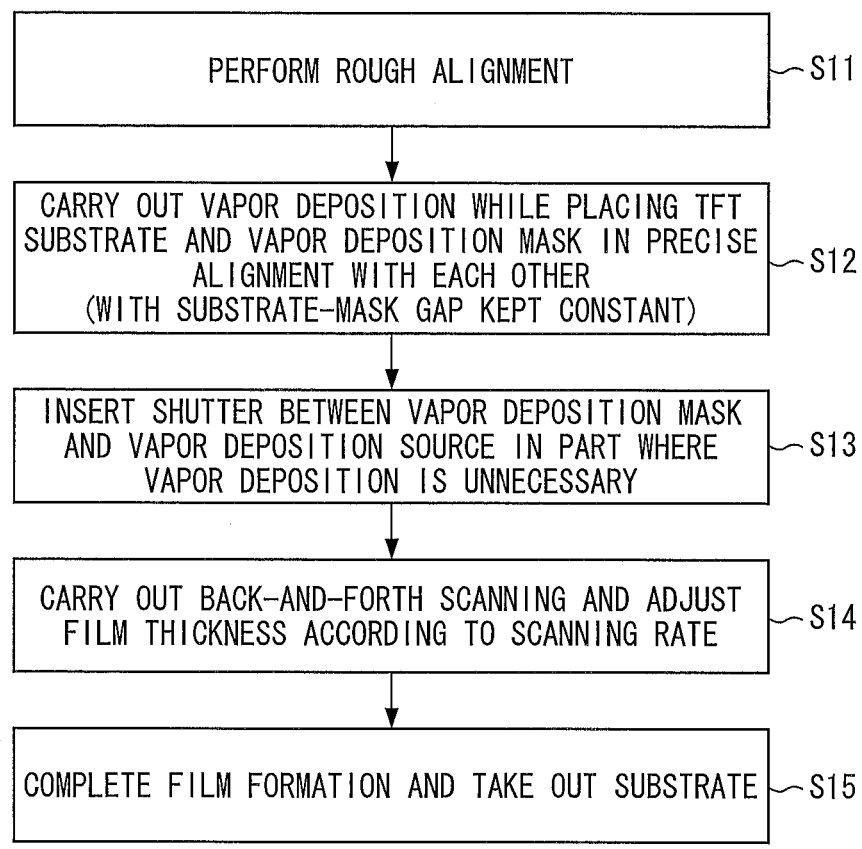

Y: SCANNING DIRECTION

FIG. 17
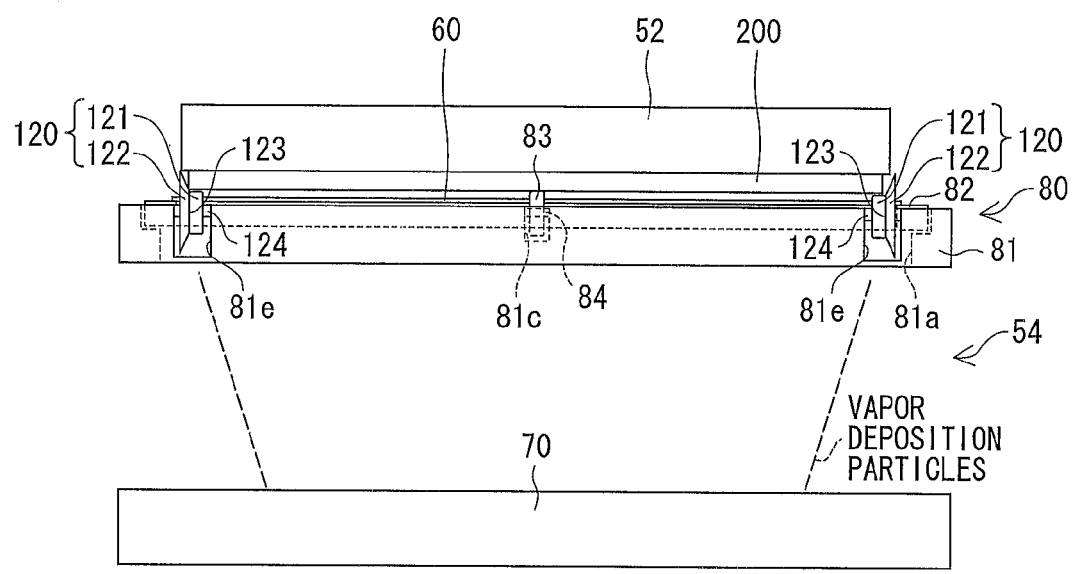
Y:SCANNING DIRECTION

FIG. 20
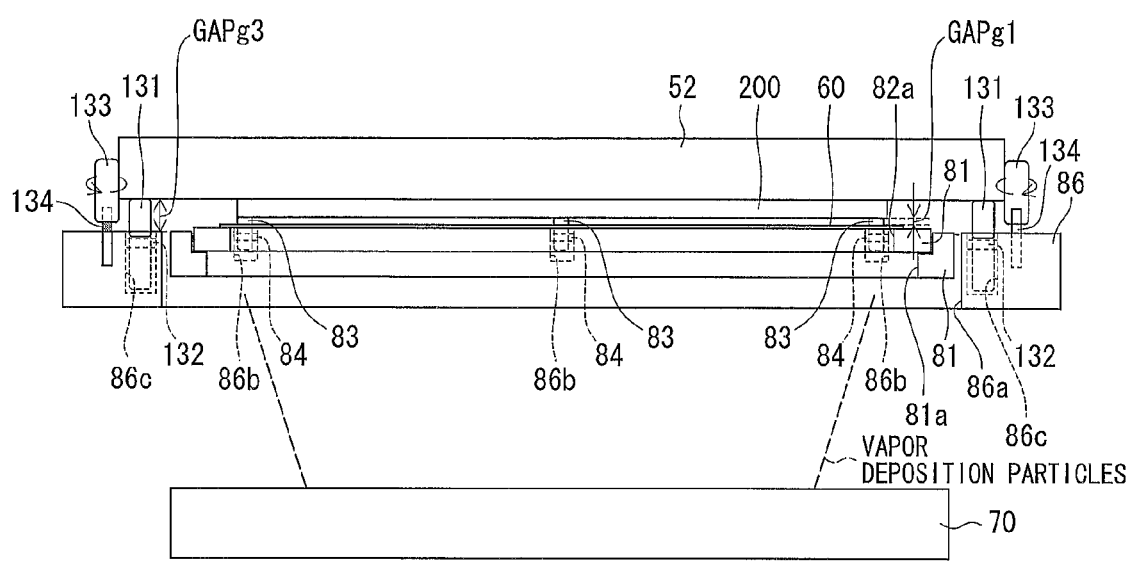
Y:SCANNING DIRECTION

FIG. 22
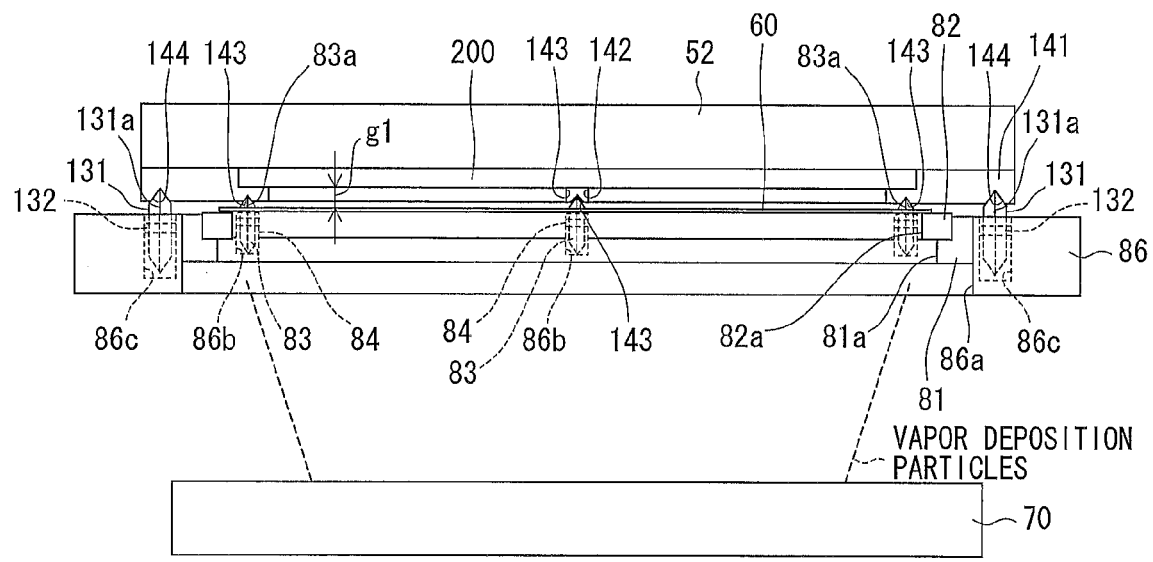
Y:SCANNING DIRECTION

F I G. 2 4
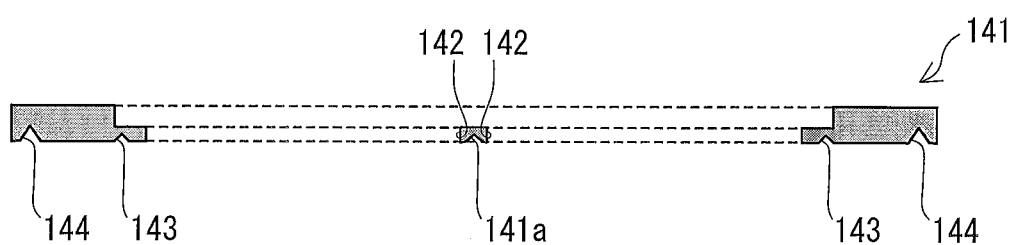

FIG. 27
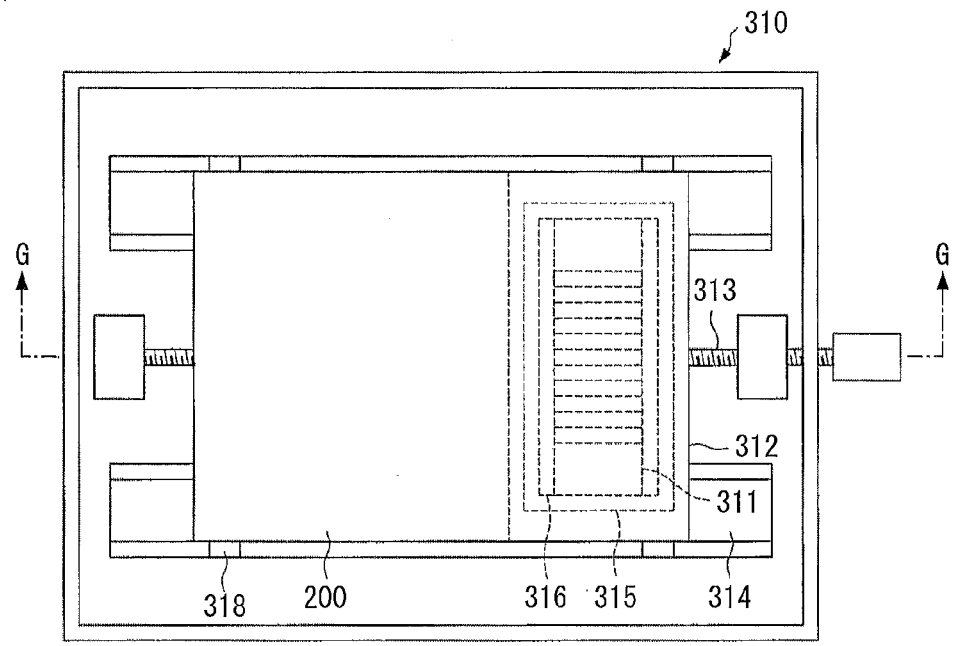
(a)
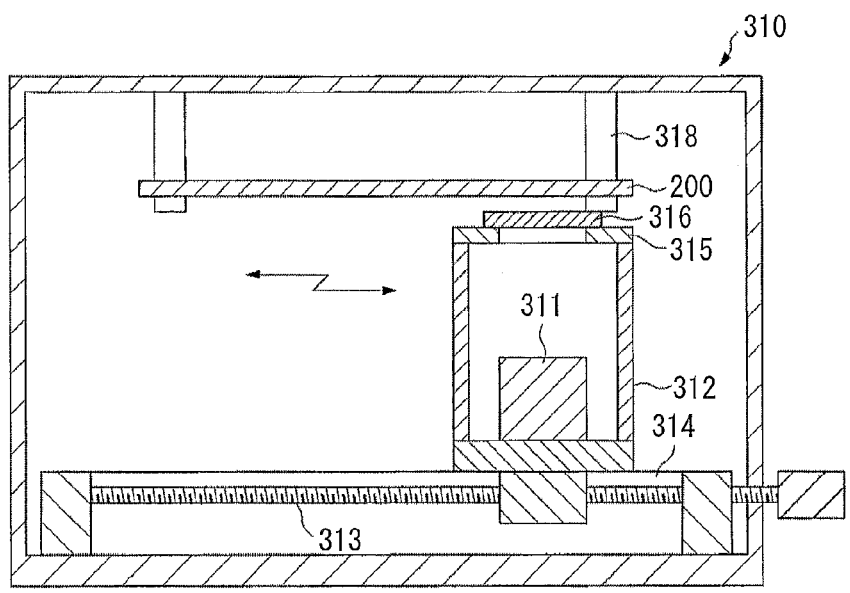
(b)

FIG. 28
(a)
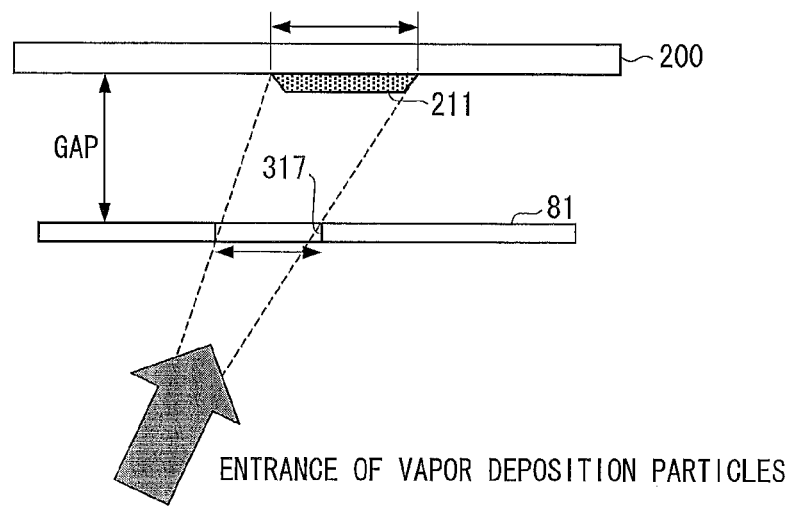
ENTRANCE OF VAPOR DEPOSITION PARTICLES
(b)
CHANGES IN POSITION AND WIDTH OF PIXEL PATTERN
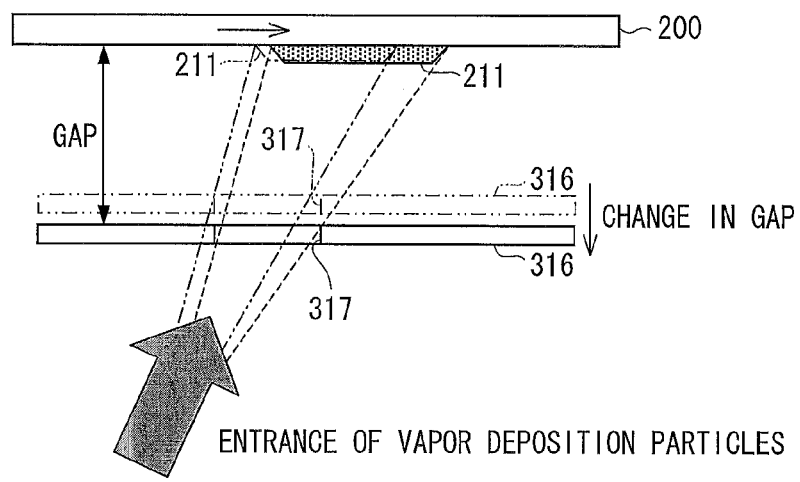
ENTRANCE OF VAPOR DEPOSITION PARTICLES

VAPOR DEPOSITION APPARATUS

CROSS REFERENCE TO RELATED APPLICATIONS

This is a U.S. National Phase patent application of PCT/JP2011/071909, filed Sep. 26, 2011, which claims priority to Japanese Patent Application No. 2010-219712, filed Sep. 29, 2010, each of which is hereby incorporated by reference in the present disclosure in its entirety.

TECHNICAL FIELD

The present invention relates to a vapor deposition apparatus that carries out vapor deposition with use of a vapor deposition mask.

BACKGROUND ART

In recent years, flat-panel displays have been utilized in various products and fields, and have been required to be larger in size, higher in image quality, and lower in power consumption.

Under such circumstances, an organic EL display device including an organic EL element utilizing the electroluminescence (hereinafter abbreviated as "EL") of an organic material has attracted a great deal of attention as a flat-panel display which is of an all-solid type and which is excellent in low-voltage driving, high-speed responsiveness, self-luminous property, etc.

An organic EL display device is for example constituted by a substrate made of glass or the like, TFTs (thin-film transistor) provided on the substrate, and organic EL elements connected to the TFTs.

An organic EL element is a light-emitting element capable of emitting high-intensity light by low-voltage direct-current driving, and has a structure in which a first electrode, an organic EL layer, and a second electrode are stacked in this order. Among them, the first electrode is connected to a TFT. Further, provided as the EL organic layer between the first electrode and the second electrode is an organic layer obtained by stacking a positive-hole injection layer, a positive-hole transport layer, an electron blocking layer, a light emitting layer, a positive-hole blocking layer, an electron transport layer, an electron injection layer, etc.

In general, a full-color organic EL display device has an array of red (R), green (G), and blue (B) organic EL elements formed as subpixels on a substrate, and displays an image by selectively causing these organic EL elements to emit light at a desired luminance.

In the manufacture of such an organic EL display device, a light-emitting layer composed of organic light-emitting materials that emit their respective colors of light is formed as a pattern for each organic EL element serving as a light-emitting element.

Known as a method for forming a light-emitting layer as a pattern in this manner is for example a vacuum deposition method using a mask for use in vapor deposition mask that is referred to as a shadow mask (e.g., see Patent Literature 1).

In such a case where an organic EL display device is manufactured with use of vacuum deposition, a larger substrate size means, in general, that the number of panels that can be formed from a single substrate is larger and the cost of each single panel is lower. For this reason, use of a lager-sized substrate allows an organic EL display device to be manufactured at lower cost.

Accordingly, Patent Literature 1 discloses a method for, by using a vapor deposition mask that is smaller in size than a film formation substrate on which a film is to be formed and carrying out vapor deposition while moving the vapor deposition mask and a vapor deposition source relative to the film formation substrate, forming a vapor-deposited film on the film formation substrate of a large size.

(a) of FIG. 27 is a plan view schematically showing a vapor deposition apparatus described in Patent Literature 1, and (b) of FIG. 27 is a cross-sectional view of the vapor deposition apparatus taken along an arrow shown in (a) of FIG. 27.

As shown in (a) and (b) of FIG. 27, a vapor deposition apparatus 310 described in Patent Literature 1 includes a vapor deposition source 311, a vapor deposition source container 312 in which the vapor deposition source 311 is stored, a ball screw 313 to which the vapor deposition source container 312 is assembled, a liner guide 314 along which the vapor deposition source container 312 can move along the major axis of the ball screw 313 as the ball screw 313 rotates on its axis.

Provided on top of the vapor deposition source container 312 is a mask holding part 315, with a vapor deposition mask 316 fixed to the mask holding part 315.

A film formation substrate 200 on which a film is to be formed is held by a substrate holding part 318 in such a manner as to have its vapor deposition surface facing the vapor deposition source 311.

The vapor deposition source 311 and the vapor deposition mask 316 are moved relative to the film formation substrate 200 by moving together along the major axis of the ball screw 313 as the rotation of the ball screw 313 causes the vapor deposition source container 312 to move.

CITATION LIST

Patent Literature 1
Japanese Patent Application Publication, Tokukai, No. 2004-349101 A (Publication Date: Dec. 9, 2004)

SUMMARY OF INVENTION

Technical Problem

In order to avoid damage to the film formation substrate 200 or the vapor deposition mask 200 in moving the vapor deposition source 311 and the vapor deposition mask 311 relative to the film formation substrate 200 as described in Patent Literature 1, it is necessary to provide a gap so that the film formation substrate 200 and the vapor deposition mask 316 do not touch each other.

It should be noted here that in order to prevent the resulting pattern of vapor deposition from being out of alignment, it is necessary to keep the amount of space between the film formation substrate 200 and the vapor deposition mask 316, i.e., the height of the gap constant.

In practice, however, factors underlying the precision of the apparatus per se and factors of thermal expansion of the members cause the amount of space to constantly change, were it not for a method for keeping the gap constant.

(a) and (b) of FIG. 28 show a relationship between an opening 317 in the vapor deposition mask 316 and the vapor depositional width and vapor depositional position of the vapor-deposited film 211 in a case where there is a gap provided between the film formation substrate 200 and the vapor deposition mask 316.

As shown in (a) and (b) of FIG. 28, in a case where there is a gap provided between the film formation substrate 200 and the vapor deposition mask 316, the vapor depositional width (e.g., the pattern width of a pixel pattern) and vapor depositional position of the vapor-deposited film 211 that is actually vapor-deposited on the film formation substrate 200 do not necessarily coincide with the width and the position of the opening 317 in the vapor deposition mask 316.

For example, in a case where the film formation substrate 200 and the vapor deposition mask 316 are in such a positional relationship as that shown in (a) of FIG. 28 and vapor deposition particles fly in the direction of the arrow shown in (a) of FIG. 28, the pattern of vapor deposition of the vapor-deposited film 211 (e.g., the pixel pattern that is formed by the vapor-deposited pattern) exhibits changes in width and position with respect to the opening 317 in the vapor deposition mask 316.

Therefore, in a case where the amount of space between the film formation substrate 200 and the vapor deposition mask 316 has changed from the state indicated by a two-dot chain line to the state indicated by a solid line as shown in (b) of FIG. 28, the pattern of vapor deposition of the vapor-deposited film 211 ends up exhibiting further changes in width and position with respect to the opening 317 on the vapor deposition mask 316.

In such a case where there exists a gap between the film formation substrate 200 and the vapor deposition mask 316, a change in the amount of space in the gap leads to a change in the vapor depositional width and vapor deposition position of the resulting vapor-deposited film 211.

Therefore, failure to keep the amount of space constant causes the pattern of vapor deposition to be out of alignment, thus making it impossible to form a high-precision pattern of vapor deposition over the entire vapor deposition region of the film formation substrate 200.

However, as shown in (a) and (b) of FIG. 28, the film formation substrate 200 is merely held by the substrate holding part 318 at a start edge of the film formation substrate 200 from which the vapor deposition source container 312 starts moving along a direction of movement and an end edge of the film formation substrate 200 at which the vapor deposition source container 312 finishes moving along the direction of movement. As such, Patent Literature 1 gives no thought about a change in the amount of space due to self-weight deflection and/or thermal expansion of the film formation substrate 200.

Especially in a case where the film formation substrate 200 is a large-sized substrate, the film formation substrate 200 tends to bend, and simply holding the film formation substrate 200 at the start and end edges results in a change in the amount of space due to deflection of the film formation substrate 200.

However, Patent Literature 1 gives no though about such a change in the amount of space, nor does Patent Literature 1 provide any mechanism for keeping the amount of space constant.

Therefore, the method described in Patent Literature 1 cannot keep the gap constant, and ends up with blurring of the pattern of vapor deposition (change in the pattern width) and/or misalignment of the pattern of vapor deposition. For this reason, the vapor deposition apparatus 310 described in Patent Literature 1 cannot form a high-precision pattern of vapor deposition over the entire vapor deposition region, although such a pattern of vapor deposition is necessary for a display device such as an organic EL display device.

The present invention has been made in view of the foregoing problems, and it is an object of the present invention to provide a vapor deposition apparatus capable of forming a high-precision pattern of vapor deposition on a large-sized substrate.

Solution to Problem

In order to solve the foregoing problems, a vapor deposition apparatus according to the present invention is a vapor deposition apparatus for forming a film of a predetermined pattern on a film formation substrate on which the film is to be formed, the vapor deposition apparatus including: a substrate holding member for holding the substrate; a mask unit including (i) a vapor deposition source from which vapor deposition particles are ejected, (ii) a vapor deposition mask which has openings and causes the vapor deposition particles ejected from the vapor deposition source to be vapor-deposited on the film formation substrate through the openings, and (iii) a mask holding member for holding the vapor deposition mask, the vapor deposition mask being smaller in area than the film formation substrate, the vapor deposition source and the vapor deposition mask having their relative positions fixed; and moving means for causing a relative movement of at least one of (A) the mask unit and (B) the substrate holding member for scanning, the substrate holding member and the mask holding member being placed opposite each other so that the vapor deposition mask and the film formation substrate face each other during scanning, the vapor deposition apparatus further comprising a gap retaining member provided in a surface of at least one of (A) the substrate holding member and (B) the mask holding member which faces the other one of (A) the substrate holding member and (B) the mask holding member, the gap retaining member protruding toward the other member, the gap retaining member rotating, during scanning, in a scanning direction while in contact with the member it faces and thereby keeping a gap between the vapor deposition mask and the film formation substrate constant during scanning.

According to the foregoing configuration, scanning is carried out with the gap retaining member in contact with the film formation substrate, so that the retention of the gap between the vapor deposition mask and the film formation substrate is increased. This makes it less likely for the film formation substrate and the vapor deposition mask to touch each other, thus making it possible to achieve a narrower gap.

Further, according to the foregoing configuration, the gap can be accurately controlled, and can therefore be kept at a desired constant value. This makes it possible to suppress fluctuations in width, displacements, deformations, etc. of a pattern that is formed by a vapor-deposited film that is vapor-deposited through the openings in the vapor deposition mask, thus making it possible to highly accurately form a high-precision pattern over the entire surface of the film formation substrate.

Further, the foregoing configuration does not require a complex mechanism for retaining the gap, and can therefore keep the gap constant with a simple mechanism. Therefore, the configuration of the apparatus can be simplified. This makes it possible to reduce the unit price of the apparatus, improve mass productivity, and reduce the cost of panels per unit price.

Advantageous Effects of Invention

A vapor deposition apparatus according to the present invention includes a gap retaining member provided in a surface of at least one of (A) a substrate holding member for holding a film formation substrate on which a film is to be formed and (B) a mask holding member for holding a vapor deposition mask which surface faces the other one of (A) the substrate holding member and (B) the mask holding member, the gap retaining member protruding toward the other member, the gap retaining member rotating, during scanning, in a scanning direction while in contact with the member it faces and thereby keeping a gap between the vapor deposition mask and the film formation substrate constant during scanning.

Therefore, the gap can be accurately controlled, and can therefore be kept at a desired constant value. This makes it possible to suppress fluctuations in width, displacements, deformations, etc. of a pattern that is formed by a vapor-deposited film that is vapor-deposited through the openings in the vapor deposition mask, thus making it possible to highly accurately form a high-precision pattern over the entire surface of the film formation substrate.

Further, the present invention does not require a complex mechanism for retaining the gap, and can therefore keep the gap constant with a simple mechanism. Therefore, the configuration of the apparatus can be simplified. This makes it possible to reduce the unit price of the apparatus, improve mass productivity, and reduce the cost of panels per unit price.

BRIEF DESCRIPTION OF DRAWINGS

FIG. 4 is a cross-sectional view of the vapor deposition apparatus as taken along the arrow B-B shown in FIG. 3.

FIG. 6 is a cross-sectional view schematically showing a configuration of an organic EL display device that carries out an RGB full-color display.

FIG. 10 is a flow chart showing an example of a method for forming a film of a predetermined pattern on a TFT substrate by using the vapor deposition apparatus according to Embodiment 1 of the present invention.

FIG. 17 is a cross-sectional view schematically showing a configuration of the main components of the vapor deposition apparatus according to Embodiment 7 of the present invention during vapor deposition, as taken along the arrow C-C shown in FIG. 16.

FIG. 20 is a cross-sectional view schematically showing a configuration of the main components of the vapor deposition apparatus according to Embodiment 8 of the present invention during vapor deposition, as taken along the arrow D-D shown in FIG. 19.

FIG. 22 is a cross-sectional view schematically showing a configuration of the main components of the vapor deposition apparatus according to Embodiment 9 of the present invention during vapor deposition, as taken along the arrow E-E shown in FIG. 21.

FIG. 24 is a cross-sectional view of the substrate frame as taken along the arrow F-F shown in FIG. 23.

FIG. 27 is a set of views (a) and (b), (a) being a plan view schematically showing a vapor deposition apparatus described in Patent Literature 1, (b) being a cross-sectional view of the vapor deposition apparatus as taken along the arrow shown in (a) of FIG. 27.

FIG. 28 is a set of diagrams (a) and (b) showing a relationship between an opening in a vapor deposition mask and the vapor depositional width and vapor depositional position of a vapor-deposited film in a case where there is a gap provided between a film formation substrate on which the film is to be formed and the vapor deposition mask.

DESCRIPTION OF EMBODIMENTS

In the following, embodiments of the present invention are described in detail.

Embodiment 1

An embodiment of the present invention is described below with reference to FIGS. 1 through 10.

In the following description, components having the same functions as those shown in (a) and (b) of FIG. 28 are given the same reference signs.

Figure 1:
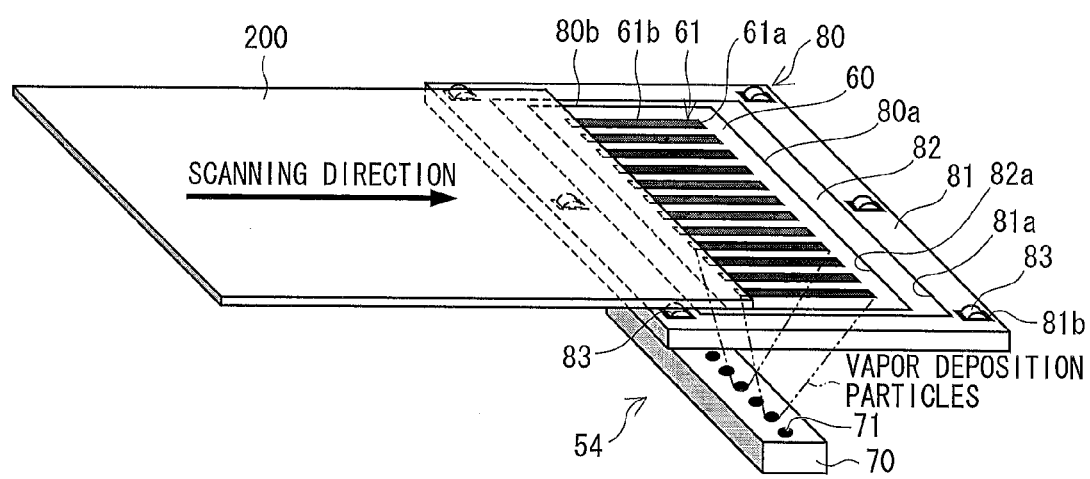
FIG. 1 is a bird's-eye view showing a relationship among main components provided in a vacuum chamber of a vapor deposition apparatus according to Embodiment 1 of the present invention, with the main components being looked at obliquely from above.
Figure 2:
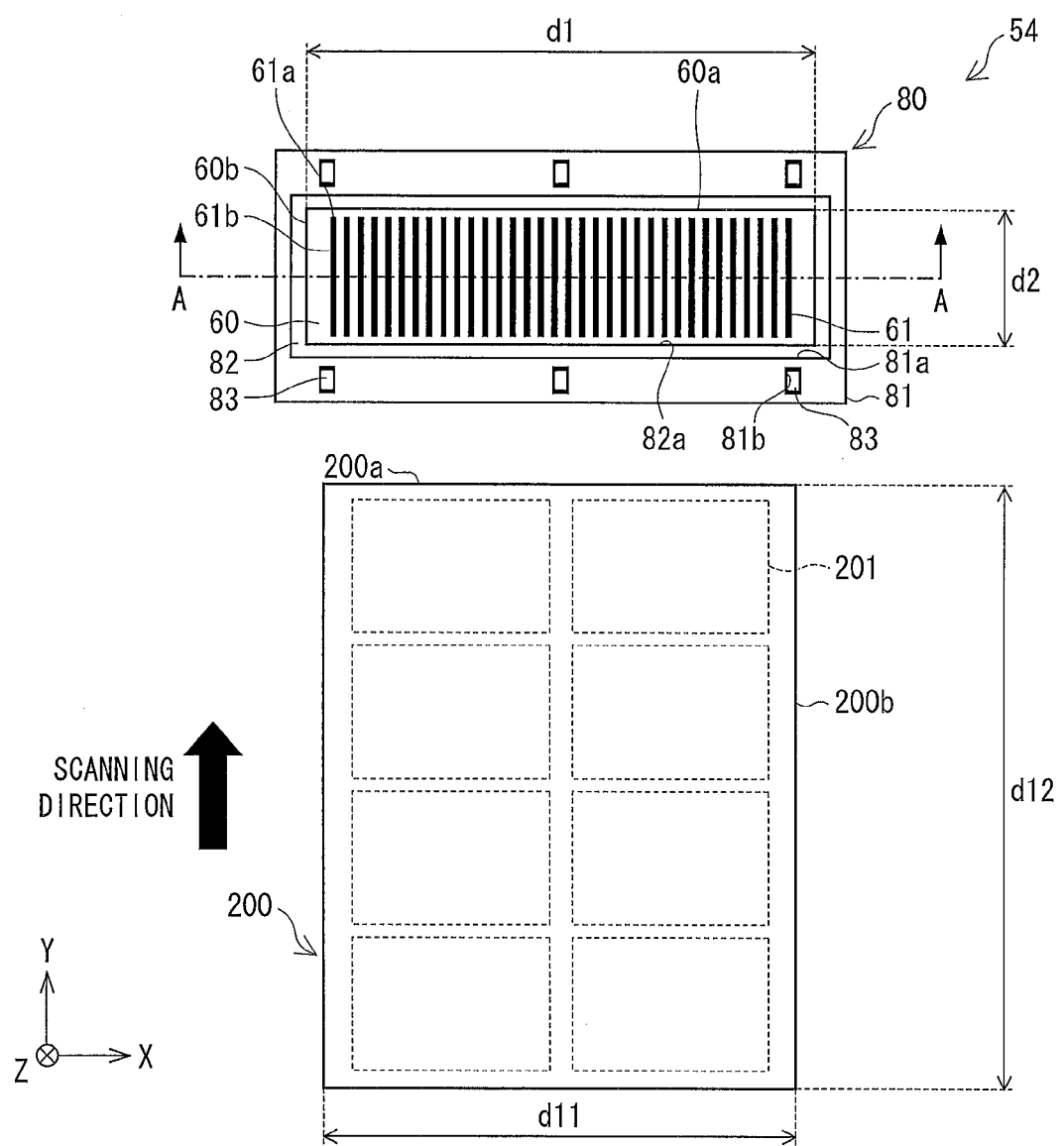
FIG. 2 is a plan view showing the main components provided in the vacuum chamber of the vapor deposition apparatus according to Embodiment 1 of the present invention.

FIG. 1 is a bird's-eye view showing a relationship among main components provided in a vacuum chamber of a vapor deposition apparatus according to the present embodiment, with the main components being looked at obliquely from above. FIG. 2 is a plan view showing the main components provided in the vacuum chamber of the vapor deposition apparatus according to the present embodiment.

Figure 3:
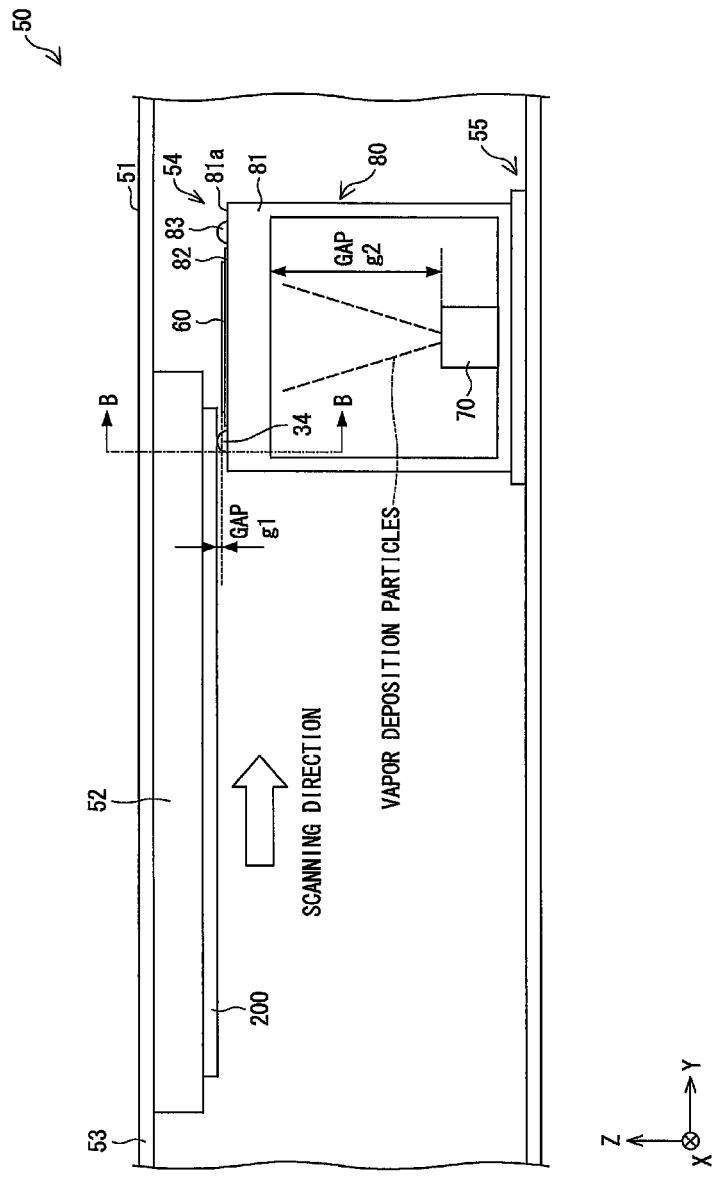
FIG. 3 is a cross-sectional view schematically showing a configuration of a main part of the vapor deposition apparatus according to Embodiment 1 of the present invention.
Figure 5:
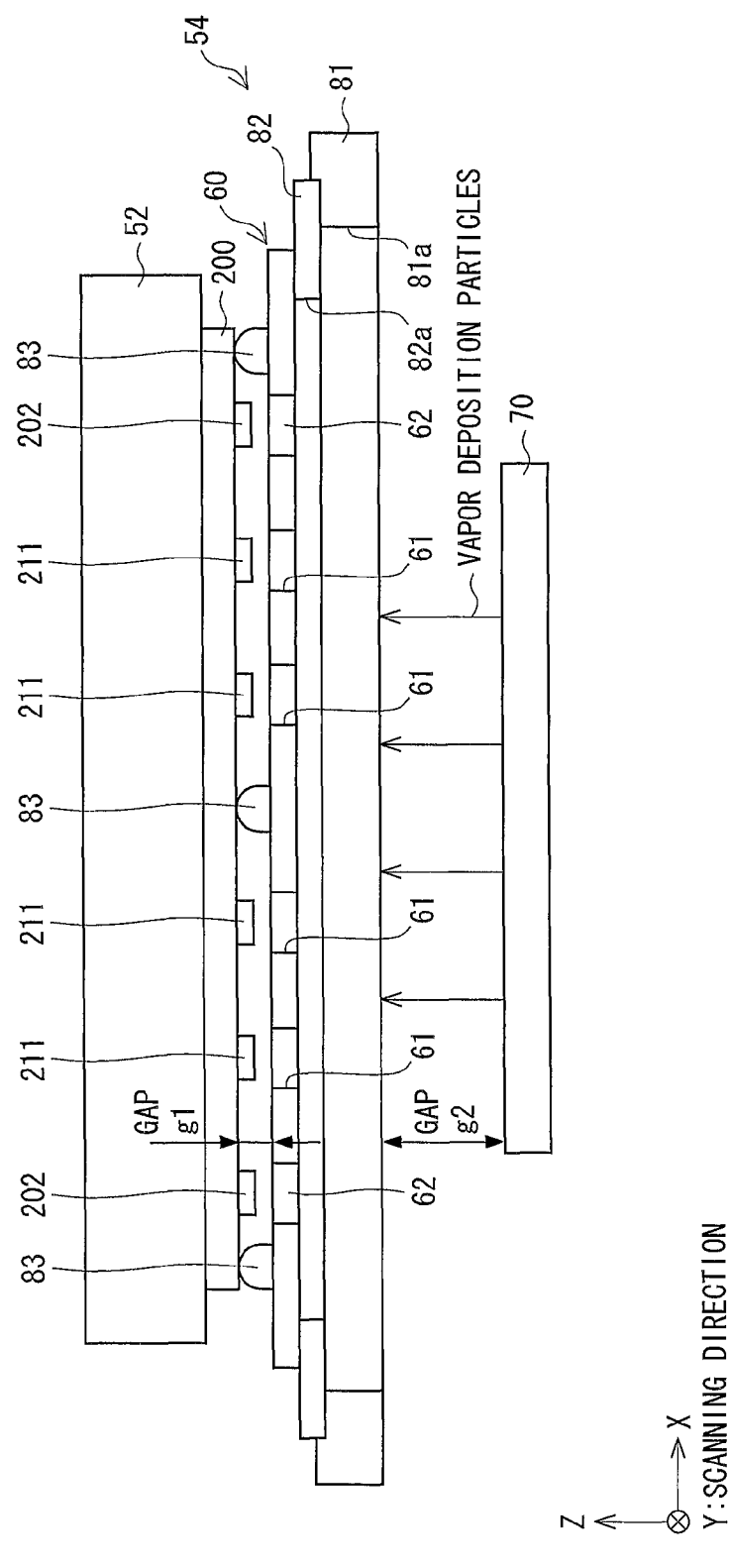
FIG. 5 is a cross-sectional view schematically showing a configuration of a main part of the vapor deposition apparatus according to Embodiment 1 of the present invention during vapor deposition, as taken along the arrow A-A shown in FIG. 2.

FIG. 3 is a cross-sectional view schematically showing a configuration of a main part of the vapor deposition apparatus according to the present embodiment. FIG. 4 is a cross-sectional view of the vapor deposition apparatus as taken along the arrow B-B shown in FIG. 3. FIG. 5 is a cross-sectional view schematically showing a configuration of a main part of the vapor deposition apparatus according to the present embodiment during vapor deposition, as taken along the arrow A-A shown in FIG. 2.

It should be noted that FIGS. 1, 3, and 4 show a state in which scanning has been advanced from the state shown in FIG. 2. Further, FIG. 5 shows a state in which scanning has been further advanced from the state shown in FIGS. 1, 3, and 4. It should be noted that FIGS. 1 and 2 omit to illustrate a substrate holder.

<Overall Configuration of a Vapor Deposition Apparatus>

As shown in FIG. 3, a vapor deposition apparatus 50 according the present embodiment includes a vacuum chamber 51 (film-forming chamber), a substrate holder 52 serving as a substrate holding member to hold a film formation substrate 200 on which a film is to be formed, a substrate moving mechanism 53 (substrate moving means) that moves the substrate 200, a mask unit 54, a mask unit moving mechanism 55 (mask unit moving means) that moves the mask unit 54.

As shown in FIGS. 3 and 4, the substrate holder 52, the substrate moving mechanism 53, the mask unit 54, the mask unit moving mechanism 55 are provided in the vacuum chamber 51.

It should be noted that the vacuum chamber 51 is provided with a vacuum pump (not illustrated) that evacuates the vacuum chamber 51 via an outlet (not illustrated) provided in the vacuum chamber 51, so as to hold the vacuum chamber 51 with vacuum during vapor deposition.

The substrate holder 52 holds the film formation substrate 200, which is constituted by a TFT substrate and the like, in such a manner that a film formation surface of the film formation substrate 200 faces a vapor deposition mask 60 of the mask unit 54.

The film formation substrate 200 and the vapor deposition mask 60 are placed opposite each other at a certain distance from each other, with a gap g1 of a certain height provided between the film formation substrate 200 and the vapor deposition mask 60.

It is preferable, for example, to use an electrostatic chuck or the like as the substrate holder 52. Use of a technique such as an electrostatic chuck as the substrate holder 52 to fix the film formation substrate 200 allows the film formation substrate 200 to be held by the substrate holder 52 without self-weight deflection.

It should be noted that actual panel regions 201 on the film formation substrate 200 are regions each surrounded by a dotted line in FIG. 2. Various patterns such as TFT circuits and wires are formed in the panel regions 201, and there are no pattern such as TFT circuits or wires in the other regions.

The substrate moving mechanism 53 includes a motor (not illustrated) and, by driving the motor with a motor drive control section (not illustrated), moves the film formation substrate 200 held by the substrate holder 52.

Further, the mask unit moving mechanism 55 includes a motor (not illustrated) and, by driving the motor with a motor drive control section (not illustrated), moves the mask unit 54 relative to the film formation substrate 200 while keeping the relative positions of the vapor deposition mask 60 (to be described later) and a vapor deposition source 70 (described later).

The substrate moving mechanism 53 and the mask unit moving mechanism 55 may each be a roller moving mechanism or a hydraulic moving mechanism, for example.

It is preferable that the film formation substrate 200 be provided so as to be movable by the substrate moving mechanism in any direction along the X axis, the Y axis, or the Z axis. Further, it is preferable that the mask unit 54 be provided so as to be movable by the mask unit moving mechanism 55 in any direction along the X axis, the Y axis, or the Z axis.

It should be noted, however, that at least either the film formation substrate 200 or the mask unit 54 needs only be provided so as to be capable of making a relative movement. In other words, at least either the substrate moving mechanism 53 or the mask unit moving mechanism 55 needs only be provided.

For example, in a case where the film formation substrate 200 is movably provided, the mask unit 54 may be fixed to an inner wall of the vacuum chamber 51. On the other hand, in a case where the mask unit moving mechanism 55 is movably provided, the substrate holder 52 may be fixed to an inner wall of the vacuum chamber 51.

Next, a configuration of the mask unit 54 is described in detail.

<Overall Configuration of the Mask Unit>

As shown in FIGS. 1 through 5, the mask unit 54 includes the vapor deposition mask 60, which is called a shadow mask, the vapor deposition source 70, a mask holding member 80, and a shutter (not illustrated).

Further, the mask holding member 80 includes a mask holder 81, a mask tray 82, and a mask holder fixing member 85. The vapor deposition mask 60 is mounted on the mask tray 82 placed on the mask holder 81. That is, the mask holder 81 holds the vapor deposition mask 60 by holding the mask tray 82 directly holding the vapor deposition mask 60. The vapor deposition source 70 is placed beneath the vapor deposition mask 60.

The mask holder 81 is held and fixed by the mask holder fixing member 85. It should be noted that the mask holder fixing member 85 is not particularly limited in shape, but needs only be able to hold and fix the mask holder 81 at a certain distance from the vapor deposition source 70.

The vapor deposition mask 60 and the vapor deposition source 70 are integrally held by the mask holding member 80, and have their positions fixed relative to each other.

That is, the height (vertical distance) of a gap g2 (see FIGS. 3 through 5) between the vapor deposition mask 60 and a surface of the vapor deposition source 70 in which nozzles holes 71 are formed is kept constant, and the positions of openings 61 in the vapor deposition mask 60 and the nozzle holes 71 in the vapor deposition source 70 relative to one another are also kept constant.

However, in order for the film formation substrate 200 to be moved relative to the mask unit 54, the vapor deposition mask 60 and the vapor deposition source 70 do not need to be integrated, provided that they have their positions fixed relative to each other.

For example, the relative positions of the vapor deposition mask 60 and the vapor deposition source 70 may be fixed by fixing the vapor deposition source 70 and the mask holding member 80 to inner walls of the vacuum chamber 51, respectively.

The vapor deposition mask 60 and the vapor deposition source 70 are placed opposite each other at a certain distance from each other so that the gap g2 between the vapor deposition mask 60 and the vapor deposition source 70 has a constant height.

The gap g2 can be set to have any height, and is not to be particularly limited. However, for enhanced efficiency in the use of a vapor deposition material, it is desirable that the gap g2 be as small as it can be. For example, the gap g2 is set to have a height of approximately 100 mm.

<Configuration of the Vapor Deposition Mask>

As the vapor deposition mask 60, a mask made of metal is suitably used.

The vapor deposition mask 60 is smaller in size than the film formation substrate 200, and is formed so that at least one side of the vapor deposition mask 60 is shorter than a width of a side of the film formation substrate 200 which is parallel to that side of the vapor deposition mask 60.

As shown in FIG. 2, the present embodiment uses, as the vapor deposition mask 60, a vapor deposition mask of a rectangular shape (belt shape) whose long side 60a (side extending along a longitudinal direction perpendicular to the scanning direction) has a width d1 longer than a width d11 of a short side 200a of the film formation substrate 200, the short side 200a being parallel to the long side 60a, and whose short side 60b (side parallel to the scanning direction and perpendicular to the longitudinal direction) has a width d2 shorter than a long side 200b of the film formation substrate 200, the long side 200b being parallel to the short side 60b.

However, the orientation of the long side 200b of the film formation substrate 200 with respect to the vapor deposition mask 60 is not limited to this. It is needless to say that depending on the size of the film formation substrate 200, the vapor deposition mask 60 and the film formation substrate 200 can be disposed so that the long side 60a of the vapor deposition mask 60 is parallel to the long side 200b of the film formation substrate 200.

As shown in FIGS. 1 and 2, the vapor deposition mask has a plurality of openings 61 (through-holes), for example, in belt shape (stripe shape) arranged along a one-dimensional direction.

Each of the openings 61 has its longitudinal direction parallel to the scanning direction, and the plurality of openings 61 are put in a row along a direction orthogonal to the substrate scanning direction. In the present embodiment, the plurality of openings 61, whose long sides extend parallel to the short side 60b of the vapor deposition mask 60 are put in a row along the longitudinal direction of the vapor deposition mask 60.

Further, as shown in FIG. 5, the vapor deposition mask 60 is provided with alignment markers 62 which extend, for example, along the scanning direction (substrate scanning direction) in which the film formation substrate 200 is scanned, i.e., along the long sides 61b of the openings 61 (see FIGS. 1 and 2), and which serve to position (align) the film formation substrate 200 and the vapor deposition mask 60 with each other.

For this reason, in the present embodiment, the alignment markers 62 extend along the short side 60b of the vapor deposition mask 60. In the present embodiment, scanning (relative movement of the film formation substrate 200 and the vapor deposition mask 60) is carried out along the long side 200b of the film formation substrate 200.

Meanwhile, as shown in FIG. 5, the film formation substrate 200 is provided with alignment markers 202 which are located outside of a panel region 201 (vapor deposition region) (see FIG. 2), which extend along the scanning direction (substrate scanning direction) in which the film formation substrate 200 is scanned, and which help align the film formation substrate 200 and the vapor deposition mask 60 with each other.

<Configuration of the Vapor Deposition Source>

The vapor deposition source 70 is a container for holding the vapor deposition material inside. The vapor deposition source 70 may be a container that directly holds the vapor deposition material inside, or may be a container that has load-lock pipes.

As shown in FIG. 1, the vapor deposition source 70 is in a rectangular shape (belt shape) for example, as with the vapor deposition mask 60. The vapor deposition source 70 has a plurality of nozzle holes 71, provided on a surface of the vapor deposition source 70 which face the vapor deposition mask 60, through which the vapor deposition material is ejected (scattered) as vapor deposition particles.

As shown in FIG. 1, these nozzle holes 71 are put in a row along the direction along which the openings 61 of the vapor deposition mask 60 are put in a row.

However, the nozzle holes 71 do not need to correspond in pitch to the openings 61. Further, the nozzle holes 71 do not need to correspond in size to the openings 61.

For example, in a case in which the vapor deposition mask 60 is provided with openings 61 in stripe form as shown in FIG. 1, the hole diameter of each of the nozzle holes 71 may be larger or smaller than the width of a short side 61a of each of the openings 61.

Further, a plurality of nozzle holes 71 may be provided for one opening 61, or one nozzle hole 71 may be provided for a plurality of openings 61. Further, part (at least one) of the plurality of nozzle holes 71, or part of a region of the nozzle holes 71 may be provided facing a non-opening part (between two adjacent openings 61) on the vapor deposition mask 60.

However, from the viewpoint of reducing the amount of vapor deposition particles that adhere to the non-opening part of the vapor deposition mask 60 and thereby improving efficiency in the use of the material as much as possible, it is preferable that the nozzle holes 71 be provided facing the openings 61 so that at least part of the nozzle holes 71 overlaps one or a plurality of the openings 61.

Furthermore, it is preferable that each of the nozzle holes 71 be provided facing a corresponding one of the openings 61 so that the nozzle holes 71 are positioned inside of any one of the openings 61 in plan view.

Further, in terms of improving efficiency in the use of the material, it is preferable that the openings 61 and the nozzle holes 71 be in one-to-one correspondence with each other.

<Configuration of a Shutter>

The shutter (not illustrated) may be provided as needed between the vapor deposition mask 60 and the vapor deposition source 70 so as to control the arrival of the vapor deposition particles at the vapor deposition mask 60. The shutter may be movable forward and backward (insertable and removable) on the basis of a vapor deposition OFF signal or a vapor deposition ON signal.

The shutter closes the openings 61 of the vapor deposition mask 60 by being inserted between the vapor deposition mask 60 and the vapor deposition source 70. By thus inserting a shutter as appropriate between the vapor deposition mask 60 and the vapor deposition source 70, the vapor can be prevented from being deposited onto a non-vapor-deposition region where no vapor deposition is carried out.

It should be noted that the shutter may be provided integrally with the vapor deposition source 70, or may be provided separately from the vapor deposition source 70.

Further, the vapor deposition apparatus 50 may be configured such that the vapor deposition particles scattered from the vapor deposition source 70 are adjusted to be scattered within the vapor deposition mask 60, and that any vapor deposition particles scattered outside of the vapor deposition mask 60 are removed as appropriate with use of an adhere-proof plate (shielding plate) or the like.

<Configuration of the Mask Holder and the Mask Tray>

The mask holder 81 and the mask tray 82, which hold the vapor deposition mask 60, are each in the shape of a frame that has a opening in the center (see FIGS. 4 and 5).

The mask tray 82 has an opening 82a provided in a surface thereof which faces an opening region constituted by a group of openings 61 in the vapor deposition mask 60. The mask tray 82 holds the vapor deposition mask 60 at the outer edges of the vapor deposition mask 60.

Further, the mask holder 81 has an opening 81a in a surface thereof which faces the opening region constituted by the group of openings 61 in the vapor deposition mask 60. The mask holder 81 holds the mask tray 82, on which the vapor deposition mask 60 is mounted, at the outer edges of the mask tray 82.

Provided below the vapor deposition mask 60 at the openings 81a and 82a is the vapor deposition source 70, from which vapor deposition particles are scattered to be vapor-deposited on the film formation substrate 200 through the openings 61 of the vapor deposition mask 60. This causes a vapor-deposited film 211 to be formed on that panel region 201 (see FIG. 2) of the film formation substrate 200 which faces the vapor deposition mask 60.

On the mask holder 81, a plurality of rollers 83 (gap retaining rollers, rotating bodies) are provided as gap retaining members. It should be noted that FIGS. 1 to 5 show, as an example, a case where six rollers 83 are provided on the mask holder 81.

The number of rollers 83 is not particularly limited, and as long as the gap between the vapor deposition mask and the film formation substrate 200 can be kept constant, the number may be just one.

However, in terms of enhancing the capability of retaining the gap g1 and dispersing the load, it is desirable to provide a plurality of rollers 83.

Since the load is dispersed by providing a plurality of rollers 83, damage to members such as the rollers 83 and the film formation substrate 200 due to contact between the film formation substrate 200 and the rollers 83 can be prevented.

Further, in this case, by providing a plurality of rollers 83 along the scanning direction (Y direction), the gap g1 can be inhibited from varying along the scanning direction. Further, by providing a plurality of rollers 83 along the direction (X direction) orthogonal to the scanning direction, the occurrence of a distribution amount of space along the X direction can be prevented. As a result, the amount of space can be more strictly controlled to be constant.

The rollers 83 are each supported in a depression 81b by a shaft 84 on an axis along a direction orthogonal to the scanning direction. The depression 81b is provided in that surface (in the present embodiment, an upper surface) of the mask holder 81 which faces the film formation substrate 200. The shaft 84 is provided through the center of the roller 83.

The rollers 83 protrude higher than the vapor deposition mask 60 provided on the mask tray 82, and are rotatable in the scanning direction. This allows the roller 83 to be in contact with the film formation substrate 200 during scanning.

It is desirable that the gap be controlled by the rollers 83 before entrance into a panel region 201 of the film formation substrate 200 which is a vapor deposition region onto which vapor deposition particles are vapor-deposited from the vapor deposition source 70.

For this reason, it is preferable that the rollers 83 be provided in front of a position of entrance into a panel region 201 of the film formation substrate 200 onto which vapor deposition particles are vapor-deposited from the vapor deposition source 70. In the present embodiment, the plurality of rollers 83 are provided along the long side 60a of the vapor deposition mask 60 so as to be on sides of the mask holder 81 upstream and downstream of the scanning direction with respect to the vapor deposition mask 60, respectively.

As described with reference to (a) and (b) of FIG. 28, in a case where a gap is provided between the film formation substrate 200 and the vapor deposition mask 60, it is necessary to strictly keep the gap constant in order to achieve a precision pattern.

According to the present embodiment, scanning is carried out with the rollers 83 in contact with the film formation substrate 200 as described above. By the rollers 83 being in contact with the film formation substrate 200 during scanning, the gap between the vapor deposition mask 60 and the film formation substrate 200 is kept constant.

The rollers 83 have their roller installation heights determined so that the amount of space between the vapor deposition mask 60 and the film formation substrate 200 takes on a desired value.

It is preferable that the rollers 83 be formed so that their roller installation heights can be adjusted. For example, it is preferable that the mask holder 83 be formed so that an axial position of each of the roller 83 can be changed, for example, that a bearing position can be changed along an upward-downward direction.

It is preferable that the height (vertical distance) of the gap g1 between the vapor deposition mask 60 and the film formation substrate 200 be in a range of not less than 50 μm but not more than 1 mm, or, more preferably, be around 200 μm.

If the height of the gap g1 is less than 50 μm, there is a higher risk that the film formation substrate 200 will come into contact with the vapor deposition mask 60.

Meanwhile, if the height of the gap g1 exceeds 1 mm, vapor deposition particles having passed through the openings 61 in the vapor deposition mask 60 spread, with the result that the pattern width of the vapor deposition film 211 to be formed is too wide. For example, in a case where the vapor deposition film 211 is a red light-emitting layer used in an organic EL display device, the gap's exceeding 1 mm may cause the light-emitting material of the red color to be vapor-deposited onto an adjacent subpixel such as a blue or green subpixel.

Further, if the height of the gap g1 is around 200 μm, there is no risk that the film formation substrate 200 will come into contact with the vapor deposition mask 60. Further, the spread of the pattern width of the vapor deposition film 211 can be sufficiently reduced.

According to the present embodiment, the holding ability of the gap g1 is increased by carrying out scanning is carried out with the rollers 83 in contact with the film formation substrate 200 as described above, so that the retention of the gap g1 is increased. This makes it less likely for the film formation substrate 200 and the vapor deposition mask 60 to touch each other, thus making it possible to achieve a narrower gap g1.

Further, according to the present embodiment, the gap g1 can be accurately controlled, and can therefore be kept at a desired constant value. This makes it possible to fluctuations in width, displacements, deformations, etc. of a pattern that is formed by a vapor-deposited film 211 that is vapor-deposited through the openings 61 in the vapor deposition mask 60, thus making it possible to highly accurately form a high-precision pattern over the entire surface of the film formation substrate 200.

Further, the present embodiment does not require a complex mechanism for retaining the gap g1. As described above, the gap g1 can be kept constant by a simple mechanism of providing the mask holder 81 with the rollers as gap retaining members. Therefore, the apparatus configuration can be simplified. This makes it possible to reduce the unit price of the apparatus, improve moss productivity, and reduce the cost of panels per unit price.

It should be noted that in the present embodiment, as described above, the rollers 83 is in contact with the film formation substrate 200 during scanning by rotating in the scanning direction, whereby the film formation substrate 200 slides on the rollers 83.

For this reason, it is desirable that the rollers 83 be made of a substance that does not generate dust. Moreover, in order to prevent the generation of dust from the rollers 83 due to contact with the film formation substrate 200, it is desirable that the rollers 83, including the shafts 84 and the bearings (not illustrated) in the mask holder 81, be constituted by members having low friction and high fatigue strength and, further, members subjected to such surface treatment.

Examples of such a material or member include, but are not limited to, a metal subjected to quenching treatment, a metal coated with titanium or diamond, a high hardness material such as titanium, and a member made of such a high hardness material.

It should be noted that in a case where such a high hardness material as that described above is used for the rollers 83, the material can prevent dust from being generated from the member per se, but if the material is too hard, the rollers 83 may cause damage to the film formation substrate 200 per se when in contact with the film formation substrate 200, for example in a case where the film formation substrate 200 is a glass substrate.

Therefore, in such a case, the rollers 83 per se may be better made of rubber, resin, or the like, on the contrary.

It should be noted that in a case where a substrate frame is used as in an embodiment to be described, for example, and a metal is used for the substrate frame, it is desirable that the rollers 83 are also high in hardness.

An optimum material is set as appropriate depending on the load that is applied to the rollers 83 and the resistance of the member that the load is to be applied.

Further, it is desirable that the rollers 83 have their corners chamfered so that the rollers 83 are prevented from causing damage to the film formation substrate 200 by making contact with and the film formation substrate 200.

Further, it is desirable that the rollers 83 be disposed in positions where the rollers 83 do not make contact with a panel region 201 of the film formation substrate 200 during scanning or, in particular, in positions where the rollers 83 do not make contact with at least a light-emitting region (light-emitting pixel). In other words, it is desirable that the rollers 83 have their installation positions determined so that the rollers 83 make contact with the film formation substrate 200 in the regions other than the panel regions 201.

In this case, the rollers 83 do not make contact with the panel region. Accordingly, the TFT and wires in the panel regions 201 of the film formation substrate 200 will not be damaged by contact with the rollers 83, and panel characteristics are not adversely affected.

However, this does not imply any limitation, as long as the panel characteristics and other characteristics of a completed product and productivity are not adversely affected. The installation positions, shape, material, etc. of the rollers 83 can be freely selected.

It should be noted that in a case where the positions in which the rollers 83 are placed are determined as described above by the panel regions 201 of the film formation substrate 200, e.g., in the case of a change in placement of the panel regions 201 such as a change of model at the time of mass production, the mask holder 81 needs only be entirely replaced accordingly.

Moreover, according to the present embodiment, as described above, the vapor deposition mask 60 is provided on the mask tray 82, and the rollers 83 are provided in the mask holder 81. This makes it possible to replace the vapor deposition mask 60 by replacing the mask tray 82.

Further, it is desirable that the rollers 83 be provided with play so as to move minutely along the X direction to address mask alignment by adjustment along the X direction and adjustment of a θ displacement. Moreover, it is desirable to have a mechanism that can address an axial displacement to address the θ displacement.

To this end, it is preferable, for example, to put the shaft 84 loosely through the roller 83 and give the depression 81b a width allowing play for the roller 83 to move in, or to provide the shaft 84 with a stopper (not illustrated) having a width allowing play for the roller 83 to move in.

Further, to address the θ displacement, it is effective to give play to a bearing (not illustrated) in the mask holder 81 to allow a certain degree of rotation.

It should be noted that FIGS. 1 to 5 are illustrated by taking as an example a case where cylindrical rollers 83 are used as the gap retaining member (gap retaining roller, rotating body).

However, the present embodiment is not limited to this, and the gap retaining member needs only protrude higher than the vapor deposition mask 60, and be provided rotatable in the scanning direction during scanning.

Therefore, the gap retaining member may be a spherical roller, a rotating body in pulley form, a member obtained by combining a belt with a roller, a member employing a mechanism such as a gear, or a member in belt shape.

An example of the rotating body in pulley form or the rotatable body obtained by combining a belt with a roller is a rotating body having a structure in which a plurality of pulleys or rollers provided along a scanning direction (substrate traveling direction) are integrally covered with a belt. It should be noted that in the of such a plurality of pulleys or rollers connected by a belt, the pulleys or rollers rotate in synchronization with each other.

<Overall Configuration of an Organic EL Display Device>

The following describes, as an example of a vapor deposition method that involves the use of a vapor deposition apparatus 50 according to the present embodiment, a method for manufacturing a bottom-emission organic EL display device which carries out a RGB full-color display and in which light is taken out from the TFT substrate side.

First, an overall configuration of the organic EL display device is described below.

Figure 7:
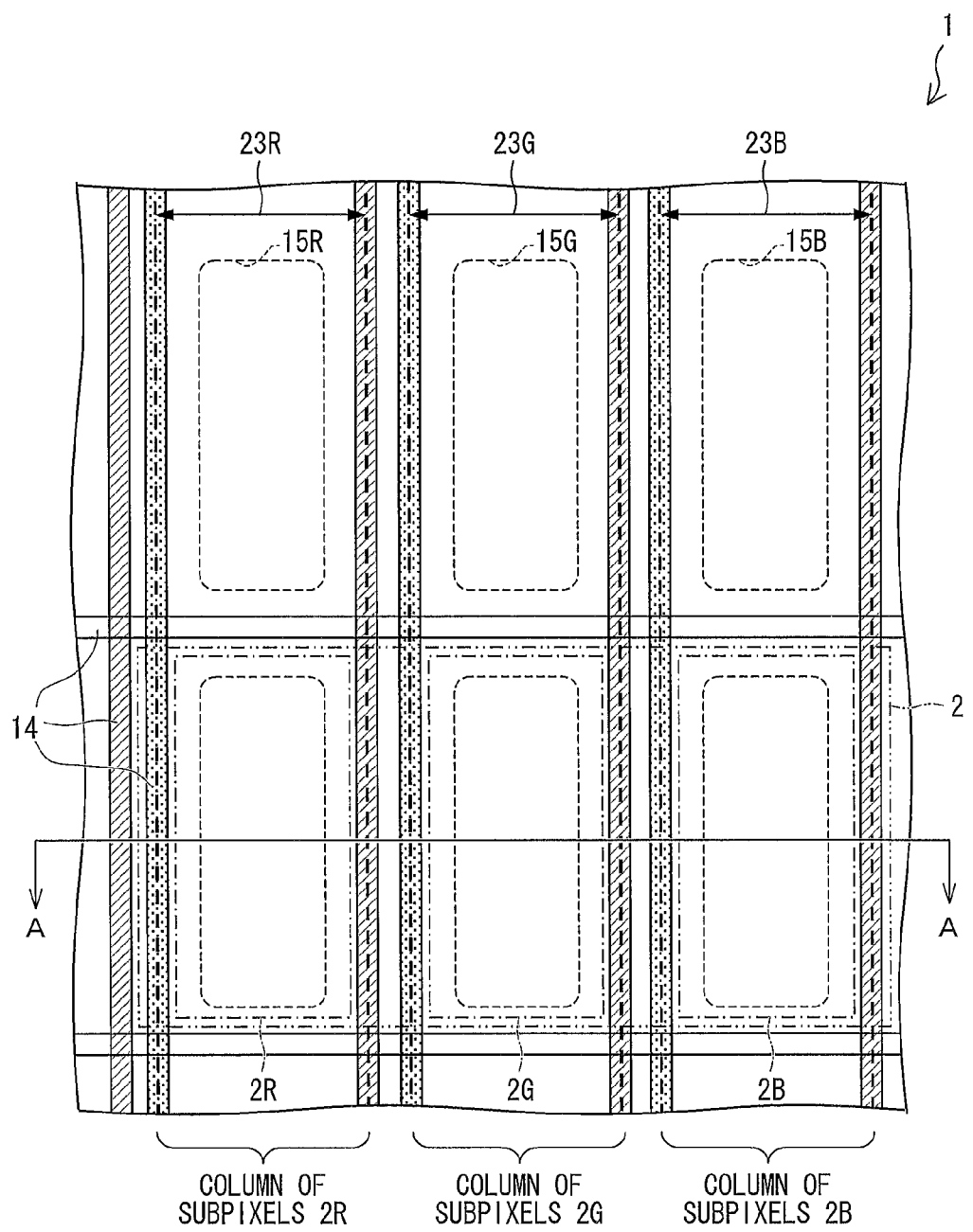
FIG. 7 is a plan view showing a configuration of pixels constituting the organic EL display device shown in FIG. 6.
Figure 8:
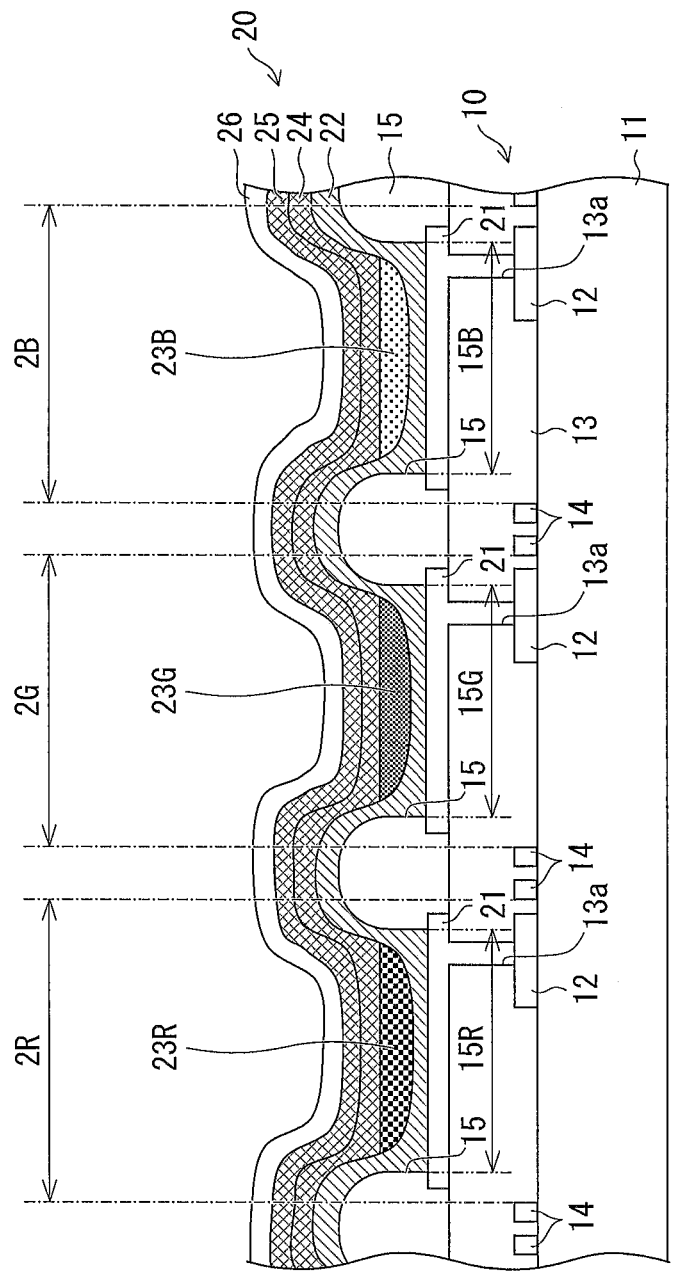
FIG. 8 is a cross-sectional view of a TFT substrate of the organic EL display device as taken along the arrow A-A shown in FIG. 7.

FIG. 6 is a cross-sectional view schematically showing a configuration of an organic EL display device that carries out an RGB full-color display. Further, FIG. 7 is a plan view showing a configuration of pixels constituting the organic EL display device shown in FIG. 6, and FIG. 8 is a cross-sectional view of a TFT substrate of the organic EL display device as taken along the arrow A-A shown in FIG. 7.

As shown in FIG. 6, an organic EL display device 1 manufactured in the present embodiment has a configuration in which over a TFT substrate 10 on which TFTs 12 (see FIG. 8) are provided, an organic EL element 20 connected to the TFTs 12, an adhesive layer 30, and a sealing substrate 40 are provided in this order.

As shown in FIG. 6, the TFT substrate 10 on which the organic EL element 20 is stacked is joined to the sealing substrate 40 by the adhesive layer 30, whereby the organic EL element 20 is enclosed between the pair of substrates (i.e., between the TFT substrate 10 and the sealing substrate 40).

By thus enclosing the organic EL element 20 between the TFT substrate 10 and the sealing substrate 40, entrance of external oxygen and/or moisture into the organic EL element 20 is prevented in the organic EL display device 1.

As shown in FIG. 8, the TFT substrate 10 includes, as a supporting substrate, a transparent insulating substrate 11 such as a glass substrate. As shown in FIG. 7, provided on the insulating substrate 11 are a plurality of wires 14 constituted by (i) a plurality of gate lines extending along a horizontal direction and (ii) a plurality of signal lines extending along a vertical direction and intersecting with the gate lines. The gate lines are connected to a gate line driving circuit (not illustrated) that drives the gate lines, and the signal lines are connected to a signal line driving circuit (not illustrated) that drives the signal lines.

The organic EL display device 1 is a full-color active-matrix organic EL display device. Provided on the insulating substrate 11 is a matrix of subpixels 2R, 2G, and 2B respectively located in regions surrounded by the wires 14 and each constituted by that part of the organic EL element 20 which has a corresponding color of red (R), green (G), or blue (B).

That is, each of the regions surrounded by the wires 14 correspond to one subpixel (dot), with R, G, and B light-emitting regions demarcated for each separate subpixel.

A pixel 2 (i.e., a single pixel) is constituted by three subpixels 2R, 2G, and 2B, namely a red subpixel 2R that transmits red light, a green subpixel 2G that transmits green light, and a blue subpixel 2B that transmits blue light.

The subpixels 2R, 2G, and 2B have openings 15R, 15G, and 15B, respectively, as light-emitting regions of the respective colors that emit light in the respective subpixels 2R, 2G, and 2B. The openings 15R, 15G, and 15B are covered by stripe-formed light-emitting layers 23R, 23G, and 23B of the respective colors, respectively.

Patterns are formed by vapor deposition on the light-emitting layers 23R, 23G, and 23B for each separate color. It should be noted that the openings 15R, 15G, and 15B will be described later.

Each of the subpixels 2R, 2G, and 2B has a TFT 12 connected to a first electrode 21 of the organic EL element 20. The emission intensity of each of the subpixels 2R, 2G, and 2B is determined by scanning and selection that are done by the wires 14 and the TFT 12. Thus, the organic EL display device 1 achieves image display by using the TFTs 12 to cause the organic EL element 20 to emit light selectively at a desired luminance.

Next, a configuration of the TFT substrate 10 and the organic EL element 20 in the organic EL display device 1 is described in detail.

<Configuration of the TFT Substrate 10>

First, the TFT substrate 10 is described.

As shown in FIG. 8, the TFT substrate 10 has a configuration in which over the transparent insulating substrate 11 such a glass substrate, the TFTs 12 (switching elements), the wires 14, an interlayer film 13 (interlayer insulating film, planarizing film), and an edge cover 15 have been formed in this order.

Provided on the insulating substrate 11 are the wires 14 and the TFTs 12, which correspond to the subpixels 2R, 2G, and 2B, respectively. It should be noted that since the configuration of a TFT has conventionally been well known, layers in each TFT 12 will be neither illustrated nor described.

The interlayer film 13 is stacked on the insulating substrate 11 over the entire region of the insulating substrate 11, so as to cover the TFTs 12 and the wires 14.

Formed on the interlayer film 13 is the first electrode 21 of the organic EL element 20.

Further, the interlayer film 13 is provided with contact holes 13a via which the first electrode 21 of the organic EL element 20 is electrically connected to the TFTs 12. Accordingly, the TFTs 12 are electrically connected to the organic EL element 20 via the contact holes 13a.

The edge cover 15 is an insulating layer for preventing the first electrode 21 from being short-circuited with a second electrode 26 in the organic EL element 20 because (a) the organic EL layer becomes thin at the pattern edges of the first electrode 21 or (b) an electric field concentration occurs.

The edge cover 15 is formed on the interlayer film 13 so as to cover the pattern edges of the first electrode 21.

The edge cover 15 is provided with openings 15R, 15G, and 15B which correspond to the subpixels 2R, 2G, and 2B, respectively. The openings 15R, 15G, and 15B in the edge cover 15 serve as light-emitting regions of the subpixels 2R, 2G, and 2B, respectively.

In other words, the subpixels 2R, 2G, and 2B are partitioned by the edge cover 15 that has insulating properties. The edge cover 15 serves also as an element isolation film.

<Configuration of the Organic EL Element 20>

Next, the organic EL element 20 is described.

The organic EL element 20 is a light-emitting element capable of high-luminance light emission by low-voltage direct-current driving. The organic EL element 20 has the first electrode 21, the organic EL layer, and the second electrode 26 stacked in this order.

The first electrode 21 is a layer having a function of injecting (supplying) positive holes into the organic EL layer. As described above, the first electrode 21 is connected to the TFTs 12 via the contact holes 13a.

As shown in FIG. 8, as the organic EL layer, a layer 22 that serves both as a positive-hole injection layer and a positive-hole transport layer, light-emitting layers 23R, 23G, and 23B, an electron transport layer 24, and an electron injection layer 25 are formed in this order from the first electrode 21 side between the first electrode 21 and the second electrode 26.

It should be noted that the order in which the layers are stacked is based on the assumption that the first electrode 21 serves as an anode and the second electrode 26 serves as a cathode. In a case where the first electrode 21 serves as a cathode and the second electrode 26 serves as an anode, the order in which the layers are stacked in the organic EL layer is reversed.

The positive-hole injection layer is a layer having a function of enhancing efficiency in the injection of positive holes into the light-emitting layers 23R, 23G, and 23B. Further, the positive-hole transport layer is a layer having a function of enhancing efficiency in the transport of positive holes to the light-emitting layers 23R, 23G, and 23B. The layer 22, which serves both as the positive-hole injection layer and the positive-hole transport layer, is formed uniformly over the entire display region of the TFT substrate 10 so as to cover the first electrode 21 and the edge cover 15.

It should be noted that as described above, the present embodiment is described by taking, as an example, a case where the layer 22, which is a combination of a positive-hole injection layer and a positive-hole transport layer, is provided as the positive-hole injection layer and the positive-hole transport layer. However, the present embodiment is not to be limited to this. The positive-hole injection layer and the positive-hole transport layer may be formed as layers independent from each other.

On the layer 22, the light-emitting layers 23R, 23G, and 23B are formed in correspondence with the subpixels 2R, 2G, and 2B so as to cover the openings 15R, 15G, and 15B in the edge cover 15, respectively.

The light-emitting layers 23R, 23G, and 23B are layers having a function of emitting light by recombining the positive holes injected from the first electrode 21 with the electrons injected from the second electrode 26. The light-emitting layers 23R, 23G, and 23B are each made of a material having high luminous efficiency, such as a low molecular fluorescent dye or a metal complex.

The electron transport layer 24 is a layer having a function of enhancing efficiency in the transport of electrons from the second electrode 26 to the light-emitting layers 23R, 23G, and 23B. Further, the electron injection layer 25 is a layer having a function of enhancing efficiency in the injection of electrons from the second electrode 26 into the light-transmitting layers 23R, 23G, and 23B.

The electron transport layer 24 is formed on the light-emitting layers 23R, 23G, and 23B and the layer 22 uniformly over the entire display region of the TFT substrate 10 so as to cover the light-emitting layers 23R, 23G, and 23B and the layer 22. Further, the electron injection layer 25 is formed on the electron transport layer 24 uniformly over the entire display region of the TFT substrate 10 so as to cover the electron transport layer 24.

It should be noted that the electron transport layer 24 and the electron injection layer 25 may be formed as layers independent from each other or may be provided integrally with each other. That is, the organic EL display device 1 may include, instead of the electron transport layer 24 and the electron injection layer 25, a layer that serves as both an electron transport layer and an electron injection layer.

The second electrode 26 is a layer having a function of injecting electrons into the organic EL layer constituted by such an organic layer as that described above. The second electrode 26 is formed on the electron injection layer 25 uniformly over the entire display region of the TFT substrate 10 so as to cover the electron injection layer 25.

It should be noted that the organic layers other than the light-emitting layers 23R, 23G, 23B are not layers that are essential to the organic EL layer, and need only be formed as appropriate in accordance with the required characteristics of the organic EL element 20. Further, it is possible to add a carrier blocking layer into the organic EL layer as needed. For example, by adding a positive-hole blocking layer as a carrier blocking layer between the light-emitting layers 23R, 23G, and 23B and the electron transport layer 24, it is possible to prevent positive holes from passing through to the electron transport layer 24, thus making it possible to improve luminous efficiency.

As the configuration of the organic EL element 20, it is possible to employ such a layer configuration as those shown below in (1) to (8), for example:
(1) First electrode/Light-emitting layer/Second electrode
(2) First electrode/Positive-hole transport layer/Light-emitting layer/Electron transport layer/Second electrode
(3) First electrode/Positive-hole transport layer/Light-emitting layer/Positive-hole blocking layer/Electron transport layer/Second electrode
(4) First electrode/Positive-hole transport layer/Light-emitting layer/Positive-hole blocking layer/Electron transport layer/Electron injection layer/Second electrode
(5) First electrode/Positive-hole injection layer/Positive-hole transport layer/Light-emitting layer/Electron transport layer/Electron injection layer/Second electrode
(6) First electrode/Positive-hole injection layer/Positive-hole transport layer/Light-emitting layer/Positive-hole blocking layer/Electron transport layer/Second electrode
(7) First electrode/Positive-hole injection layer/Positive-hole transport layer/Light-emitting layer/Positive-hole blocking layer/Electron transport layer/Electron injection layer/Second electrode
(8) First electrode/Positive-hole injection layer/Positive-hole transport layer/Electrode blocking layer (carrier blocking layer)/Eight-emitting layer/Positive-hole blocking layer/Electron transport layer/Electron injection layer/Second electrode It should be noted that as described above, for example the positive-hole injection layer and the positive-hole transport layer may be integrated with each other. Further, the electron transport layer and the electron injection layer may be integrated with each other.

Moreover, the configuration of the organic EL element 20 is not to be limited to any one of the layer configurations shown above. As described above, it is possible to employ any desired layer configuration in accordance with the required characteristics of the organic EL element 20.

<Method for Manufacturing an Organic EL Display Device>

The following describes a method for manufacturing the organic EL display device 1.

Figure 9:
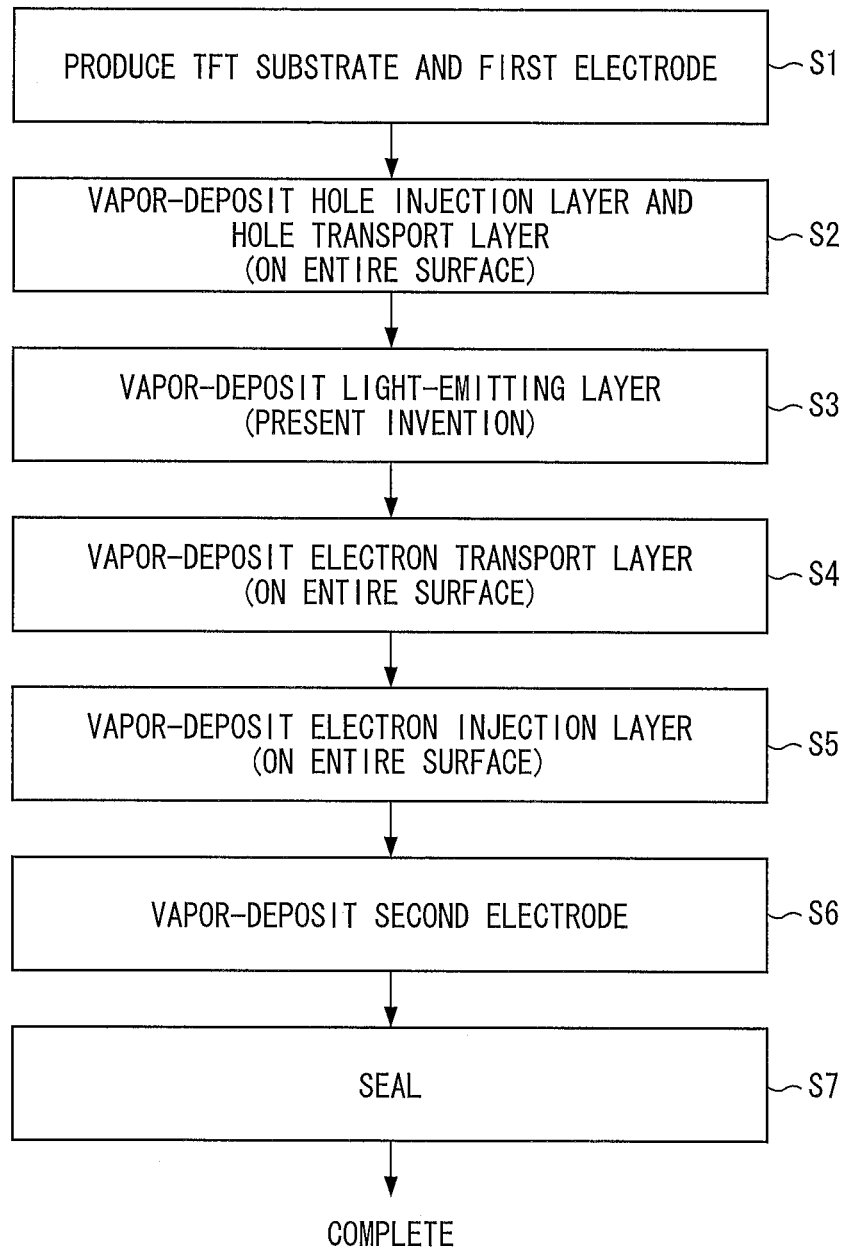
FIG. 9 is a flow chart showing an example of steps of a process for manufacturing an organic EL display device according Embodiment 1 of the present invention, with the steps arranged in the order of execution.

FIG. 9 is a flow chart showing an example of steps of a process for manufacturing the organic EL display device 1, with the steps arranged in the order of execution.

As shown in FIG. 9, the method for manufacturing the organic EL display device 1 according to the present embodiment includes, for example, a TFT substrate and first electrode preparation step (S1), a positive-hole injection layer and positive-hole transport layer vapor deposition arrangement (S2), a light-emitting layer vapor deposition step (S3), an electron transport layer vapor deposition step (S4), an electron injection layer vapor deposition step (S5), a second electrode vapor deposition step (S6), and a sealing step (S7).

Each of the steps described above is described below in accordance with the flow chart shown in FIG. 9 with reference to FIGS. 6 and 8.

It should be noted, however, that the dimensions, material, shape, etc. of each of the components described in the present embodiment are merely an embodiment, and the interpretation of the scope of the present invention is not to be limited thereby.

Further, as described above, the order in which the layers are stacked in the present embodiment is based on the assumption that the first electrode 21 serves as an anode and the second electrode 26 serves as a cathode. In a case where the first electrode 21 serves as a cathode and the second electrode 26 serves as an anode, the order in which the layers are stacked in the organic EL layer is reversed. Similarly, the first electrode 21 and the second electrode 26 swap their materials with each other.

First, as shown in FIG. 8, a photosensitive resin is applied onto the insulating substrate 11, made of glass or the like, on which the TFTs 12 and the wires 14 have been formed by a publicly-known technique, and by carrying out patterning by a photolithographic technique, an interlayer film 13 is formed on the insulating substrate 11.

As the insulating substrate 11, a glass substrate or plastic substrate can be used has for example a thickness of 0.7 mm to 1.1 mm, a length along the Y direction (vertical length) of 400 mm to 500 mm, and a length along the X direction (horizontal length) of 300 mm to 400 mm. The present embodiment uses a glass substrate.

As the interlayer film 13, acrylic resin or polyimide resin can be employed, for example. An example of the acrylic resin is a OPTMER series manufactured by JSR Corporation. Further, an example of the polyimide resin is a Photoneece© series manufactured by Toray Industries, Inc. However, polyimide resin is generally not transparent, and is colored. For this reason, in a case where the bottom-emission organic EL display device is to be manufactured as the organic EL display device 1 as shown in FIG. 8, a transparent resin such as acrylic resin is more suitably used as the interlayer film 13.

The film thickness of the interlayer film 13 is not to be particularly limited, as long as the interlayer film 13 can compensate a difference in level caused by a TFT 12. In the present embodiment, for example, the interlayer film 13 has a film thickness of approximately 2 µm.

Next, the contact holes 13a, via which the first electrode 21 is electrically connected to the TFTs 12, are formed in the interlayer film 13.

Next, for example, an ITO (indium tin oxide) film is formed by sputtering or the like as a conductive film (electrode film) to have a thickness of 100 nm.

Next, a photoresist is applied onto the ITO film, and after patterning is carried out by a photolithographic technique, the ITO film is etched by using ferric chloride as an etchant. After that, the photoresist is removed with use of a resist remover, and further the substrate is washed, whereby the first electrode 21 is formed on the interlayer film 13 in a matrix manner.

It should be noted that that as usable examples of materials for a conductive film for use in the first electrode 21 include: transparent conductive materials such as ITO, IZO (indium zinc oxide), and gallium-added zinc oxide (GZO); and metal materials such as gold (Au), nickel (Ni), and platinum (Pt).

Further, the conductive film can be stacked by a vacuum deposition method, a CVD (chemical vapor deposition) method, a plasma CVD method, a printing method, or the like, as well as sputtering.

The thickness of the first electrode 21 is not to be particularly limited in thickness. However, as described above, the first electrode 21 can have a thickness of, for example, 100 nm.

Next, the edge cover 15 is pattern-formed in the same manner as the interlayer film 13 to have a film thickness of, for example, approximately 1 µm. The edge cover 15 can be made of the same insulating material as the interlayer film 13.

As a result of the steps described above, the TFT substrate 10 and the first electrode 21 are prepared (S1).

Next, after such steps as those described above, the TFT substrate 10 is subjected to baking under reduced pressure for dehydration and to an oxygen plasma process as surface washing of the first electrode 21.

Next, with use of a conventional vapor deposition apparatus, a positive-hole injection layer and a positive-hole transport layer (in the present embodiment, a layer 22 that serves both as a positive-hole injection layer and a positive-hole transport layer) are vapor-deposited on the TFT substrate 10 over the entire display region of the TFT substrate 10 (S2).

Specifically, an open mask having an opening in a position corresponding to the entire display region is joined firmly to the TFT substrate 10 after an alignment adjustment is performed on the TFT substrate 10, and while the TFT substrate 10 and the open mask are rotated together, vapor deposition particles scattered from the vapor deposition source is vapor-deposited uniformly over the entire display region through the opening in the open mask.

The vapor deposition on the entire display region means to carry out continuous vapor deposition across adjacent subpixels of different colors.

Examples of materials for the positive-hole injection layer and the positive-hole transport layer include: benzine, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, and their derivatives; polysilane-based compounds; vinylcarbazole-based compounds; and heterocyclic conjugate monomers, oligomers, or polymers, such as thiophene-based compounds and aniline-based compounds; and the like.

The positive-hole injection layer and the positive-hole transport layer may be integrated with each other as described above, or may be formed as independent layers. Each of the films can have a thickness of, for example, 10 nm to 100 nm.

The present embodiment provides, as a positive-hole injection layer and a positive-hole transport layer, the layer 22 that serves both as a positive-hole injection layer and a positive-hole transport layer. The layer 22 is made of 4,4'-bis[N-(1-naphthyl)-N-phenylamino]biphenyl (α-NPD). Further, the layer 22 has a film thickness of 30 nm.

Next, the light-emitting layers 23R, 23G, and 23B are formed by separate painting (pattern-formed) on the layer 22 in correspondence with the subpixels 2R, 2G, and 2B so as to cover the openings 15R, 15G, and 15B in the edge cover 15, respectively (S3).

As described above, for the light-emitting layers 23R, 23G, and 23B, a material having high luminous efficiency, such as a low molecular fluorescent dye or a metal complex, is used.

Examples of materials for the light-emitting layers 23R, 23G, and 23B include: anthracene, naphthalene, indene, phenanthrene, pyrene, naphthacene, triphenylene, anthracene, perylene, picene, fluoranthene, acephenanthrylene, pentaphene, pentacene, coronene, butadiene, coumarine, acridine, stilbene, and their derivatives; tris(8-quinolinato)aluminum complexes; bis(benzoquinolinato) beryllium complexes; tri(dibenzoylmethyl)phenanethroline europium complexes; ditoluylvinyl biphenyl; and the like.

The light-emitting layers 23R, 23G, and 23B each have a film thickness of, for example, 10 nm to 100 nm.

The vapor deposition method and vapor deposition apparatus according to the present embodiment can be suitably used in particular for such light-emitting layers 23R, 23G, and 23B to be formed by separate painting (pattern-formed).

The formation of the light-emitting layers 23R, 23G, and 23B by separately painting with use of the vapor deposition method and vapor deposition apparatus according to the present embodiment will be described later in detail.

Next, in a similar manner to the positive-hole injection layer and positive-hole transport layer vapor deposition step (S2), the electron transport layer 24 is vapor-deposited over the entire display region of the TFT substrate 10 so as to cover the layer 22 and the light-emitting layers 23R, 23G, and 23B (S4).

Then, in a similar manner to the positive-hole injection layer and positive-hole transport layer vapor deposition step (S2), the electron injection layer 25 is vapor-deposited over the entire display region of the TFT substrate 10 so as to cover the electron transport layer 24 (S5).

Example of materials for the electron transport layer 24 and the electron injection layer 25 include: quinoline, perylene, phenanthroline, bisstyryl, pyrazine, triazole, oxazole, oxadiazole, fluorenone, and their derivatives and/or metal complexes; LiF (fluorinated lithium); and the like.

Specifically, examples include: Alq (tris(8-hydroxyquinoline)aluminum), anthracene, naphthalene, phenanthrene, pyrene, anthracene, perylene, butadiene, coumarine, acridine, stilbene, 1,10-phenanthroline, and their derivatives and/or metal complexes; LiF; and the like.

As described above, the electron transport layer 24 and the electron injection layer 25 may be integrated with each other, or may be formed as independent layers. Each of the layers may have a thickness of, for example, 1 nm to 100 nm, or, preferably, 10 nm to 100 nm. Further, the electron transport layer 24 and the electron injection layer 25 has a total film thickness of, for example, 20 nm to 200 nm.

In the present embodiment, Alq is used as the material for the electron transport layer 24, and LiF is used as the material for the electron injection layer 25. Further, the electron transport layer 24 has a film thickness of 30 nm, and the electron injection layer 25 has a film thickness of 1 nm.

Next, in a similar manner to the positive-hole injection layer and positive-hole transport layer vapor deposition step (S2), the second electrode 26 is vapor-deposited over the entire display region of the TFT substrate 10 so as to cover the electrode injection layer 25 (S6).

As a material (electrode material) for the second electrode 26, a material such as a metal having a small work function is suitably used. Examples of such an electrode material include: magnesium alloys (e.g., MgAg), aluminum alloys (e.g., AlLi, AlCa, AlMg), metal calcium, etc. The second electrode 26 has a thickness of, for example, 50 nm to 100 nm.

In the present embodiment, the second electrode 26 is formed by aluminum having a film thickness of 50 nm. As a result, an organic EL element 20 constituted by the organic EL layer, the first electrode 21, and the second electrode 26 as described above is formed on the TFT substrate 10.

Next, as shown in FIG. 6, the TFT substrate 10 on which the organic EL element 20 has been formed and the sealing substrate 40 are joined together by the adhesive layer 30 so that the organic EL element 20 is enclosed.

For example, as the sealing substrate 40, an insulating substrate such as a glass substrate or a plastic substrate which has a thickness of for example 0.4 mm to 1.1 mm is used. In the present embodiment, a glass substrate is used.

The vertical and horizontal lengths of the sealing substrate 40 may be adjusted as appropriate in accordance with the size of the intended organic EL display device 1. An insulating substrate of substantially the same size as the insulating substrate 11 in the TFT substrate 10 can be used, and the insulating substrate can be divided with accordance with the size of the intended organic EL display device 1 after the organic EL element 20 has been enclosed.

It should be noted that the method for sealing the organic EL element 20 is not limited to the method described above. Examples of other sealing method include a method that involves the use of carved glass as the sealing substrate 40 and that carries out sealing as a frame with sealing resin, frit glass or the like, and a method that fills a space between the TFT substrate 10 and the sealing substrate 40 with resin. The method for manufacturing the organic EL display device 1 does not rely on the foregoing sealing method, and any sealing method can be applied.

Further, a protection film (not illustrated) that prevents entrance of external oxygen and/or moisture into the organic EL element 20 can be formed on the second electrode 26 so as to cover the second electrode 26.

The protection film is made of an insulating or conductive material. Examples of such a material include silicon nitride and silicon oxide. Further, the protection film has a thickness of, for example, 100 nm to 1000 nm.

As a result of the steps described above, the organic EL display device 1 is completed.

In such organic EL display device 1, turning on the TFTs 12 in response to signal input from the wires 14 causes positive holes to be injected from the first electrode 21 into the organic EL layer. Meanwhile, electrons are injected from the second electrode 26 into the organic EL layer, whereby the positive holes and the electrons are recombined in the light-emitting layers 23R, 23G, and 23B. The positive holes and electrons thus recombined are emitted as light upon deactivation of energy.

In the organic EL display device 1, a predetermined image is displayed by controlling the luminous intensity of each of the subpixels 2R, 2G, and 2B.

<Method for Pattern-Forming an Organic EL Layer>

The following details a method for pattern-forming an organic EL layer by using a vapor deposition apparatus 50 according to the present embodiment as an apparatus for manufacturing an organic EL display device 1.

It should be noted that the following description is given by taking, as an example, a case where a TFT substrate 10 having been finished with the positive-hole injection layer and the positive-hole transport layer vapor deposition step (S2) is used as a film formation substrate 200 on which a film is to be formed and formation of light-emitting layers 23R, 23G, and 23B by separately painting in the light-emitting layer vapor deposition step (S3) is carried out as pattern formation of an organic EL layer.

In the case of formation of light-emitting layers 23R, 23G, and 23B by separately painting on the TFT substrate 10 is carried out as pattern formation of a vapor-deposited film 211 on the film formation substrate 200, the openings 61 in the vapor deposition mask 60 are formed so as to correspond in size and pitch to the light-emitting layers 23R, 23G, and 23B of the respective color columns.

FIG. 10 is a flow chart showing an example of a method for forming a film of a predetermined pattern on a TFT substrate 10 by using the vapor deposition apparatus 50 according to the present embodiment.

A method for forming the light-emitting layers 23R, 23G, and 23B shown in FIG. 10 by using the vapor deposition apparatus 50 is specifically described below in accordance with the flow chart shown in FIG. 10.

First, as shown in FIGS. 3 and 4, the mask tray 82 on which the vapor deposition mask 60 has been mounted is fixed on the mask holder 81 in the vacuum chamber 51, and the vapor deposition source 70 is placed below the vapor deposition mask 60.

At this time, the mask unit 54 is assembled by keeping the gap g2 between the vapor deposition source 70 and the vapor deposition mask 60 with use of the mask holding member 80 and, at the same time, performing alignment with use of the alignment markers 62 of the vapor deposition mask 60 so that the scanning direction matches the long sides 61*b* of the openings 61 formed in stripe form in the vapor deposition mask 60 are aligned with the scanning direction.

Next, the TFT substrate 10 serving as the film formation substrate 200 is put into the vacuum chamber 51, and rough alignment is performed with use of the alignment markers 62 and 202 so that the direction of each column of subpixels of the same color on the TFT substrate 10 is aligned with the scanning direction (S11).

At this time, the gap g1 between the TFT substrate 10 and the vapor deposition mask 60 (substrate-mask gap) is kept constant by placing the TFT substrate 10 and the vapor deposition mask 60 opposite each other so that the rollers 83 provided in the mask holder 81 make contact with the film formation substrate 200 in the regions other than the panel regions 201 of the TFT substrate 10.

In the present embodiment, the gap g2 between the vapor deposition source 70 and the vapor deposition mask 60 is 100 mm, and the gap g1 between the TFT substrate 10 serving as the film formation substrate 200 and the vapor deposition mask 60 is 200 μm.

It should be noted that a non-vapor-deposition region in the TFT substrate 10 (part where no vapor deposition is necessary, such as a terminal part around a panel region 201) may have a masking film attached thereto as needed to cover the non-vapor-deposition region.

The TFT substrate 10 is fixed to the substrate holder 52 by a technique such as electrostatic chuck so as not to suffer from self-weight deflection.

Next, the TFT substrate 10 is scanned at a vapor deposition rate preset for the TFT substrate 10 to pass over the vapor deposition mask 60.

Further, precise alignment is performed simultaneously with scanning, with use of the alignment markers 62 and 202, so that the openings 61 in the vapor deposition mask 60 are aligned with the columns of red subpixel 2R (S12).

At this time, the gap g1 (substrate-mask gap) is kept constant during scanning by causing the TFT substrate 10 to slide on the rollers 83 while in contact with the rollers 83.

As the TFT substrate 10 passes over the vapor deposition mask 60, vapor deposition particles of red organic material ejected from the vapor deposition source 70 are vapor-deposited in positions facing the openings 61 in the vapor deposition mask 60 through the openings 61 of the vapor deposition mask 60.

The film thickness of the light-emitting layer 23R can be adjusted by reciprocating scanning (i.e. a reciprocating motion of the TFT substrate 10) and by the scanning rate (S14).

For example, after scanning in S12, the film thickness of the light-emitting layer 23R can be adjusted by reversing the scanning direction of the TFT substrate 10 and further vapor-depositing red organic material on a vapor deposition position of the red organic material in S12 in a similar manner to S12.

It should be noted that in S12 to S14, while the non-vapor-deposition region in the TFT substrate 10 is located above the openings 61 in the vapor deposition mask 60 (e.g., during the interval between completion of the step shown in S12 and reversal of the scanning direction in S14), adherence of the vapor deposition particles to the non-vapor-deposition region can be prevented by inserting a shutter between the vapor deposition source 70 and the vapor deposition mask 60 (S13).

After the step shown in S14, the TFT substrate 10 on which the light-emitting layer 23R has been formed is taken out from the vacuum chamber 51 (S15), and the green light-emitting layer 23G is formed in a similar manner to the process of film formation of the light-emitting layer 23R with use of (i) a mask unit 54 for use in formation of the green light-emitting layer 23G and (ii) a vacuum chamber 51 for use in formation of the green light-emitting layer 23G.

Further, after the light-emitting layer 23G has been formed, the blue light-emitting layer 23B is formed in a similar manner to the processes of film formation of the light-emitting layers 23R and 23G with use of (i) a mask unit 54 for use in formation of the blue light-emitting layer 23B and (ii) a vacuum chamber 51 for use in formation of the green light-emitting layer 23B.

That is, in each of the processes of film formation the light-emitting layers 23G and 23B, a vapor deposition mask 60 having openings 61 in positions corresponding to the light-emitting layer 23G or 23B is prepared, and is placed in the vacuum chamber 51 for use in formation of the corresponding light-emitting layer 23G or 23B. Then, vapor deposition is carried out by scanning the TFT substrate 10 while performing alignment so that the openings 61 in the vapor deposition mask 60 are aligned with the columns of subpixels 2G or 2B.

As a result of the steps described above, a TFT substrate 10 on which light-emitting layers 23R, 23G, and 23B have been pattern-formed in red (R), green (G), and blue (B), respectively, is obtained.

<Modification>

It should be noted that, as shown in FIGS. 1 to 5, the present embodiment has been described by takings, as an example, a case where the rollers 83 are provided in the mask holder 81. However, the present embodiment is not to be limited to such an example.

The gap retaining member according to the present embodiment may be provided in the mask tray 82, or may be provided both in the mask holder 81 and the mask tray 82.

Further, the gap retaining member may be provided on the mask unit 54 side as described above or, more specifically, in the mask holding member 80, or may be provided on the substrate holding member side, e.g., in the substrate holder 52 in the case of the present embodiment. Alternatively, the gap retaining member may be provided on both of the sides.

However, as described above, the vapor deposition mask 60 is smaller in area than the film formation substrate 200. For this reason, in a case where the gap retaining member is provided on the mask unit 54 side, i.e., in the mask holding member 80, the gap retaining member provided in the mask holding member 80 can be brought into contact with the film formation substrate 200 or the substrate holding member without straddling different member during vapor deposition the film formation substrate 200, as the film formation substrate 200 or the substrate holding member facing the vapor deposition mask 60 is larger than the vapor deposition mask 60. This makes it possible to retain and control the gap and control alignment in a simple and easy manner.

It should be noted that in a case where the gap retaining member such as the rollers 83 is provided in the substrate holding member, it is desirable that a height (height of protrusion) at which the gap retaining member is placed from the substrate holding member be determined so that the gap g1 between the vapor deposition mask 60 and the film formation substrate 200 is adjusted to a predetermined height when the gap retaining member is in contact with the vapor deposition mask 60.

For this reason, in a case where a plurality of gap retaining members are provided along the scanning direction, it is desirable that the distance between the gap retaining member provided upstream of the scanning direction and the gap retaining member provided downstream of the scanning direction be set to be shorter than the width d2 of the short side 60b of the vapor deposition mask 60 which is parallel to the scanning direction.

Further, in order that misalignment does not occur due to a difference in level when the gap retaining member makes contact with the vapor deposition mask 60, it is preferable that the surface of the mask holding member 80 which faces the substrate holding member (in the present embodiment, the upper surfaces of the vapor deposition mask 60, the mask tray 82, and the mask holder 81) is flush without any difference in level.

It should be noted that in any case, it is desirable that the rollers 83 be placed outside relative to the openings 61 in the vapor deposition mask 60. By providing the rollers 83 so that the rollers 83 are located in front of the opening 61 in the vapor deposition mask 60 during scanning, the gap g1 constant between the vapor deposition mask 60 and the film formation substrate 200 can be kept constant before the film formation substrate 200 is subjected to vapor deposition.

Further, FIG. 1 shows as an example a case where the openings 61 in the vapor deposition mask 60 and the nozzle holes 71 in the vapor deposition source 70 are arranged one-dimensionally (i.e., in line form). However, the present embodiment is not to be limited to such an example. The openings 61 in the vapor deposition mask 60 and the nozzle holes 71 in the vapor deposition source 70 may be each disposed two-dimensionally (i.e., in plane form).

Further, although the present embodiment has been described by taking, as an example, a case where the organic EL display device 1 includes a TFT substrate 10 with an organic layer formed on the TFT substrate 10, the present embodiment is not to be limited to such an example. The organic EL display device 1 may include, instead of the TFT substrate 10, a passive substrate obtained by forming no TFTs on a substrate that forms an organic layer, and the passive substrate may be used as a film formation substrate 200 on which a film is to be formed.

Further, although the present embodiment has been described by taking, as an example, a case where an organic layer is formed on the TFT substrate 10 as described above, the present embodiment is not to be limited to such an example. The present embodiment can also be suitably used in a case where an electrode pattern is formed instead of the organic layer. The vapor deposition apparatus 50 and the vapor deposition method according to the present and each of the after-mentioned embodiments can be suitably applied to any manufacturing method and manufacturing apparatus that forms a patterned film by vapor deposition, as well as the method for manufacturing an organic EL display device 1 described above.

Embodiment 2

The present embodiment is described below mainly with reference to FIG. 11.

The present embodiment mainly deals with differences from Embodiment 1, and components having the same functions as those used in Embodiment 1 are given the same reference signs, and as such, are not described below.

Embodiment 1 has been described by taking, as an example, a case where as shown in FIGS. 1 through 5, the vapor deposition source 70 has a mechanism for ejecting vapor deposition particles upward.

That is, in Embodiment 1, as shown in FIGS. 1 through 5, the vapor deposition source 70 is placed below the film formation substrate 200, and the film formation substrate 200 is held by the substrate holder 52 so that its vapor deposition surface faces downward. Accordingly, the vapor deposition source 70 causes the vapor deposition particles to be vapor-deposited upward on the film formation substrate 200 through the openings 61 in the vapor deposition mask 60 (upward deposition). However, the present embodiment is not to be limited to this.

Figure 11:
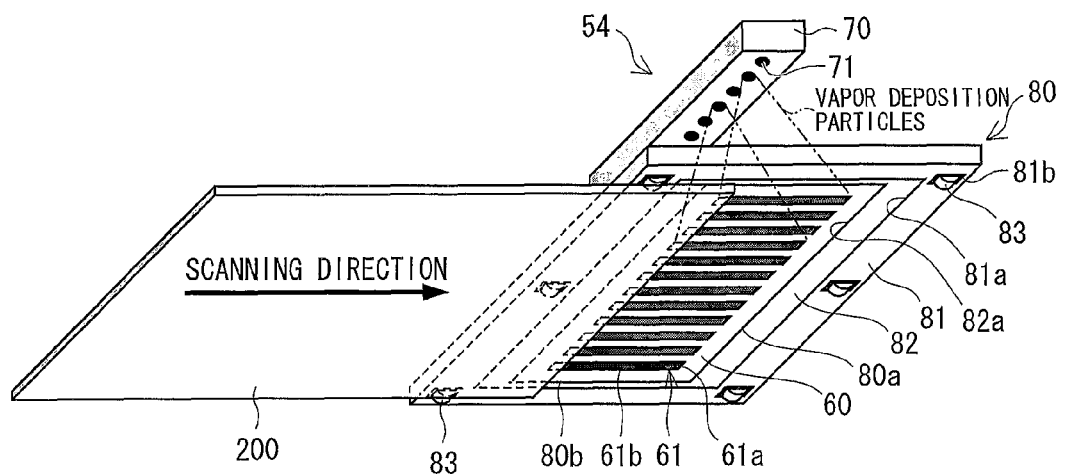
FIG. 11 is a bird's-eye view showing a relationship among main components provided in a vacuum chamber of a vapor deposition apparatus according to Embodiment 2 of the present invention, with the main components being looked at obliquely from above.

FIG. 11 is a bird's-eye view showing a relationship among main components provided in a vacuum chamber 51 of a vapor deposition apparatus 50 according to the present embodiment, with the main components being looked at obliquely from above.

Unlike the vapor deposition apparatus 50 according to Embodiment 1, the vapor deposition apparatus 50 according to the present embodiment is configured such that the mask unit 54 and the film formation substrate 200 have their positions reversed up side down as shown in FIG. 11.

Although not illustrated, since the mask unit 54 and the position of the film formation substrate 200 have their positions reversed up side down, it is needless to say that the substrate holder 52 and substrate moving mechanism 53 and the mask unit moving mechanism 55 also have their positions reversed up side down.

In the present embodiment, too, the mask unit 54 is fixed, for example, to the vacuum chamber 51, and the vapor deposition mask 60 and the vapor deposition source 70 are integrally held by the mask holding member 80, such as a holder, in which the vapor deposition mask 60 and the vapor deposition source 70 are held/fixed (for example, mounted). It should be noted that the mask holding member 80 may be fixed to a top wall of the vacuum chamber 51 or may be fixed to a side wall of the vacuum chamber 51. Alternatively, the mask holding member 80 may be fixed to a bottom wall by a spindle (column support) (not illustrated) extending from the bottom wall.

In a case where the mask unit 54 is fixed and the film formation substrate 200 is moved relative to the mask unit 54, a configuration is possible, for example, in which (i) the vapor deposition source 70 is directly fixed to the top wall of the vacuum chamber 51 and (ii) the mask holder 81 is fixed to any of the inner walls of the vacuum chamber 51. Alternatively, a configuration is also possible in which (i) the top wall of the vacuum chamber 51 is provided with windows in which nozzle holes 71 in the vapor deposition source 70 are provided and (ii) the vapor deposition source 70 has its main body section placed (mounted) outside of the vacuum chamber 51. In either case, the mask unit 54 needs only be configured such that the relative positions of the vapor deposition mask 60 and the vapor deposition source 70 are fixed.

In the present embodiment, as shown in FIG. 11, since the vapor deposition source 70 and the vapor deposition mask 60 are placed above the film formation substrate 200, the vapor deposition particles are ejected downward through the nozzle holes 71 of the vapor deposition source 70.

The vapor deposition source 70 has a mechanism for ejecting the vapor deposition particles downward. The vapor deposition particles ejected from the vapor deposition source 70 pass through the openings 61 in the vapor deposition mask 60 and are vapor-deposited on the panel regions 201 of the film formation substrate 200 passing below the vapor deposition mask 60.

That is, according to the vapor deposition method described in Embodiment 1, vapor deposition is carried out by upward deposition. Meanwhile, in the present embodiment, the vapor deposition source 70 is placed above the film formation substrate 200, and vapor deposition particles are vapor-deposited downward on the film formation substrate 200 through the openings 61 in the vapor deposition mask 60 (downward deposition) as described above.

In such a case where downward deposition is carried out, scanning is carried out with the rollers 83 in contact with the film formation substrate 200 as shown in FIG. 1, whereby the retention of the gap g1 is increased. This makes it possible to accurately control the gap g1 and keep the gap g1 at a desired constant value, thus making it possible to highly accurately form a high-precision pattern over the entire surface of the film formation substrate 200, as in Embodiment 1.

Further, in Embodiment 1, in order to prevent self-weight deflection of the film formation substrate 200, a technique such as an electrostatic chuck is used as the substrate holder 52 to fix the film formation substrate 200 by sticking. However, in the present embodiment, since vapor deposition is carried out by downward deposition as described above, it is unnecessary to use the technique such as an electrostatic chuck and it is only necessary to hold the film formation substrate 200 to such an extent that no self-weight deflection occurs.

Therefore, according to the present embodiment, it is possible to make a structure of the vapor deposition apparatus 50 simpler than that of Embodiment 1. Further, there is no risk that the film formation substrate 200, which is large in size, will fall due to poor sticking. Therefore, stable operation of the vapor deposition apparatus 50 and an improvement in yield of the vapor deposition apparatus 50 can be expected.

<Modification>

The present embodiment has dealt with a case where vapor deposition particles are vapor-deposited on the film formation substrate 200 by downward deposition. However, the present embodiment is not to be limited to this.

For example, it is also possible to employ an configuration in which (i) the vapor deposition source 70 has a mechanism for ejecting vapor deposition particles sideward and (ii) the vapor deposition particles are vapor-deposited sideward on the film formation substrate 200 via the vapor deposition mask 60 (sideward deposition) with the film formation substrate 200 standing upright so that its vapor deposition surface (film formation surface) faces the vapor deposition source 70.

In this case, too, scanning is carried out with the rollers 83 in contact with the film formation substrate 200, so that the same effect as that of Embodiment 1 can be obtained.

Embodiment 3

The present embodiment is described below mainly with reference to FIG. 12.

The present embodiment mainly deals with differences from Embodiments 1 and 2, and components having the same functions as those used in Embodiments 1 and 2 are given the same reference signs, and as such, are not described below.

In Embodiments 1 and 2, it is desirable that a load be applied between each of the rollers 83 and the film formation substrate 200 so that the rollers 83 are uniformly and surely in contact with the film formation substrate 200.

It should be noted here that it is desirable that an upper limit of the load be such that the film formation substrate 200 is not cracked, broken, flawed, etc. when the film formation substrate 200 is actually moved while in contact with the rollers 83 or, furthermore, be such that the members do not deteriorate even after repeated use.

Further, it is desirable that a lower limit of the load be such that it is possible to prevent floating from occurring between the rollers 83 and the film formation substrate 200 due to a mechanical degree of precision (due to a factor such as vibration, decentering of the rollers 83, a warp in the film formation substrate 200 per se, or a change in thickness of the film formation substrate 200).

It should be noted that a specific range of the load is not particularly specified, and can be appropriately set depending on the size and weight of the film formation substrate 200, the load capacity of the rollers 83, and the like so that the above conditions are satisfied.

The load may simply come from gravity or may be applied by some sort of mechanical mechanism.

It should be noted, however, that it is desirable to (i) avoid application of an extreme load so that the components of the film formation substrate 200 and of the rollers 83 are not damaged as described above and (ii) apply weak pressure to keep contact between the rollers 83 and the film formation substrate 200.

For example, with a structure in which the rollers 83 directly support the weights of the film formation substrate 200 and the substrate holder 52 as shown in FIGS. 1 through 5, a load is surely applied between the rollers 83 and the film formation substrate 200 to bring the rollers 83 and the film formation substrate 200 into close contact with each other.

However, in a case where, for example, the film formation substrate 200 is a large-sized film formation substrate 200 made of glass or the like, the weights of the film formation substrate 200 and the substrate holder 52 become very large, so that an increasing load is applied between the rollers 83 and the film formation substrate 200.

In this case, depending on the load the contact between the film formation substrate 200 and the rollers 83 causes damage to the film formation substrate 200 or excessive wear or distortion in the rollers 83.

In order to prevent such a phenomenon, it is desirable to provide such a mechanism that a load applied between the rollers 83 and the film formation substrate 200 does not exceed a certain value.

Further, it is preferable that the substrate holder 52 or the mask holder 81 be placed at such a height as to be provided with play along the Z direction (direction along which the vapor deposition mask 60 and the film formation substrate 200 face each other) so as to be able to move up and down to some degree.

Since the substrate holder 52 or the mask holder 81 is provided with play along the Z direction, it is possible to absorb a minute displacement in height when the film formation substrate 200 is scanned while in contact with the rollers 83.

Figure 12:
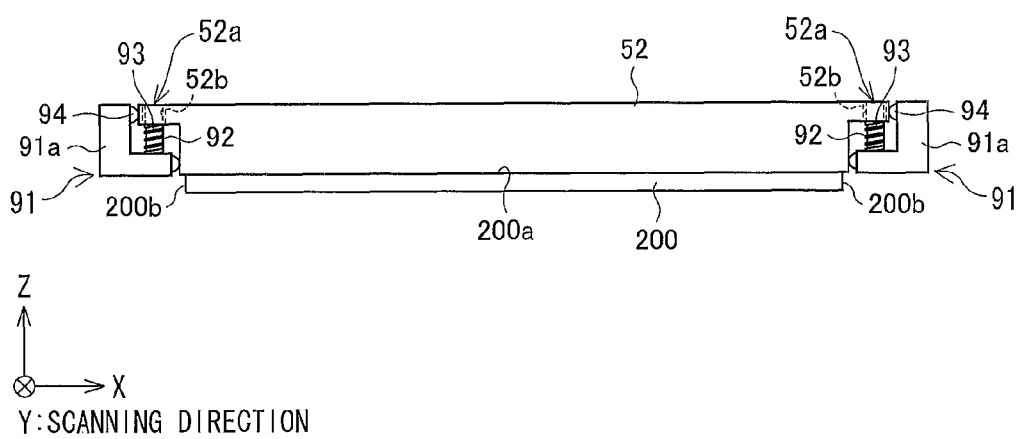
FIG. 12 is a cross-sectional view schematically showing a configuration of a substrate holding member according to Embodiment 3 of the present invention.

FIG. 12 is a cross-sectional view schematically showing a configuration of a substrate holding member according to the present embodiment.

As shown in FIG. 12, the substrate holding member according to the present embodiment includes: a substrate holder 52; a substrate holder holding member 91; and a substrate holder supporting spring 92 (spring) and a column support 93, which serve as a gap control auxiliary member expandably and contractibly provided between the substrate holder 52 and the substrate holder holding member 91.

The substrate holder 52 according to the present embodiment has, at upper edges thereof, protrusions 52a which extend along the scanning direction and which protrude horizontally along a direction perpendicular to the scanning direction.

In the present embodiment, as in Embodiment 1, scanning (relative movement of the film formation substrate 200 with the vapor deposition mask 60) is carried out along the long side 200b of the film formation substrate 200. On this account, the protrusions 52a, which are provided at the upper edges of the substrate holder 52, protrude along the direction along which the short side 200a of the film formation substrate 200 extends, so as to be parallel to the long side 200b of the film formation substrate 200.

Meanwhile, the substrate holder holding member 91 has an L-shaped substrate holder receiving part 91a. The substrate holder 52 is supported by the substrate holder supporting spring 92 and the column support 93 that are fixed to an upper surface of a bottom wall of the substrate holder receiving part 91a.

The column support 93 is so structured as to be fitted into a hole 52b bored in a protrusion 52a of the substrate holder 52. The substrate holder supporting spring 92 has a diameter larger than the hole 52b. Accordingly, the substrate holder supporting spring 92 does not fit into the hole 52b, and makes contact with a lower surface of the protrusion 52a. It should be noted that a groove (depression) may be provided instead of the hole 52b.

The elastic modulus of the substrate holder supporting spring 92 is not to be particularly limited, and can be appropriately set depending on the size and weight of the film formation substrate 200, the load capacity of the rollers 83, the type and number of substrate holder supporting springs 92, etc. so that the film formation substrate 200 is not cracked, broken, flawed, etc. when the film formation substrate 200 is actually moved while in contact with the rollers 83.

As described above, the substrate holder 52 is supported on the substrate holder holding member 91 by the substrate holder supporting spring 92 and the column support 93, and smoothly moves along an upward-downward direction (Z direction) in FIG. 12.

In order to disperse the load and allow the substrate holder 52 to more smoothly move along the Z direction, it is desirable that a plurality of substrate holder supporting springs 92 and a plurality of column supports 93 be provided, and it is preferable that a plurality of substrate holder supporting springs 92 and a plurality of column supports 93 be provided along the scanning direction.

Further, in order to make the movement smoother, it is desirable to keep the distance between the substrate holder 52 and the substrate holder holding member 91 constant with use of a minute bearing 94 or the like.

The presence of the bearing 94 makes it possible to eliminate misalignment of the substrate holder 52 with respect to the substrate holder holding member 91 along the X and Y directions. This contributes in particular to an improvement in alignment accuracy.

In the present embodiment, alignment of the film formation substrate 200 is performed through a slight movement of the substrate holder holding member 91 caused by the substrate moving mechanism 53 (see FIGS. 3 through 5). Since the bearing 94 causes a relative position between the substrate holder holding member 91 and the substrate holder 52 along the X and Y directions to be accurately constant, the slight movement of the substrate holder holding member 91 makes it possible to perform the alignment.

Alternatively, the alignment of the film formation substrate 200 may be performed by moving the bearing 94 configured to be slightly movable along the X and Y directions.

Since the substrate holder 52 holding the film formation substrate 200 is supported by using the substrate holder supporting spring 92 as described above, the film formation substrate 200 is put under load automatically mechanically. The load can be controlled by designing the elastic coefficient (elastic modulus) of the substrate holder supporting spring 92, the disposition of the substrate holder supporting spring (s) 92, and the correlation of the substrate holder supporting spring 92 with gravity, the amount by which the substrate holder supporting spring 92 is compressed, and the like.

Thus, in the present embodiment, since the substrate holder 52 is supported by using the substrate holder supporting spring 92 as the gap control auxiliary member for keeping the gap g1 constant as described above, it is possible to (i) reduce the load on the rollers 83 and (ii) ensure play for a minute change in height of the film formation substrate 200 that is caused by contact between the film formation substrate 200 and the rollers 83 during scanning.

This makes it possible to (i) suppress/prevent floating from occurring between the rollers 83 and the film formation substrate 200 and (ii) absorb minute displacements in height, thus making it possible to strictly and surely keep the gap g1 constant even in a case where, for example, there is a warp or deflection in the film formation substrate 200 or there are minute irregularities in the surface.

<Modification>

As shown in FIG. 12, the present embodiment has been described by taking, as an example, a case where (i) a coil spring is used as the substrate holder supporting spring 92 (gap control auxiliary member) and (ii) the play is ensured by a combination of the coil spring and the column support 93.

However, the present embodiment is not to be limited to such an example. The gap control auxiliary member can be any mechanism, provided that it allows for a smooth movement only along the Z direction while minimizing misalignment along the X and Y directions.

Further, the substrate holder supporting spring 92 is not limited to a coil spring, and can be any of various springs such as an air spring or a spring utilizing electromagnetic power.

Further, the gap control auxiliary member provided between the substrate holder 52 and the substrate holder holding member 91 as described above may be an elastic member such as rubber or resin. Alternatively, the gap control auxiliary member may be an expandable and contractible member such as an actuator so that the play, i.e., the gap between the substrate holder 52 and the substrate holder holding member 91 is actively controlled.

The present embodiment has dealt with a configuration in which the substrate holder supporting spring 92 and the column support 93 are fixed to the substrate holder holding member 91, but the present embodiment is not to be limited to this.

It is also possible to employ a configuration in which (i) the substrate holder supporting spring 92 and the column support 93 are fixed to the substrate holder 52 and (ii) the substrate holder holding member 91 has a hole or a groove through which the column support 93 is inserted.

The substrate holder supporting spring 92 and the column support 93 may be provided on the substrate holder holding member 91 or may be provided on the substrate holder 52 as described above. That is, the substrate holder supporting spring 92 and the column support 93 need only be provided on at least either the substrate holder holding member 91 or the substrate holder 52.

Embodiment 4

The present embodiment is described below mainly with reference to FIG. 13.

The present embodiment mainly deals with differences from Embodiments 1 through 3, and components having the same functions as those used in Embodiments 1 through 3 are given the same reference signs, and as such, are not described below.

As described above, it is preferable that the substrate holder 52 or the mask holder 81 be provided with play so as to be able to move up and down to some degree.

Embodiment 3 has dealt with a case where the gap control auxiliary member provides play on the substrate holder 52 side. Meanwhile, the present embodiment deals with a case where play is provided on the mask holder 81 side.

Figure 13:
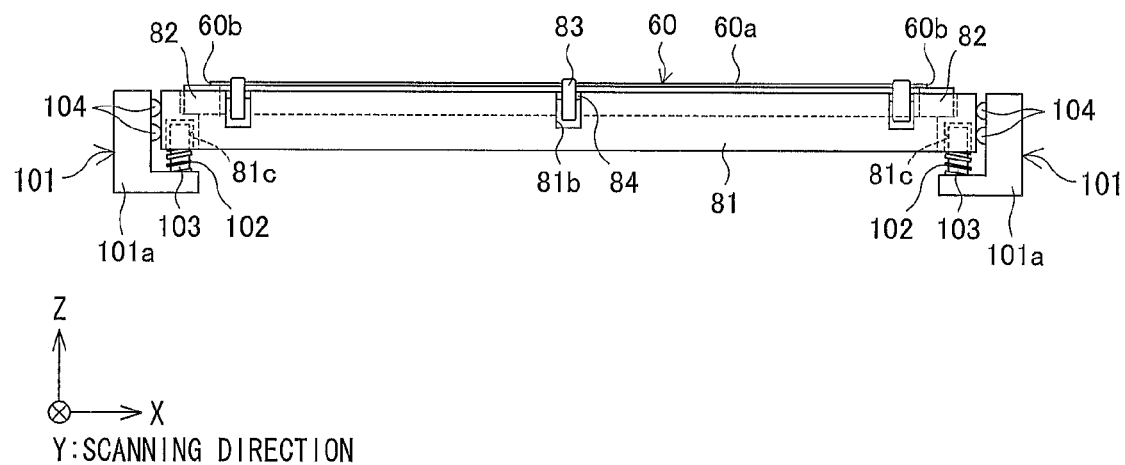
FIG. 13 is a cross-sectional view schematically showing a configuration of a main part of a mask unit according Embodiment 4 of the present invention.

FIG. 13 is a cross-sectional view schematically showing a configuration of a main part of a mask unit 54 according to the present embodiment.

As shown in FIG. 13, the mask unit 54 according to the present embodiment has a structure in which the mask holder 81 is supported on a mask holder holding member 101 by a mask holder supporting spring 102 (spring) and a column support 103 that serve as a gap control auxiliary member.

The mask holder holding member 101 has an L-shaped mask holder receiving part 101a, and the mask holder 81 is supported by the mask holder supporting spring 102 and the column support 103 that are fixed to an upper surface of a bottom wall of the mask holder receiving part 101a.

The column support 103 is so structured as to be fitted into a groove 81c (depression) provided in a lower surface of the mask holder 81. The mask holder supporting spring 102 has a diameter larger than the groove 81c. Accordingly, the mask holding supporting spring 102 does not fit into the groove 81c, and makes contact with the lower surface of the mask holder 81. It should be noted that a hole may be provided instead of the groove 81c, provided that the column support 103 does not make contact with the mask tray 82.

The distance between the column support 103 and the lower surface of the groove 81c is not to be particularly limited, provided that it is set depending on the elastic modulus etc. of the mask holder supporting spring 102 so that necessary play is ensured.

Further, the elastic modulus of the mask holder supporting spring 102 is not to be particularly limited, and can be appropriately set depending on the size and weight of the film formation substrate 200, the load capacity of the rollers 83, the type and number of mask holder supporting springs 102, etc. so that the film formation substrate 200 is not cracked, broken, flawed, etc. when the film formation substrate 200 is actually moved while in contact with the rollers 83.

As described above, the mask holder 81 is supported on the mask holder holding member 101 by the mask holder supporting spring 102 and the column support 103, and smoothly moves along an upward-downward direction (the Z direction) in FIG. 13.

In the present embodiment, too, in order to disperse the load and allow the mask holder 81 to more smoothly move along the Z direction, it is desirable that a plurality of mask holder supporting springs 102 and a plurality of column supports 103 be provided. That is, it is preferable that as shown in FIG. 13, a plurality of mask holder supporting springs 102 and a plurality of column supports 103 be provided along the scanning direction on the mask holder holding member 101 so as to be arranged in lines along both edges of the vapor deposition mask 60 along a longitudinal direction of the vapor deposition mask 60 (i.e., both edges of the vapor deposition mask 60 that are parallel to the long side 60a).

Further, in order to make the movement smoother, it is desirable to keep the distance between the mask holder 81 and the mask holder holding member 101 constant with use of a minute bearing 104 or the like, as in the case of the substrate holder 52.

The presence of the bearing 104 makes it possible to eliminate misalignment of the mask holder 81 with respect to the mask holder holding member 101 along the X and Y directions. This contributes in particular to an improvement in alignment accuracy.

In the present embodiment, alignment of the vapor deposition mask 60 is performed through a slight movement of the mask holder holding member 101 caused by the mask unit moving mechanism 55 (see FIGS. 3 through 5). Since the bearing 104 causes a relative position between the mask holder holding member 101 and the mask holder 81 along the X and Y directions to be accurately constant, the slight movement of the mask holder holding member 101 makes it possible to perform the alignment.

Alternatively, in the present embodiment, too, the mask alignment may be performed by moving the bearing 104 configured to be slightly movable along the X and Y directions.

Thus, according to the present embodiment, since the mask holder 81 is supported by using the mask holder supporting spring 102, play can be provided for the installation height of the mask holder 81. In the present embodiment, too, this makes it possible to ensure play for a minute change in height of the film formation substrate 200 that is caused by contact between the film formation substrate 200 and the rollers 83 during scanning.

Further, in the present embodiment, too, since the mask holder 81 is supported by using the mask holder supporting spring 102 as described above, the weights of the film formation substrate 200 and the substrate holder 52 are not directly applied to the rollers 83 even in a case where the film formation substrate 200 is a large-sized film formation substrate 200 made of glass or the like. This makes it possible to suppress/prevent the concentration of stress on the rollers 83. Accordingly, it is possible to suppress/prevent the occurrence of floating between the rollers 83 and the film formation substrate 200 and to suppress/prevent damage to the film formation substrate 200 or excessive wear or distortion in the rollers 83 due to contact between the film formation substrate 200 and the rollers 83.

Further, in such a case as in the present embodiment where the mask holder 81 is supported on the mask holder holding member 101 by the mask holder supporting spring 102 and the column support 103, the mask holder 81 can be easily replaced by pulling it out while keeping the mask holder holding member 101 intact.

In this case, the mask unit 54 needs only be configured such that the relative positions of the vapor deposition source 70 and the mask holder holding member 101 are fixed.

It is desirable that the bearing 104 be provided so as to evacuate when the mask holder 81 is pulled out. This makes it possible to more smoothly replace the mask holder 81.

<Modification>

As shown in FIG. 13, the present embodiment, too, has been described by taking, as an example, a case where (i) a coil spring is used as the mask holder supporting spring 102 (gap control auxiliary member) and (ii) the play is ensured by a combination of the coil spring and the column support 103, as in the case of the substrate holder supporting spring 92.

However, the present embodiment is not to be limited to such an example. In the present embodiment, too, the gap control auxiliary member can be any mechanism, provided that it allows for a smooth movement only along the Z direction while minimizing misalignment along the X and Y directions.

Further, the mask holder supporting spring 102 is not limited to a coil spring, and can be any of various springs such as an air spring or a spring utilizing electromagnetic power.

Further, the gap control auxiliary member provided between the mask holder 81 and the mask holder holding member 101 as described above may be an elastic member such as rubber or resin. Alternatively, the gap control auxiliary member may be an expandable and contractible member such as an actuator so that the play, i.e., the gap between the mask holder 81 and the mask holder holding member 101 is actively controlled.

The present embodiment has dealt with a configuration in which the mask holder supporting spring 102 and the column support 103 are fixed to the mask holder holding member 101, but the present embodiment is not to be limited to this.

It is also possible to employ a configuration in which (i) the mask holder supporting spring 102 and the column support 103 are fixed to the mask holder 81 and (ii) the mask holder holding member 101 has a hole or a groove through which the column support 103 is inserted.

The mask holder supporting spring 102 and the column support 103 may be provided on the mask holder holding member 101 or may be provided on the mask holder 81 as described above. That is, the mask holder supporting spring 102 and the column support 103 need only be provided on at least either the mask holder holding member 101 or the mask holder 81.

It should be noted, however, that in a case where the mask holder supporting spring 102 and the column support 103 are provided on the mask holder holding member 101, the mask holder 81 can be easily replaced.

Embodiment 5

The present embodiment is described below mainly with reference to FIG. 14.

The present embodiment mainly deals with differences from Embodiments 1 through 4, and components having the same functions as those used Embodiments 1 through 4 are given the same reference signs, and as such, are not described below.

Embodiment 3 has dealt with a case where in a case where upward deposition is carried out as in Embodiment 1, the gap control auxiliary member provides play on the substrate holder 52 side.

The present embodiment deals with a case where in a case where downward deposition is carried out as in Embodiment 2, the gap control auxiliary member provides play on the substrate holder 52 side.

The present embodiment, too, is described by taking, as an example of a gap control auxiliary member, a combination of a substrate holder supporting spring 92 and a column support 93, but the present embodiment is not to be limited to such an example.

Figure 14:
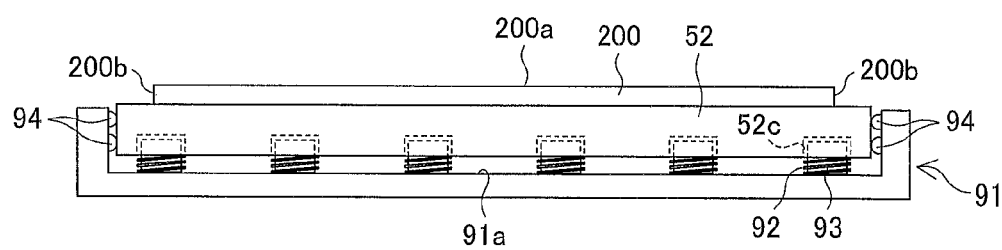
FIG. 14 is a cross-sectional view schematically showing a configuration of a substrate holding member according to Embodiment 5 of the present invention.

FIG. 14 is a cross-sectional view schematically showing a configuration of a substrate holding member according to the present embodiment.

In a case where downward deposition is carried out, substrate holder supporting springs 92 can be disposed all over a lower surface of the substrate holder 52 as shown in FIG. 14.

A substrate holder holding member 91 according to the present embodiment has a substrate holder receiving part 91a which is in a depressed shape (in tray form) that is larger than the substrate holder 52, and the substrate holder 52 is supported by the substrate holder supporting springs 92 and column supports 93 fixed to an upper surface of a bottom wall of the substrate holder receiving part 91a.

The substrate holder supporting springs 92 and the column supports 93 are disposed all over the lower surface of the substrate holder 52. In other words, the substrate holder supporting springs 92 and the column supports 93 are disposed all over an upper surface of the bottom wall of the substrate holder receiving part 91a.

Each of the column supports 93 is so structured as to be fitted into a groove 52c (depression) provided in a lower surface of the substrate holder 52. Each of the substrate holder supporting springs 92 has a diameter larger than the groove 52c. Accordingly, each of the substrate holder supporting spring 92 does not fit into the groove 52c, and makes contact with the lower surface of the substrate holder 52. It should be noted that a hole 52b may be provided instead of the groove 52c, provided that the column supports 93 do not make contact with the film formation substrate 200.

The distance between each of the column supports 93 and the lower surface of the groove 52c is not to be particularly limited, provided that it is set depending on the elastic modulus etc. of the substrate holder supporting spring 92 so that necessary play is ensured.

In the present embodiment, too, in order to make the movement along the Z direction smoother and to eliminate misalignment of the substrate holder 52 with respect to the substrate holder holding member 91 along the X and Y directions, it is desirable to keep the distance between the substrate holder 52 and the substrate holder holding member 91 constant with use of a minute bearing 94 or the like.

According to the present embodiment, the gap control auxiliary members are disposed all over the lower surface of the substrate holder 52 (in other words, the lower surface of the film formation substrate 200) as shown in FIG. 14. This (i) allows a minute change in height to be absorbed all over the lower surface of the substrate holder 52 and (ii) allows the load to be supported on a wide surface. It is therefore possible to more properly disperse the load, thereby allowing a smooth movement along the Z direction (upward-downward direction).

In the present embodiment, too. it is needless to say that it is possible to employ a configuration in which (i) the substrate holder supporting springs 92 and the column supports 93 are fixed to the substrate holder 52 and (ii) the substrate holder holding member 91 is provided with holes or grooves through which the column supports 93 are inserted.

In the present embodiment, too, the substrate holder supporting springs 92 and the column supports 93 may be provided on the substrate holder holding member 91 or may be provided on the substrate holder 52 as described above. That is, the substrate holder supporting spring 92 and the column support 93 need only be provided on at least either the substrate holder holding member 91 or the substrate holder 52.

Embodiment 6

The present embodiment is described below mainly with reference to FIG. 15.

The present embodiment mainly deals with differences from Embodiments 1 through 5, and components having the same functions as those used in Embodiments 1 through 5 are given the same reference signs, and as such, are not described below.

Embodiments 3 through 5 have been described by taking, as an example, a case where the gap control auxiliary member is provided (i) only on the lower surface side of the substrate holder 52 (i.e., only in a direction of gravitational force) so as to be located between the substrate holder 52 and the substrate holder holding member 91 or (ii) only on the lower surface side of the mask holder 81 (i.e., only in a direction of gravitational force) so as to be located between the mask holder 81 and the mask holder holding member 101.

However, the present embodiment is not limited to such an example. The gap control auxiliary member may be provided on each of the lower and upper surface sides of the substrate holder 52 or the mask holder 81.

Figure 15:
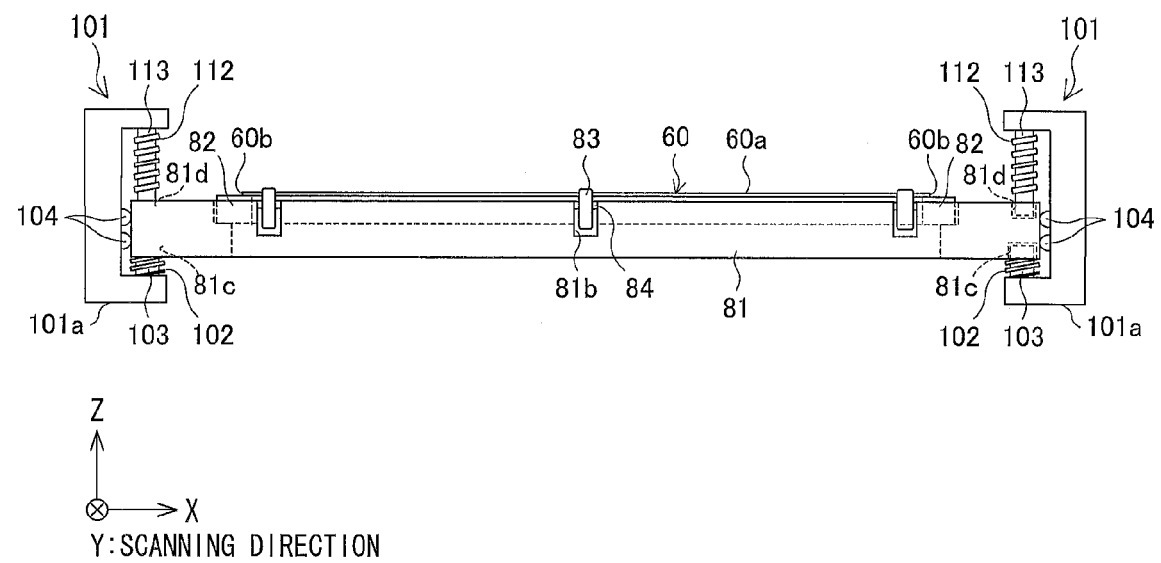
FIG. 15 is a cross-sectional view schematically showing a configuration of a main part of a mask unit according Embodiment 6 of the present invention.

FIG. 15 is a cross-sectional view schematically showing a configuration of a main part of a mask unit 54 according to the present embodiment.

As shown in FIG. 13, the mask unit 54 according to the present embodiment is configured such that (i) a mask holder supporting spring 102 (first mask holder supporting spring) and a column support 103 (first column support) are provided, as first gap retaining members, on a lower surface of a mask holder 81 and (ii) a mask holder supporting spring 112 (second mask holder supporting spring) and a column support 113 (second column support) are provided, as second gap retaining members, on an upper surface of the mask holder 81.

The mask holder 81 is supported on the mask holder holding member 101 by the mask holder supporting springs 102 and 112 and the column supports 103 and 113.

As shown in FIG. 15, the mask holder holding member 101 has a mask holder receiving part 101a having surfaces which faces two edge surfaces of the mask holder 81 that extend along the scanning direction (two edge surfaces of the mask holder 81 along the X direction) and which are recessed so as to hold the mask holder 81 by upper and lower surfaces of two edges of the mask holder 81 that are parallel to the scanning direction (i.e., two edges of the mask holder 81 along the X direction).

The mask holder supporting spring 102 and the column support 103 are fixed to an upper surface of a bottom wall of the mask holder receiving part 101a. Meanwhile, the mask holder supporting spring 112 and the column support 113 are fixed to a lower surface of a top wall of the mask holder receiving part 101a.

The column support 103 is so structured as to be fitted into a groove 81c (recess) provided in a lower surface of the mask holder 81. The mask holder supporting spring 102 has a diameter larger than the groove 81c. Accordingly, the mask holding supporting spring 102 does not fit into the groove 81c, and makes contact with the lower surface of the mask holder 81.

Meanwhile, the column support 113 is so structured as to be fitted into a groove 81d (recess) provided in an upper surface of the mask holder 81. The mask holder supporting spring 112 has a diameter larger than the groove 81d. Accordingly, the mask holding supporting spring 112 does not fit into the groove 81d, and makes contact with the upper surface of the mask holder 81.

As described above, a larger number of gap control auxiliary members allows a load to be more dispersed. This means that less force is required for movement (stretching or compressing movement) along the Z direction. It is therefore possible to achieve a more smooth movement with a lighter load, thereby preventing the film formation substrate 200 from being cracked, broken, flawed, etc. through contact with rollers 83.

For example, in a case where the whole substrate holder has been displaced downward (i.e., has fallen) by 2 mm due to the weight of the substrate holder, the following equality holds:

$$W = n \times 2 \times k,$$

where W is the load applied by the substrate holder, n is the number of springs, and k is the elastic constant of the springs. Therefore, the following equality holds:

$$k = W/(2 \times n).$$

In a case where the substrate holder is further pressed by 0.5 mm (further displaced downward), the load Q required for the pressing is $Q=0.5 \times k$. Therefore, the following equality holds:

$$Q = 0.25 \times W/n.$$

Therefore, the smaller the load W applied by the substrate holder (i.e., the lighter the substrate holder) is and the larger the number of springs n is, the less force is required for the displacement.

That is, a larger number of springs n allows for a smoother movement with a lighter load Q, thereby preventing the film formation substrate 200 from being cracked, broken, flawed, etc. through contact with the rollers 83.

<Modification>

The present embodiment has been described by taking, as an example, a case where the gap control auxiliary members are provided on the lower and upper surface sides of the mask holder 81. However, the present embodiment is not to be limited to such an example. The gap control auxiliary members may be provided on lower and upper surface sides of the substrate holder 52.

That is, the substrate holder holding member 91 has such a shape as to hold the substrate holder 52 by an edge of an upper surface of the substrate holder 52 and an edge of a lower surface of the substrate holder 52. The gap control auxiliary members may be provided between the substrate holder holding member 91 and the upper surface of the substrate holder 52 and between the substrate holder holding member 91 and the lower surface of the substrate holder 52, respectively, so as to make contact with the upper and lower surfaces of the substrate holder 52, respectively.

For example, in a case where downward deposition is carried out as in Embodiments 2 and 5, it is possible to employ a configuration in which (i) a substrate holder holding member 91 having a similar shape to the mask holder holding member 101 shown in FIG. 15 is used instead of the substrate holder holding member 91 shown in FIG. 14 and (ii) gap control auxiliary members are provided on the lower and upper surface sides of the substrate holder 52, respectively.

In the present embodiment, too, it is needless to say that it is possible to employ a configuration in which (i) the mask holder supporting springs 102 and 112 and the column supports 103 and 113 are fixed to the mask holder 81 and (ii) the mask holder holding member 101 is provided with holes or grooves through which the column supports 103 and 113 are inserted.

In the present embodiment, too, the mask holder supporting springs 102 and 112 and the column supports 103 and 113 may be provided on the mask holder holding member 101 or may be provided on the mask holder 81 as described above. That is, the mask holder supporting springs 102 and 112 and the column supports 103 and 113 need only be provided on at least either the mask holder holding member 101 or the mask holder 81.

Embodiment 7

The present embodiment is described below mainly with reference to FIGS. 16 and 17.

The present embodiment mainly deals with differences from Embodiments 1 through 6, and components having the same functions as those used Embodiments 1 through 6 are given the same reference sings, and as such, are not described below.

Figure 16:
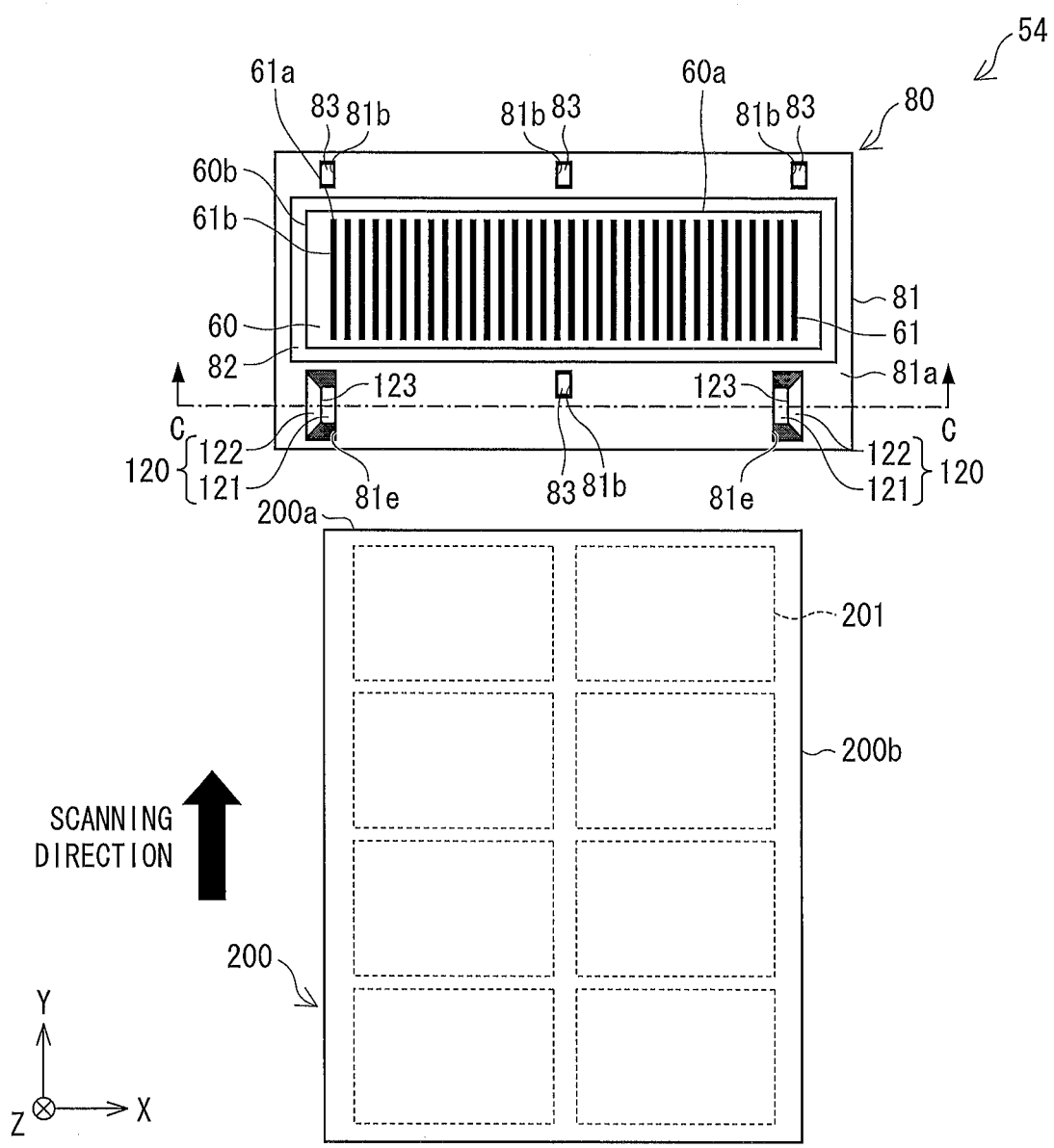
FIG. 16 is a plan view showing main components provided in a vacuum chamber of a vapor deposition apparatus according to Embodiment 7 of the present invention.

FIG. 16 is a plan view showing main components provided in a vacuum chamber 51 of a vapor deposition apparatus 50 according to the present embodiment. FIG. 17 is a cross-sectional view schematically showing a configuration of the main components of the vapor deposition apparatus 50 according to the present embodiment during vapor deposition, as taken along the arrow C-C shown in FIG. 16. It should be noted that FIG. 17 shows a state in which scanning has been further advanced from the state shown in FIG. 16 and then a film formation substrate 200 on which a film is to be formed has been moved to the line C-C shown in FIG. 16. Further, FIG. 16 omits to illustrate a substrate holder 52.

<Configuration of the Vapor Deposition Apparatus 50>

The vapor deposition apparatus 50 of the present embodiment has basically the same configuration as the vapor deposition apparatus 50 of Embodiment 1, except that each of the gap retaining rollers (gap retaining members, rotating bodies), which are respectively provided on right and left edges of the mask holder 81 upstream of the scanning direction (i.e., on a side through which a substrate to be scanned enters), are different in shape from those of the other rollers 83.

Note that gap retaining rollers other than those which are respectively provided on the right and left edges of the mask holder 81 upstream of the scanning direction are the same as the rollers 83 of Embodiment 1. As such, the rollers 83 are not described below.

As shown in FIGS. 16 and 17, the vapor deposition apparatus 50 of the present embodiment has, as the gap retaining rollers (gap retaining members, rotating bodies), rollers 120, provided on the respective right and left edges of the mask holder 81 upstream of the scanning direction, each of which has a shape obtained by combining a cylinder and a truncated cone provided on one end face of the cylinder.

The rollers 120 are each supported in a depression 81e by a shaft 124 on an axis along a direction orthogonal to the scanning direction. The depressions 81e are provided (i) on the right and left edges of the mask holder 81 upstream of the scanning direction and (ii) in that surface (in the present embodiment, upper surface) of the mask holder 81 which faces the film formation substrate 200. The shaft 124 is provided through the center of the roller 120.

Each of the rollers 120 has (i) a cylindrical part 121 that functions as a gap retaining part and (ii) a truncated conical part 122 (fringe part), formed on one end surface of the cylindrical part so as to expand outwards, which functions as a substrate guiding part.

That is, each of the rollers 120 shown in FIGS. 16 and 17 has a structure including a cylindrical roller and a truncated conical roller provided at one end of the cylindrical roller, the truncated conical roller being axially supported by a rotating shaft by which the cylindrical roller is supported, the truncated conical roller being provided integrally with the cylindrical roller.

The rollers 120 protrude higher than the vapor deposition mask 60 provided on the mask tray 82, and are rotatable in the scanning direction. The cylindrical parts 121 protrude higher than the vapor deposition mask 60 by the same height as the rollers 83. Meanwhile, the truncated conical parts 122 protrude higher than the cylindrical parts 121.

This allows the cylindrical part 121 to make contact with the film formation substrate 200 during scanning as the roller 120 rotates in the scanning direction and keep the gap g1 between the film formation substrate 200 and the vapor deposition mask 60 constant. The film formation substrate 200 slides on the cylindrical part 121.

For this reason, as with the rollers 83, it is desirable that the rollers 120 be made of a substance that does not generate dust. Further, as with the rollers 83, in order to prevent the generation of dust from the rollers 120 due to contact with the film formation substrate 200, it is desirable that the rollers 120, including the shafts 123 and the bearings (not illustrated) in the mask holder 81, be constituted by members having low friction and high fatigue strength and, further, members subjected to such surface treatment.

Further, it is desirable that the cylindrical parts 121 of the rollers 120 have their corners chamfered so that the cylindrical parts 121 are prevented from causing damage to the film formation substrate 200 by making contact with the film formation substrate 200.

The rollers 120 are provided on respective right and left edges of the mask holder 81 upstream of the scanning direction so that in each of the rollers 120, a boundary 123 between the cylindrical part 121 and the truncated conical part 122 meets either edge of the film formation substrate 200 along the X direction perpendicular to the scanning direction.

This allows the truncated conical parts 122 to automatically correct a displacement, along the X direction, of the film formation substrate 200 being scanned, so that the film formation substrate 200 is aligned in a correct position (Note, however, that the alignment is carried out roughly on the order of several hundred micrometers, instead of being carried out precisely on the order of several tens of micrometers). As such, the truncated conical part 122 adjusts and keeps a positional relationship between the film formation substrate 200 and the vapor deposition mask 60 along the X direction.

It should be noted that in each of the rollers 120, the angle between the cylindrical part 121 and the truncated conical part 122 and the height by which the truncated conical part 122 protrudes from the cylindrical part 121 are not to be particularly limited, provided that the film formation substrate 200 can be roughly aligned in line with the boundary 123.

It should be noted that the film formation substrate 200, the substrate holder 52, or the mask holder 81 is configured to be displaceable along the X direction so as to absorb a displacement of the film formation substrate 200.

Further, as with the rollers 83, it is desirable that the rollers 120 be disposed in positions where the rollers 120 do not make contact with a panel region 201 of the film formation substrate 200 during scanning or, in particular, in positions where the rollers 120 do not make contact with at least a light-emitting region (light-emitting pixel).

However, this does not imply any limitation, as long as the panel characteristics and other characteristics of a completed product and productivity are not adversely affected. The installation positions, shape, material, etc. of the rollers 120 can be freely selected.

<Vapor Deposition Operation>

The following describes how the vapor deposition apparatus 50 carries out vapor deposition.

In the present embodiment, a film formation substrate 200 having entered onto the substrate holder 52 is roughly aligned by the rollers 120 and then temporarily stopped. After that, precise alignment between the film formation substrate 200 and the vapor deposition mask 60 is performed, and then scanning is carried out.

The stoppage may be carried out by providing a sensor either in the vicinity of each roller 120 in the substrate holder 52 or in a corresponding position in the substrate holder 52. Alternatively, the stoppage may be carried out by detection with a CCD (charge-coupled device).

If possible, scanning may of course be continuously carried out without such a temporary stoppage. In view of takt time, it is desirable to perform real-time alignment without a temporary stoppage.

According to the present embodiment, rough alignment is automatically performed by the rollers 120. Therefore, the present embodiment requires shorter time for alignment than Embodiment 1. This makes it possible to easily perform real-time alignment without a temporary stoppage.

It should be noted that precise alignment can be performed, for example, by using only the mask tray 82, instead of the entire mask holder 81.

In the present embodiment, as described above, the rollers 120, each of which has the aforementioned shape, are respectively provided on right and left edges of the mask holder 81 upstream of the scanning direction. This makes it possible to both keep the gap g1 between the film formation substrate 200 and the vapor deposition mask 60 constant and align the film formation substrate 200 along the X direction.

According to the present embodiment, the amount of space between the film formation substrate 200 and the vapor deposition mask 60 can be accurately controlled, and can therefore be kept at a desired constant value. This makes it possible to suppress fluctuations in width, displacements, and deformations of a pattern (e.g., a pixel pattern) of the vapor-deposited film 211 that is vapor-deposited on the film formation substrate 200 through the openings 61 in the vapor deposition mask 60, thus making it possible to accurately form a high-precision pattern over the entire film formation substrate 200, e.g., over the entire panel region 201.

Further, according to the present embodiment, the rollers 120 can hold the edges of the film formation substrate 200 along the X direction perpendicular to the scanning direction. This makes it possible to reduce displacement of the film formation substrate 200 along the X direction during scanning.

Further, the truncated conical fringes serving as the substrate guiding parts are provided as the truncated conical parts 122 on edges of the respective rollers 120. This allows rough alignment to be naturally performed when the film formation substrate 200 is scanned. This makes it unnecessary to separately provide a rough alignment mechanism, thus making it possible to further simplify the configuration of the apparatus.

<Modification>

According to the present embodiment above described, each of the rollers 120 has a shape obtained by combining a cylinder and a truncated cone provided on one end surface of the cylinder. However, the present embodiment is not to be limited to this. Each of the rollers 120 needs only be a rotating body having (i) a part serving as a gap retaining part and (ii) a part serving as a substrate guiding part.

Each of the rollers 120 needs only have a configuration in which a fringe part (i) is provided on an edge of a gap retaining member (similar to the other gap retaining members) such as any of the foregoing gap retaining rollers and (ii) protrudes higher than such a gap retaining roller. Therefore, the fringe part may have (i) a skirtlike shape obtained by opening the base of a truncated cone or (ii) a shape obtained by providing, on an edge of a gap retaining roller, a ring or the like that is a size larger than the gap retaining roller. It should be noted that in this case, it is desirable that the ring be chamfered.

Embodiment 8

The present embodiment is described below mainly with reference to FIGS. 18 through 20.

The present embodiment mainly deals with differences from Embodiments 1 through 7, and components having the same functions as those used Embodiments 1 through 7 are given the same reference signs, and as such, are not described below.

<Configuration of a Vapor Deposition Apparatus 50>

Figure 18:
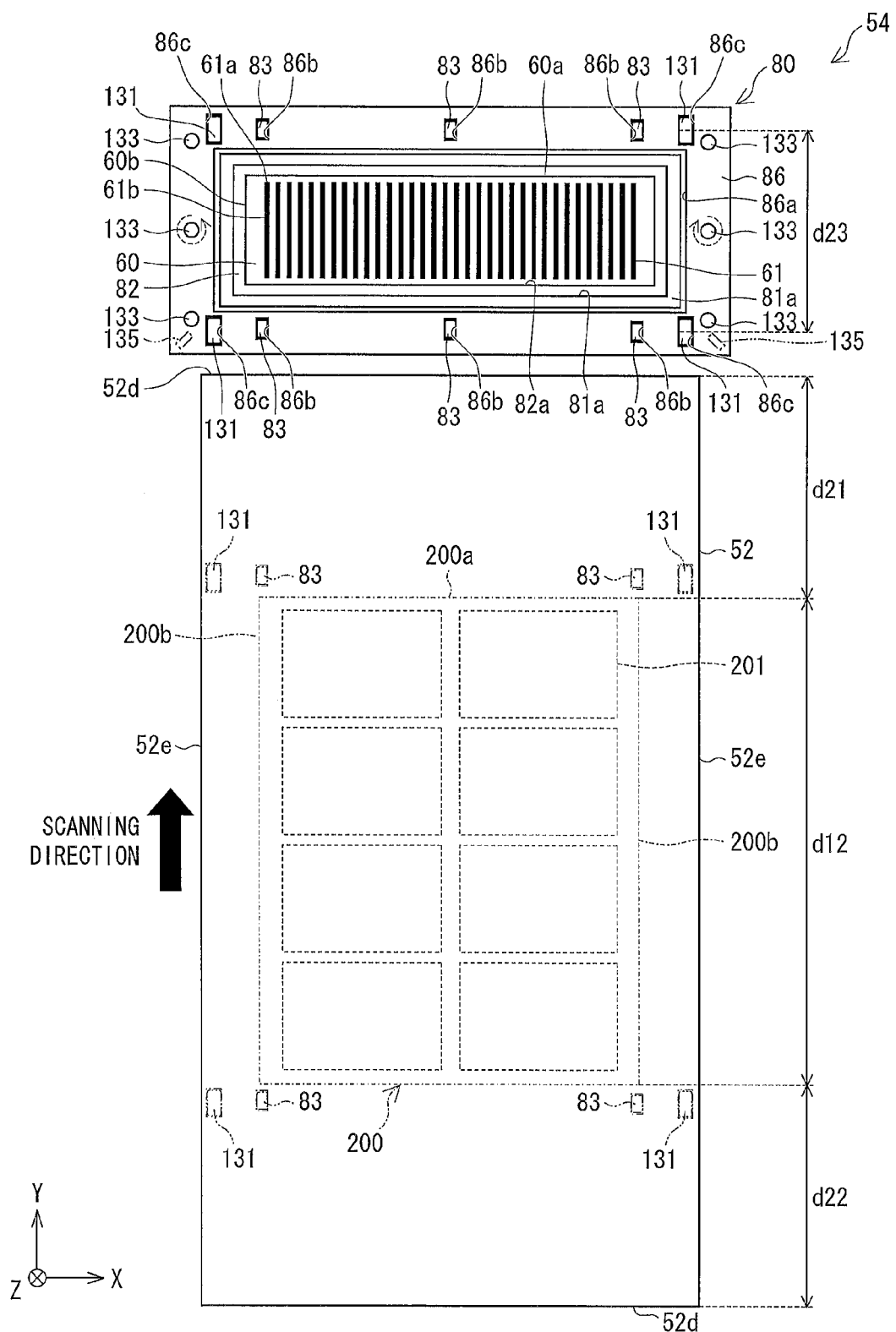
FIG. 18 is a plan view showing main components provided in a vacuum chamber of a vapor deposition apparatus according to Embodiment 8 of the present invention.

FIG. 18 is a plan view showing main components provided in a vacuum chamber 51 of a vapor deposition apparatus 50 according to the present embodiment. Further, FIG. 19 is a side view showing main components provided in the vacuum chamber 51 of the vapor deposition apparatus according to the present embodiment. FIG. 20 is a cross-sectional view schematically showing a configuration of the main components of the vapor deposition apparatus 50 according to the present embodiment during vapor deposition, as taken along the arrow D-D shown in FIG. 19. It should be noted that FIG. 20 shows a state in which scanning has been further advanced from the state shown in FIG. 19 and then a film formation substrate 200 on which a film is to be formed has been moved to the line D-D shown in FIG. 19. In FIGS. 18 through 20, the film formation substrate 200 are in different positions, which means that the scanning of the film formation substrate 200 is further advanced as the number of the drawings ascend.

Figure 19:
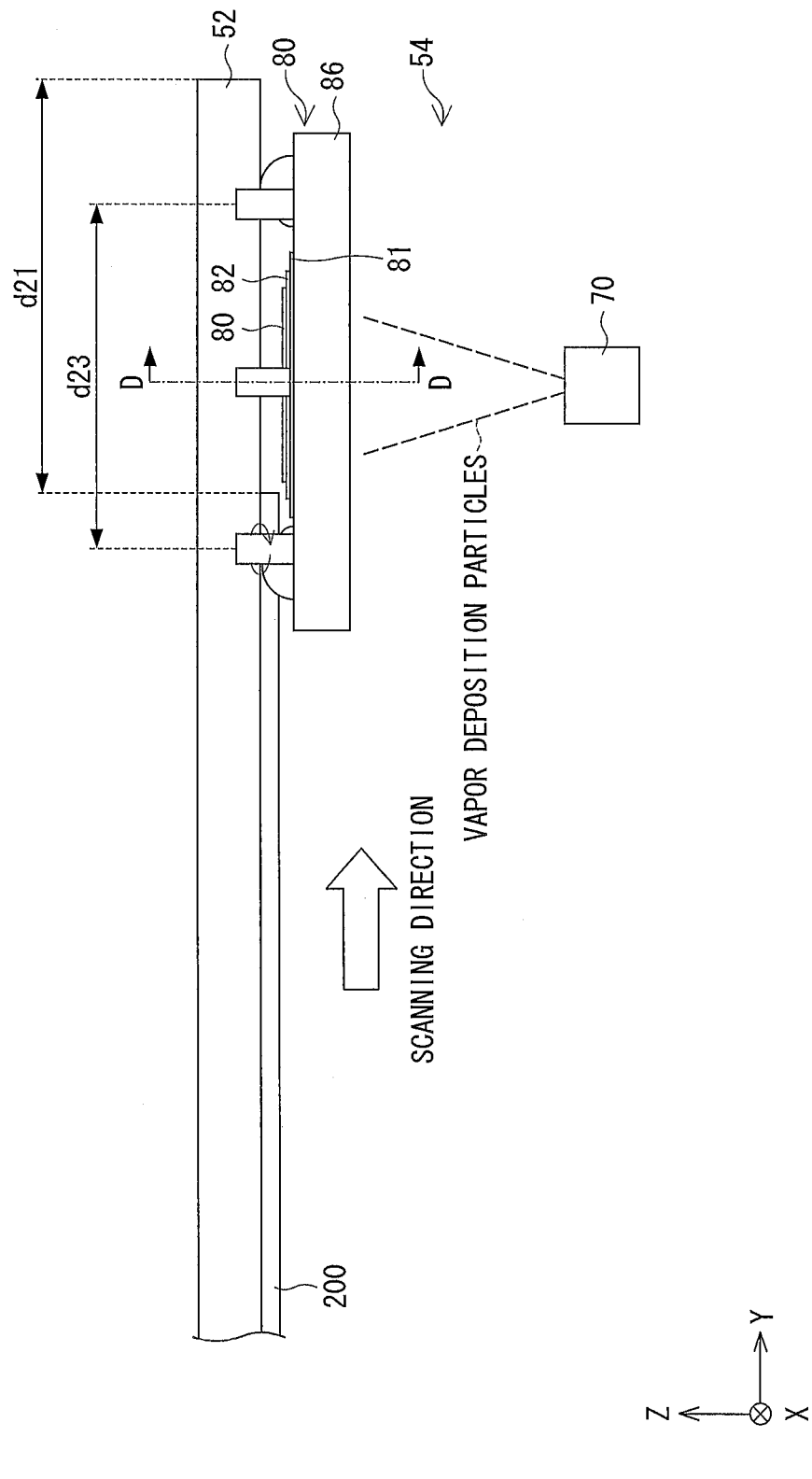
FIG. 19 is a side view showing main components provided in a vacuum chamber of a vapor deposition apparatus according to Embodiment 8 of the present invention.

A mask unit 54 that is used in the present embodiment has a configuration in which as shown in FIGS. 19 and 20, a mask holding member 80 has a roller stage 86 (stage) provided next to a mask holder 81.

The roller stage 86 has a frame shape having an opening in its center, as with the mask holder 81 and the mask tray 82 as shown in, for example, FIGS. 18 and 20.

As shown in FIGS. 18 and 20, the mask holder 81 is placed in an opening 86a in the roller stage 86.

The substrate holder 52 and the roller stage 86 have their relative positional relationship fixed, except in the case of minor adjustments such as alignment and gap adjustment.

In the present embodiment, the rollers 83 are provided not in the mask holder 81 but in the roller stage 86.

The rollers 83 are each supported in a depression 86b by a shaft 84 on an axis along a direction orthogonal to the scanning direction. The depressions 86b are provided in that surface (in the present embodiment, upper surface) of the roller stage 86 which faces the film formation substrate 200. The shaft 84 is provided through the center of the roller 83.

In the present embodiment, as with Embodiment 1, the rollers 83 protrude higher than the vapor deposition mask 60 provided on the mask tray 82, and are rotatable in the scanning direction. This allows the roller 83 to be in contact with the film formation substrate 200 during scanning.

It is preferable that the rollers 83 be provided in front of a position of entrance into a panel region 201 of the film formation substrate 200 onto which vapor deposition particles are vapor-deposited from the vapor deposition source 70.

Therefore, in the present embodiment, the plurality of rollers 83 are provided along the long side 60a of the vapor deposition mask 60 so as to be on sides of the roller stage 86 upstream and downstream of the scanning direction with respect to the vapor deposition mask 60, respectively.

As with Embodiment 1, the present embodiment has been described by taking, as an example, a case where a total of six rollers 83 are provided in the roller stage 86, i.e., three rollers 83 are provided upstream of the scanning direction and the other three rollers 83 are provided downstream of the scanning direction. However, the present embodiment is not to be limited to such an example.

Further, as shown in FIGS. 18 through 20, the roller stage 86 is provided with two types of rollers (guide rollers) separately from the rollers 83 serving as gap retaining rollers (gap retaining members, first gap retaining members) as described above.

It should be noted that the present embodiment has been described by taking, as an example, a case where a total of four guide rollers 131 (first guide rollers, second gap retaining members) are provided in the roller stage 86, i.e., two guide rollers 131 are provided upstream of the scanning direction and the other two guide rollers 131 are provided downstream of the scanning direction.

Further, in the present embodiment, a total of six guide rollers 133 (second guide rollers) are provided in the roller stage 86, i.e., three guide rollers 133 are provided on the right edge of the roller stage 86 along the scanning direction and the other three guide rollers 133 are provided on the left edge of the roller stage 86 along the scanning direction.

However, the number of the guide rollers 131 and 133 are not to be particularly limited, provided that a plurality of guide rollers 131 and a plurality of guide rollers 133 are provided on each of the right and left edges of the roller stage 86.

As with the rollers 83, it is preferable that the guide roller 131 and the guide roller 133 be provided in front of a position of entrance into a panel region 201 of the film formation substrate 200 onto which vapor deposition particles are vapor-deposited from the vapor deposition source 70. Therefore, in the present embodiment, the plurality of guide rollers 131 and the plurality of guide rollers 133 are provided so as to be on sides of the roller stage 86 upstream and downstream of the scanning direction with respect to the vapor deposition mask 60, respectively.

The guide rollers 131 are cylindrical rollers as with the rollers 83, and as shown in FIG. 20, are each supported in a depression 86c by a shaft 132 on an axis along a direction orthogonal to the scanning direction. The depressions 86c are provided in that surface (in the present embodiment, upper surface) of the roller stage 86 which faces the film formation substrate 200. The shaft 132 is provided through the center of the guide roller 131.

The guide rollers 131 protrude higher than the rollers 83, and rotate in the scanning direction while in contact with a holding surface (in the present embodiment, lower surface) of the substrate holder 52, on which holding surface the film formation substrate 200 is held, during scanning. The substrate holder 52 slides on the guide rollers 131 during scanning.

This allows the guide rollers 131 to support the substrate holder 52 and keep a gap g3 between the substrate holder 52 and the roller stage 86 constant during scanning.

The guide rollers 131 have their roller installation heights determined so that the gap g1 between the vapor deposition mask 60 and the film formation substrate 200 takes on a desired value. That is, the guide rollers 131 have their roller installation heights determined so that the gap g3 is equal to a height obtained by adding, to the gap g1, (i) a thickness of the film formation substrate 200 and (ii) a height from a surface of the roller stage 86 to the upper surface of the vapor deposition mask 60. This allows guide rollers 131 to function as auxiliary gap retaining members.

For this reason, the guide rollers 131 are provided so as to be in contact with a region which (i) is on a surface of the substrate holder 52 which faces the roller stage 86 and (ii) is other than a region in which the film formation substrate 200 is held.

That is, the guide rollers 131 are provided in a region, on a surface of the roller stage 86 which faces the substrate holder 52, through which the substrate holder 52 passes during scanning (i.e., a region which overlaps the substrate holder 52 during scanning) and through which the film formation substrate 200 does not pass during scanning (i.e., a region which does not overlap the film formation substrate 200 during scanning).

During scanning, the guide rollers 131 make contact with (i) regions on the substrate holder 52 each of which is between (a) a side (each long side 200b, in the example shown in FIG. 18) of the film formation substrate 200 which is parallel to the scanning direction and (b) a side (each long side 52e, in the example shown in FIG. 18) of the substrate holder 52 which is parallel to the scanning direction and (ii) other regions on the substrate holder 52 which are formed by extensions of the respective above regions along the scanning direction.

The guide rollers 133 are cylindrical rollers, and are each supported by a shaft 133 which (i) is provided in the center part of the guide roller 133 and (ii) extends along a direction perpendicular to that surface of the roller stage 86 which faces the substrate holder 52.

That is, the guide rollers 133 are provided on the roller stage 86 by the respective shafts 133 so as to be rotatable in a horizontal direction.

The guide rollers 133 are provided on right and left edges of the roller stage 86 upstream of the scanning direction so as to make contact with both lateral faces of the substrate holder 52 (i.e., lateral faces of the substrate holder 52 along the X direction perpendicular to the scanning direction).

It is preferable that the roller stage 86 has guide members 135 (as indicated by two-dot chain lines in FIG. 18) provided in the form guide plates or belt-shaped rollers either in front of guide rollers 133 provided on the right and left edges of the roller stage 86 on an uppermost stream side of the scanning direction (i.e., the guide members 135 are provided further upstream) or, more preferably, in place of the guide rollers 133 provided on the uppermost stream side of the scanning direction.

The guide members (guide plates or belt-shaped rollers) 135 are placed so that the distance between the guide members 135, which are provided on the right and left edges of the roller stage 86, becomes grater toward the upstream side of the scanning direction and, on the lowermost stream side of the scanning direction, is substantially equal to the distance between the guide rollers 133 provided on the right and left edges of the roller stage 86.

That is, the guide members 135, which are provided on the right and left edges of the roller stage 86, are arranged in a truncated inverted-V shape.

This makes it possible to roughly align the film formation substrate 200 so that the guide rollers 133 make contact with the lateral faces of the substrate holder 52 during scanning.

In the present embodiment, the gap g1 is adjusted and retained mainly by the rollers 83 making direct contact with the film formation substrate 200.

According to the present embodiment, as described above, the rollers are not provided integrally with the mask holder 81, but are provided in the roller stage 86 provided separately from the mask holder 81.

With the configuration, the function of retaining the gap g1 between the film formation substrate 200 and the vapor deposition mask 60, for which function the rollers 83 are responsible, and the function of holding the vapor deposition mask 60 and performing rough alignment and precise alignment, for which function the mask holder 81 is responsible, can be separated from each other.

Therefore, according to the present embodiment, the components (the rollers) bearing the respective functions can be configured to have shapes, mechanisms, and installation modes that are specialized in the respective functions. This makes it possible to improve accuracy of each of the functions.

The present embodiment makes it possible to use the guide roller 131 to achieve such a design as to support most of the load of the film formation substrate 200. In such a case, it is possible to significantly reduce the load between the film formation substrate 200 and the rollers 83 in actual contact with the film formation substrate 200. This makes it possible to drastically heighten sensitivity and to accurately achieve the function of retaining and controlling the gap g1.

Further, as a matter of course, the film formation substrate 200 is put under less load, damage (such as flaws) to the film formation substrate 200 can be significantly reduced.

Further, as described above, the guide rollers 133 are in contact with the lateral faces of the substrate holder 52. This makes it possible to adjust and retain the positional relation between the film formation substrate 200 and the vapor deposition mask 60 along the X direction.

That is, in the present embodiment, too, the guide rollers 133 automatically correct a displacement, along the X direction, of the film formation substrate 200 being scanned, so that the film formation substrate 200 is aligned in the right position. As compared to Embodiment 7, the present embodiment employs a larger number of rollers specialized in the respective functions as above described. This allows further improvement in alignment accuracy of alignment.

The substrate holder 52 is sufficiently longer in the scanning direction than an actual substrate length (in the present embodiment, a width d12 of the long side 200b of the film formation substrate 200) of the film formation substrate 200 (see FIGS. 18 and 19).

In the present embodiment, the length of the substrate holder 52 is sufficiently greater than the substrate length, and a distance d21 between one short side 52d of the substrate holder 52 upstream of the scanning direction and one short side 200a of the film formation substrate 200 upstream of the scanning direction is greater that an installation width d23 at which a guide roller 131 provided upstream of the scanning direction and another guide roller 131 provided downstream of the scanning direction are placed from each other.

Further, a distance d22 between the other short side 52d of the substrate holder 52 downstream of the scanning direction and the other short side 200a of the film formation substrate 200 downstream of the scanning direction is greater than the installation width d23.

Therefore, at a point in time where the film formation substrate 200 being scanned has reached a position above the vapor deposition mask 60, the substrate holder 52 is already on the four guide rollers 131. Furthermore, at a point in time where the film formation substrate 200 starts to leave the position above the vapor deposition mask 60, the substrate holder 52 is still on the four guide rollers 131.

Therefore, during a period of time in which a film is being actually formed on the film formation substrate 200 through the vapor deposition mask 60, the substrate holder 52 is always on the four guide rollers 131, and therefore is in a remarkably stable state. This improves the accuracy with which the gap g1 is retained.

<Vapor Deposition Operation>

The following describes how the vapor deposition apparatus 50 carries out vapor deposition.

In the present embodiment, the substrate holder 52 being scanned is first roughly aligned by the guide plates or guide members 135 in a case where the guide plates guide members are provided as shown in FIG. 18.

Next, the substrate holder 52 proceed more deeply (i.e., toward the downstream side) onto the roller stage 86 while being on the guide roller 131, which are provided on the upstream side of the scanning direction, and while being roughly aligned along the X direction by the guide roller 133, and then the substrate holder 52 is held by all the guide rollers 131 and 133 as shown in FIG. 19.

At this point in time, the scanning is temporarily stopped, and then a precise alignment of the vapor deposition mask 60 and the film formation substrate 200 is performed, for example, by slightly moving only the substrate holder 52. After that, film formation and scanning are carried out. It is of course possible to continuously carry out scanning without such a temporary stoppage, provided that there is no problem with accuracy.

The present embodiment makes it possible to more precisely and accurately control the amount of space between the film formation substrate 200 and the vapor deposition mask 60, thus making it possible to keep the amount of space at a desired constant value. This makes it possible to suppress fluctuations in width, displacements, and deformations of a pattern (e.g., a pixel pattern) of the vapor-deposited film 211 that is vapor-deposited on the film formation substrate 200 through the openings 61 in the vapor deposition mask 60, thus making it possible to accurately form a high-precision pattern over the entire film formation substrate 200, e.g., over the entire panel region 201.

Further, the present embodiment makes it possible to accurately and automatically perform rough alignment along the X direction, thus making it possible to accurately perform precise alignment in a short period of time. This makes it possible to further improve alignment accuracy.

Further, according to the present embodiment, as described above, the rollers are provided in the roller stage 86 provided separately from the mask holder 81. This makes it possible to, in replacing the vapor deposition mask 60, easily replace the substrate holder 52 while keeping the roller stage 86 intact. This improves the ease with which replacement, and improves mass productivity.

<Modification>

The present embodiment has been described by taking, as an example, a case where the rollers 83 and the guide rollers 131 and 133 are provided in the roller stage 86. However, the present embodiment is not to be limited to such an example.

For example, the rollers 83 may be provided in the mask holder 81, and the guide rollers 131 and 133 may be provided in the roller stage 86.

Further, in this case, the guide rollers 131 and 133 may be configured to be movable along the X direction. With the configuration, in the case of a film formation substrate 200 of a different size and a substrate holder 52 of a different size, the positions of the guide rollers 131 and 133 along the X direction can be changed, regardless of the positions of the rollers 83. This makes it possible to adapt to a film formation substrate 200 of a different size and a substrate holder 52 of a different size simply by changing the positions of the guide rollers 131 and 133 along the X direction.

Alternatively, the rollers 83 and the guide rollers 131 may be provided in the substrate holder 52 as indicated by two-dot chain lines in FIG. 18.

It should be noted that the vapor deposition mask 60 for use in manufacture of the organic EL display device 1 is generally formed to be a extremely thin and high-precision mask. Further, in general, the vapor deposition mask 60 is attached (welded) to the mask tray 82 or the mask holder 81 with tension.

For this reason, in a case where the rollers 83 are provided in the substrate holder 52 as described above, it is desirable that the rollers 83 be provided in such positions as not to make direct contact with the vapor deposition mask 60.

Further, in a case where the guide rollers 131 are provided in the substrate holder 52, it is desirable that the guide rollers 131 are provided such positions as to, during scanning, make contact with the roller stage 86 in a region where the mask holder 81 is not provided (in other words, in such positions as not to make contact with the mask holder 81 during scanning), so as to smoothly make contact and rotation without straddling different members.

Further, in a case where the roller stage 86 is provided next to the mask holder 81 as described above, a mask holder holding member 101 of Embodiments 4 and 6 may be provided so as to hold the mask holder 81 and the roller stage 86.

Further, in the case where the roller stage 86 is provided next to the mask holder 81, rollers 83 and 120 of Embodiment 7 may of course be provided in the roller stage 86 instead of being provided in the mask holder 81.

Embodiment 9

The present embodiment is described below mainly with reference to FIGS. 21 through 24.

The present embodiment mainly deals with differences from Embodiments 1 through 8, and components having the same functions as those used in Embodiments 1 through 8 are given the same reference signs, and as such, are not described below.

Figure 21:
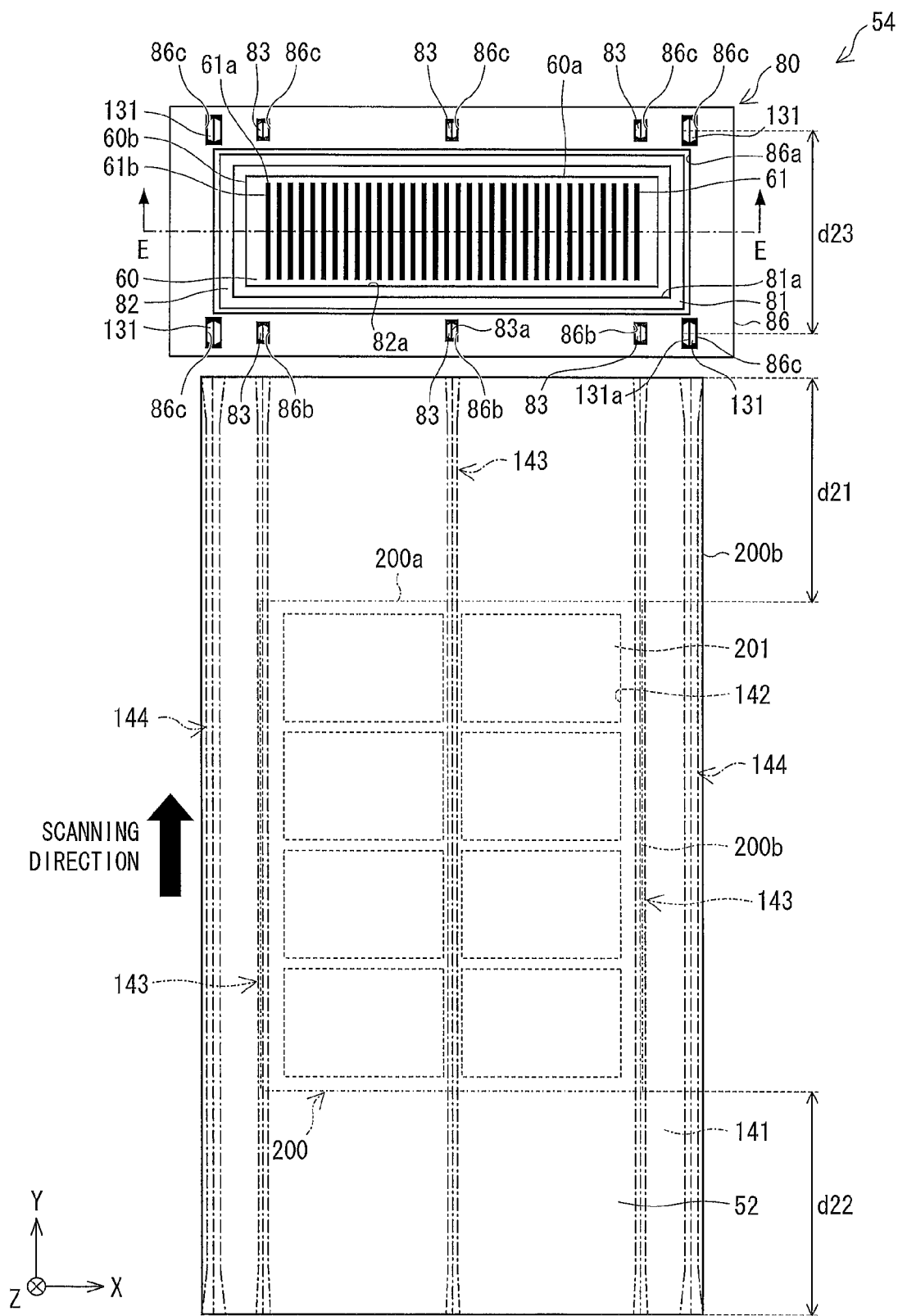
FIG. 21 is a plan view showing main components provided in a vacuum chamber of a vapor deposition apparatus according to Embodiment 9 of the present invention.

FIG. 21 is a plan view showing main components provided in a vacuum chamber 51 of a vapor deposition apparatus 50 according to the present embodiment. FIG. 22 is a cross-sectional view schematically showing a configuration of the main components of the vapor deposition apparatus 50 according to the present embodiment during vapor deposition, as taken along the arrow E-E shown in FIG. 21. Note that FIG. 22 shows a state in which scanning has been further advanced from the state shown in FIG. 21 and then a film formation substrate 200 on which a film is to be formed has been moved to the line E-E shown in FIG. 21.

Figure 23:
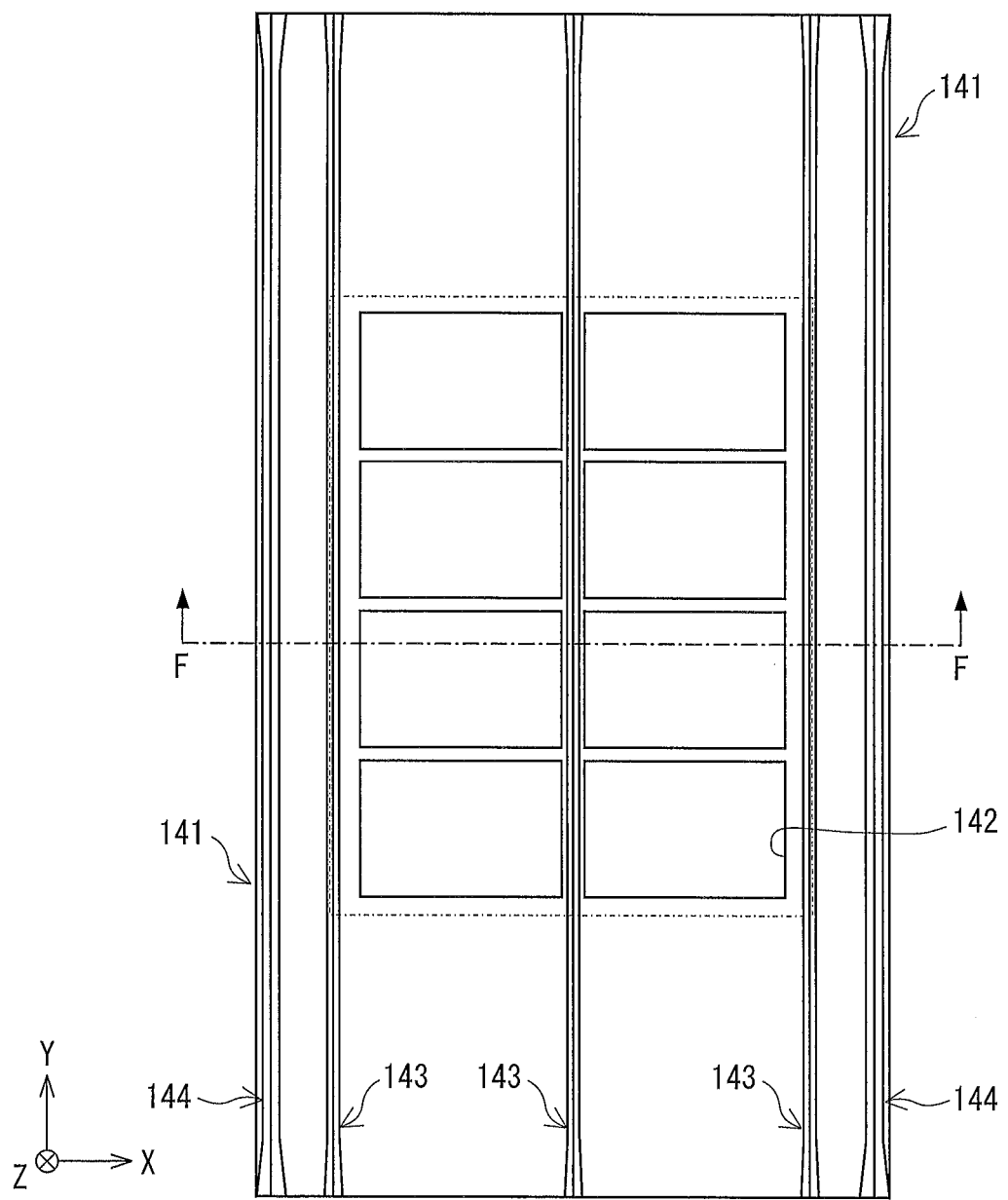
FIG. 23 is a plan view schematically showing a configuration of a substrate frame that is used in Embodiment 9 of the present invention.

FIG. 23 is a plan view schematically showing a configuration of a substrate frame that is used in the present embodiment. FIG. 24 is a cross-sectional view of the substrate frame as taken along the arrow F-F shown in FIG. 23.

In the present embodiment, too, a total of six rollers 83 are provided in the roller stage 86 instead of being provided in the mask holder 81 and a total of four guide rollers 131 are provided in the roller stage 86, i.e., two guide rollers 131 are provided upstream of the scanning direction and the other two guide rollers 131 are provided downstream of the scanning direction.

A substrate holding member of the present embodiment includes a substrate holder 52 and a substrate frame 141 as shown in FIGS. 21 and 22.

The substrate frame 141 is a cover member that is fixed to the substrate holder 52 so as to partially cover a vapor deposition surface (i.e., a surface on which a film is to be formed) of the film formation substrate 200 held by the substrate holder 52.

The substrate frame 141 is fixed to the vapor deposition surface of the film formation substrate 200, which is held by the substrate holder 52, so that a panel region 201 which is a vapor deposition region of the vapor deposition surface is exposed.

For this reason, as shown in FIGS. 23 and 24, the substrate frame 141 has an opening 142 provided in a position corresponding to the panel region 201 of the film formation substrate 200 so that the panel region 201 is exposed.

It should be noted that the substrate frame 141 may be fixed to the substrate holder 52 with a combining member such as a screw or a clamp (not illustrated), or may be and fixed to the substrate holder 52 by sticking together with the film formation substrate 200 by a sticking mechanism such as an electrostatic chuck.

Further, the substrate frame 141 is provided with (i) roller guide grooves 143 that guide the rollers 83 during scanning and (ii) roller guide grooves 144 that guide the guide rollers 131 during scanning. The roller guide grooves 143 correspond to the rollers 83 provided in the roller stage 86, the roller guide grooves 144 correspond to the guide rollers 131 provided in the roller stage 86.

Each of the roller guide grooves 143 and 144 has (i) a triangular cross-section and (ii) is wider in width at both end faces along the Y direction (i.e., the scanning direction).

The rollers 83 and the guide rollers 131 each have a shape that fits in a corresponding one of the roller guide grooves 143 and 144 provided in the substrate frame 141.

In the present embodiment, as shown in FIGS. 21 and 22, the rollers 83 and the guide rollers 131 each have a plane of rotation having a raised portion that extends along a corresponding one of center lines 83a and 131a of the plane of rotation. In other words, the rollers 83 and the guide rollers 131 each have a substantially hexagonal cross-section when viewed from a direction perpendicular to the shafts 84 and 132.

For this reason, in the present embodiment, scanning is carried out while the rollers 83 and the guide rollers 131 are each fitting in a corresponding one of the roller guide grooves 143 and 144 in the substrate frame 141.

In the present embodiment, each of the rollers is thus configured to fit in a corresponding one of the roller guide grooves 143 and 144 provided in the substrate frame 141. This makes it possible to more highly accurately perform alignment.

Further, in the present embodiment, the film formation substrate 200 and the rollers 83 do not directly touch each other, because the substrate frame 141 is provided between the substrate holder 52 and the film formation substrate 200 as described above. This completely eliminates damage to the film formation substrate 200. Accordingly, a decrease in yield due to damage to the film formation substrate 200, generation of dust, etc. is suppressed, and the characteristics of the film formation substrate 200 per se and, furthermore, of the panel per se are stabilized. This makes it possible to improve productivity and improve performance.

It should be noted that the substrate frame 141 having the opening 142 does not hide the panel region 201 of the film formation substrate 200, and as such, does not adversely affect productivity.

Furthermore, the substrate frame 141 can also have an effect as a mask. That is, for example, a non-vapor-deposition region (region where no film needs to be formed) on the film formation substrate 200 where vapor deposition is not carried out, such as a marking portion and a wire portion on the film formation substrate 200, can be masked in advance.

Furthermore, the substrate frame 141 can press the film formation substrate 200 against the surface of the substrate holder 52, and as such, can prevent deflection etc. of the film formation substrate 200. For this reason, a distribution of the amount of space all over the plane of the film formation substrate 200 is better suppressed. At the same time, this makes it possible to improve alignment accuracy and more highly accurately form a predetermined pattern such as a pixel pattern.

Each of the roller guide grooves 143 and 144 provided in the substrate frame 141 has its end widened. Therefore, displacements along the X direction are automatically absorbed when the film formation substrate 200 enters, and each of the rollers therefore surely fits in a corresponding one of the roller guide grooves 143 and 144. This makes it possible to achieve an improvement in yield and an improvement in accuracy.

Further, in the present embodiment, the functions of guides along the X direction is provided by providing the roller guide grooves 143 and 144 in the substrate frame 141 as described above. This makes it possible to achieve a similar function to the guide rollers 133, without separately providing the guide rollers 133. unlike in Embodiment 8.

As described above, the present embodiment makes it possible to more accurately control the amount of space between the film formation substrate 200 and the vapor deposition mask 60 all over the film formation substrate 200, and keep the amount of space at a desired constant value, while aligning the film formation substrate 200 and the vapor deposition mask 60 in real time. This makes it possible to suppress fluctuations in width, displacements, and deformations of a pattern (e.g., a pixel pattern) of the vapor-deposited film 211 that is vapor-deposited on the film formation substrate 200 through the openings 61 in the vapor deposition mask 60, thus making it possible to accurately form a high-precision pattern over the entire film formation substrate 200, e.g., over the entire panel region 201.

<Modification>

In the present embodiment, too, the rollers 83 and the guide rollers 131 may be provided in the substrate holder 52, although not illustrated.

In this case, effects similar to those described above can be brought about by (i) providing the roller stage 86 not with the substrate frame 141 but with a belt-shaped or frame-shaped cover member provided with guide grooves extending along the scanning direction across the vapor deposition mask 60, the mask tray 82, the mask holder 81, and the roller stage 86 and (ii) fitting the rollers 83 in the guide grooves in the cover member.

It should be noted that the guide grooves in which the guide rollers 131 fit may be directly provided in the roller stage 86 or provided in the belt-shape or frame-shaped cover member as described above. In either case, effects similar to those described above can be brought about.

In this case, the rollers 83 do not make direct contact with the vapor deposition mask 60 because the belt-shape or frame-shaped cover member is provided on the vapor deposition mask 60.

Embodiment 10

The present embodiment is described below mainly with reference to FIGS. 25 and 26.

The present embodiment mainly deals with differences from Embodiments 1 through 9, and components having the same functions as those used in Embodiments 1 through 9 are given the same reference signs, and as such, are not described below.

Figure 25:
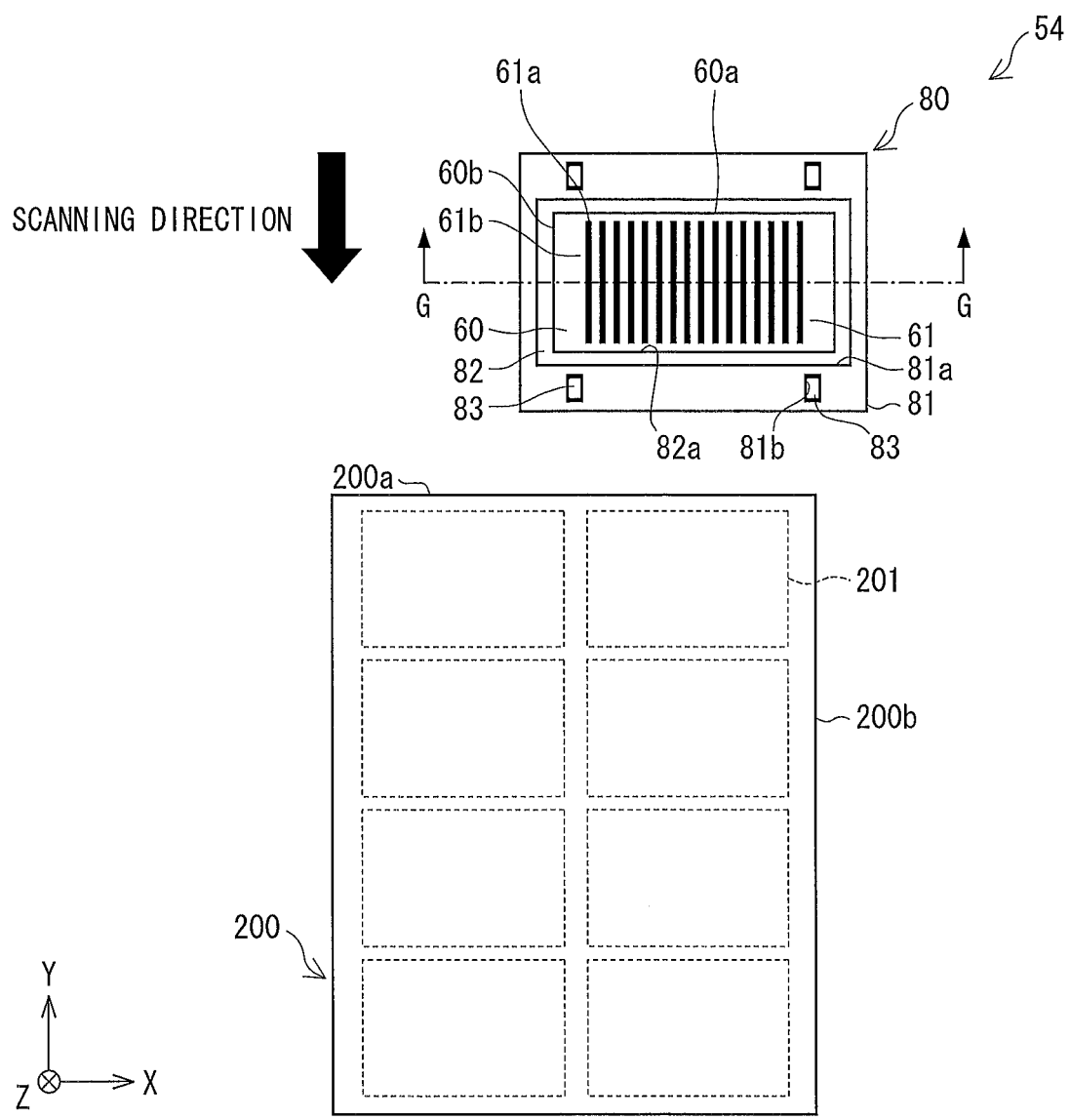
FIG. 25 is a plan view showing main components provided in a vacuum chamber of a vapor deposition apparatus according to Embodiment 10 of the present invention.
Figure 26:
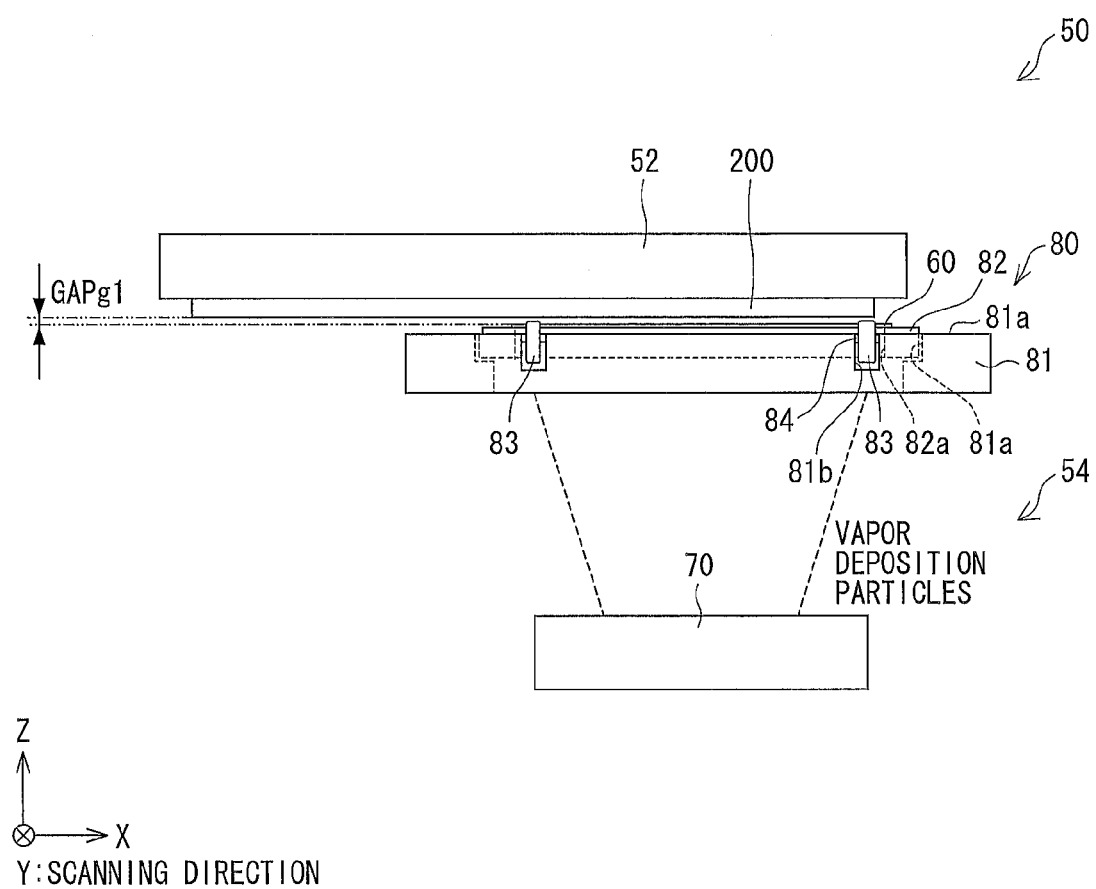
FIG. 26 is a cross-sectional view schematically showing a configuration of the main components of the vapor deposition apparatus according to Embodiment 10 of the present invention during vapor deposition, as taken along the arrow G-G shown in FIG. 25.

FIG. 25 is a plan view showing main components provided in a vacuum chamber 51 of a vapor deposition apparatus 50 according to the present embodiment. FIG. 26 is a cross-sectional view schematically showing a configuration of the main components of the vapor deposition apparatus 50 according to the present embodiment during vapor deposition, as taken along the arrow G-G shown in FIG. 25. Note that FIG. 26 shows a state in which scanning has been further advanced from the state shown in FIG. 25 and then a film formation substrate 200 on which a film is to be formed has been moved to the line G-G shown in FIG. 25.

The vapor deposition apparatus 50 of the present embodiment has a smaller mask unit 54 than the vapor deposition apparatus 50 of Embodiment 1. In the present embodiment, vapor deposition on the film formation substrate 200 is carried out by moving the mask unit 54 relative to the film formation substrate 200.

A vapor deposition mask 60 of the present embodiment is formed to have such a size that the panel regions 201 provided in the right half of the film formation substrate 200 can be subjected to vapor deposition with a single scanning. For example, in the case of intermittent scanning, the vapor deposition mask 60 has such a size that a single panel region 201 of the film formation substrate 200 can be subjected to vapor deposition with a single scanning.

For this reason, vapor deposition over the entire surface of the film formation substrate 200 in the present embodiment is accomplished by moving the mask unit 54 back-and-forth so as to carry out reciprocating scanning or by providing a plurality of mask units 54. In a case where the mask unit 54 is moved back-and-forth, the mask unit 54 is slid so that the mask unit 54 faces the panel regions 201 in the other half (in the present embodiment, the left half) while moving back.

In this case, scanning (relative movement of the mask unit 54 with respect to the film formation substrate 200) may be carried out continuously or intermittently. Further, the scanning rate may be variable.

For example, immediately above the panel region 201, the scanning speed may be lowered or the scanning may be stopped.

As for the operation of lowering the scanning rate or stopping scanning immediately above a panel region 201, the same applies to Embodiments 1 through 9. However, since the mask unit 54 is small in size in the present embodiment, it is easy to carry out such an operation in the present embodiment. Thus, according to the present embodiment, the operation such as varying the scanning rate can be easily carried out because the mask unit 54 is small in size.

Further, because of the small size of the mask unit 54, deflection, expansion, etc. of the members such as the vapor deposition mask 60, the mask holder 81, and the mask tray 82, which constitute the mask unit 54, are relatively decreased as compared with the case where the size of the mask unit 54 is larger. This improves the accuracy with which the gap g1 is retained and alignment accuracy.

The present embodiment makes it relatively easy to perform precise alignment, thus also making it possible to improve throughput.

It should be noted, however, that depending on the size of the film formation substrate 200 with respect to the mask unit 54, the operation of precise alignment between the film formation substrate 200 and the vapor deposition mask 60 needs to be performed, for example, twice (in the back and forth movements).

Therefore, the size of the mask unit 54 with respect to the film formation substrate 200 needs only be determined by taking the size of the film formation substrate 200 and the like into consideration.

In Embodiments 1 through 9, too, it is of course possible to carry out scanning by moving the mask unit 54 relative to the film formation substrate 200 while the film formation substrate 200 is being fixed.

As with Embodiment 8, the present embodiment may employ a configuration in which (i) a roller stage 86 is provided next to a mask holder 81 and (ii) displacement along the X direction between the film formation substrate 200 and the vapor deposition mask 60 is corrected with use of a plurality of guide rollers.

<Outline of the Main Points>

As described above, a vapor deposition apparatus according to each of the embodiments described above is a vapor deposition apparatus for forming a film of a predetermined pattern on a film formation substrate on which the film is to be formed, the vapor deposition apparatus including: (1) a substrate holding member for holding the film formation substrate; (2) a mask unit including (i) a vapor deposition source from which vapor deposition particles are ejected, (ii) a vapor deposition mask which has openings and causes the vapor deposition particles ejected from the vapor deposition source to be vapor-deposited on the film formation substrate through the openings, and (iii) a mask holding member for holding the vapor deposition mask, the vapor deposition mask being smaller in area than the film formation substrate, the vapor deposition source and the vapor deposition mask having their relative positions fixed; and (3) moving means for causing a relative movement of at least one of (A) the mask unit and (B) the substrate holding member for scanning, the substrate holding member and the mask holding member being placed opposite each other so that the vapor deposition mask and the film formation substrate face each other during scanning, the vapor deposition apparatus further comprising a gap retaining member provided in a surface of at least one of (A) the substrate holding member and (B) the mask holding member which faces the other one of (A) the substrate holding member and (B) the mask holding member, the gap retaining member protruding toward the other member, the gap retaining member rotating, during scanning, in a scanning direction while in contact with the member it faces and thereby keeping a gap between the vapor deposition mask and the film formation substrate constant during scanning.

This increases the retention of the gap between the vapor deposition mask and the film formation substrate is increased, and makes it less likely for the film formation substrate and the vapor deposition mask to touch each other, thus making it possible to achieve a narrower gap. Further, the gap can be accurately controlled, and can therefore be kept at a desired constant value. This makes it possible to highly accurately form a high-precision pattern over the entire surface of the film formation substrate. Furthermore, the gap can be kept constant with a simple mechanism. This makes it possible to reduce the unit price of the apparatus, improve mass productivity, and reduce the cost of panels per unit price.

The vapor deposition apparatus is preferably configured such that the gap retaining member is a roller.

According to the foregoing configuration, the aforementioned effects of the gap retaining member can be brought about with a simple configuration.

The vapor deposition apparatus is preferably configured such that the substrate holding member includes (i) a substrate holder to which the film formation substrate is fixed, (ii) a substrate holder holding member for holding the substrate holder, and (iii) a gap control auxiliary member expandably and contractibly provided between the substrate holder holding member and the substrate holder.

According to the foregoing configuration, the use of the gap control auxiliary member to support the substrate holder makes it possible to ensure play for a minute change in height that is caused by contact between the gap retaining member and the member facing the gap retaining member during scanning.

Therefore, according to the foregoing configuration, minute displacements in height can be absorbed. Accordingly, even in a case where, for example, there is a warp or deflection in the film formation substrate or there are minute irregularities in the surface, the gap can be more strictly and surely kept constant.

The vapor deposition apparatus is preferably configured such that the gap control auxiliary member is constituted by a spring and a column support, the spring and the column support being fixed to at least one of (A) the substrate holder holding member and (B) the substrate holder, the vapor deposition apparatus further comprising a hole or a groove into which the column support is inserted, the hole or the groove being provided in a surface of the other one of (A) the substrate holder holding member and (B) the substrate holder which faces the spring and the column support, the other member facing the one member, wherein the spring has a larger diameter than the hole or the groove does, and is in contact with that surface of the other member which faces the spring and the column support.

According to the foregoing configuration, minute displacements in height can be absorbed, as mentioned above, with a simple, inexpensive configuration.

Further, according to the foregoing configuration, the substrate holder can be supported by using the spring. This puts the film formation substrate under load automatically and mechanically.

For this reason, according to the foregoing configuration, in the case of upward deposition where vapor deposition is carried out by ejecting vapor deposition particles upward through the openings in the vapor deposition mask, for example, a load can be automatically and mechanically applied between the gap retaining member and the member facing and touching the gap retaining member. This makes it possible to suppress or prevent lifting between the gap retaining member and the member facing and touching the gap retaining member, thus making it possible to uniformly and surely bring both of the members into contact with each other.

Further, in a case where upward deposition is carried out as described above, the use of the gap control auxiliary member to support the substrate holder makes it possible to reduce the load on the gap retaining member.

The vapor deposition apparatus is preferably configured such that: the substrate holding member is placed beneath the mask holding member so that vapor deposition is carried out by ejecting the vapor deposition particles downward through the openings in the vapor deposition mask; the substrate holder holding member has a substrate holder receiving part which is in a depressed shape that is larger than the substrate holder; and at least one of (A) the substrate holder holding member and (B) the substrate holder is provided with the spring and the column support all over a surface of the substrate holder which faces the substrate holder receiving part.

According to the foregoing configuration, the gap control auxiliary member constituted by the spring and the column support all over that surface of the substrate holder which faces the substrate holder receiving part is provided as described above. This makes it possible to absorb minute displacements in height all over that surface of the substrate holder which faces the substrate holder receiving part. Further, the load can be supported by a wider surface, and can therefore be more appropriately dispersed. This makes it possible to make smooth upward and downward movements.

The vapor deposition apparatus is preferably configured such that the mask holding member includes (i) a mask holder by which the vapor deposition mask is held, (ii) a mask holder holding member for holding the mask holder, and (iii) a gap control auxiliary member expandably and contractibly provided between the mask holder holding member and the mask holder.

According to the foregoing configuration, the use of the gap control auxiliary member to support the mask holder makes it possible to ensure play for a minute change that is caused by contact between the gap retaining member and the member facing the gap retaining member during scanning.

Therefore, according to the foregoing configuration, minute displacements in height can be absorbed. Accordingly, even in a case where there is a warp or deflection in the film formation substrate or there are minute irregularities in the surface, for example, the gap can be more strictly and surely kept constant.

The vapor deposition apparatus is preferably configured such that the gap control auxiliary member is constituted by a spring and a column support, the spring and the column support being fixed to at least one of (A) the mask holder holding member and (B) the mask holder, the vapor deposition apparatus further comprising a hole or a groove into which the column support is inserted, the hole or the groove being provided in a surface of the other one of (A) the mask holder holding member and (B) the mask holder which faces the spring and the column support, the other member facing the one member, wherein the spring has a larger diameter than the hole or the groove does, and is in contact with that surface of the other member which faces the spring and the column support.

According to the foregoing configuration, minute displacements in height can be absorbed, as mentioned above, with a simple, inexpensive configuration.

Further, according to the foregoing configuration, the spring can be supported by using the mask holder. For this reason, even in the case of use of a large-sized substrate as the film formation substrate in upward deposition where vapor deposition is carried out by ejecting vapor deposition particles upward through the openings in the vapor deposition mask, for example, the film formation substrate and the substrate holder do not put their full weights on the gap retaining member, so that stress concentration on the gap retaining member can be suppressed or prevented.

Therefore, in the case of upward deposition, the foregoing configuration can suppress or prevent lifting between the gap retaining member and the member facing and touching the gap retaining member, and can inhibit or prevent (i) the member facing and touching the gap retaining member or, in particular, the film formation substrate from being damaged and/or (ii) the gap retaining member from being excessively worn and/or distorted by the contact between the gap retaining member and the member facing and touching the gap retaining member.)

The vapor deposition apparatus is preferably configured such that the gap control auxiliary member is fixed to the mask holder holding member.

According to the foregoing configuration, the mask hold can be easily replaced by pulling it out while keeping the mask holder holding member intact.

The vapor deposition apparatus is preferably configured such that: the mask holder holding member has such a shape as to hold the mask holder by an edge of an upper surface of the mask holder and an edge of a lower surface of the mask holder; and the gap control auxiliary member comprises gap control auxiliary members provided between the mask holder holding member and the upper surface of the mask holder and between the mask holder holding member and the lower surface of the mask holder, respectively, so as to make contact with the upper and lower surfaces of the mask holder, respectively.

In such a case as that described above where the provision of the gap control auxiliary members to provide play for a minute change in height, the larger the number of gap control auxiliary members such as springs is, the less force is required for displacement.

Therefore, a larger number of gap control auxiliary members can achieve a smooth movement with a lighter load, and can inhibit or prevent (i) the member facing and touching the gap retaining member or, in particular, the film formation substrate from being damaged and/or (ii) the gap retaining member from being excessively worn and/or distorted by the contact between the gap retaining member and the member facing and touching the gap retaining member.

The vapor deposition apparatus is preferably configured such that: the gap retaining member comprises at least two gap retaining members provided on a side of the mask holding member upstream of the scanning direction; the gap retaining members provided on the side of the mask holding member upstream of the scanning direction each include a rotating body and a substrate guiding part provided at an edge of the rotating body, the rotating body functioning as a gap retaining part to keep the gap between the vapor deposition mask and the film formation substrate constant, the substrate guiding part protruding further than the rotating body in a direction along which the vapor deposition mask and the film formation substrate face each other; and the gap retaining members provided on the side of the mask holding member upstream of the scanning direction are each placed so that a boundary between the gap retaining part and the substrate guiding part meets either edge of the film formation substrate along a direction perpendicular to the scanning direction.

The vapor deposition apparatus is preferably configured such that: the gap retaining members respectively provided on right and left edges of the mask holding member upstream of the scanning direction each have a structure including a cylindrical roller and a truncated conical roller provided at one end of the cylindrical roller, the truncated conical roller being axially supported by a rotating shaft by which the cylindrical roller is supported, the truncated conical roller being provided integrally with the cylindrical roller; and the cylindrical roller functions as the gap retaining part, and the truncated conical roller functions as the substrate guiding part.

According to each of the foregoing configurations, the holding members thus configured are respectively provided on right and left edges of the mask holding member upstream of the scanning direction. This makes it possible to both keep the gap between the film formation substrate and the vapor deposition mask constant and align the film formation substrate along the direction perpendicular to the scanning direction.

Further, according to each of the foregoing configurations, the holding members respectively provided on right and left edges of the mask holding member upstream of the scanning direction causes a rough alignment to be automatically performed, thus shortening the amount of time required for alignment. This makes it possible to easily perform real-time continuous alignment.

Moreover, according to each of the foregoing configurations, it is not necessary to separately provide a rough alignment mechanism, so that the configuration of the apparatus can be further simplified.

The vapor deposition apparatus is preferably configured such that: the mask holding member includes (i) a mask tray which is frame-shaped and which directly holds the vapor deposition mask and (ii) a mask holder which is frame-shaped and which holds the mask tray; and the gap retaining member is provided in the mask holder.

According to the foregoing configuration, in a case where the position in which the gap retaining member is placed is determined by a vapor deposition region of the film formation substrate, e.g., in the case of a change in placement of a vapor deposition range such as a change of model at the time of mass production, the mask holder needs only be replaced accordingly.

Further, according to the foregoing configuration, the vapor deposition mask is held by the mask tray, and the gap retaining member is provided in the mask holder. This makes it possible to replace the vapor deposition mask by replacing the mask tray.

The vapor deposition apparatus is preferably configured such that: the gap retaining member is provided in the mask holding member; and the gap retaining member includes (i) a first gap retaining member provided in a first region on a surface of the mask holding member which faces the substrate holding member, the first region overlapping the film formation substrate during scanning, and (ii) a second gap retaining member provided on a second region on that surface of the mask holding member which faces the substrate holding member, the second region overlapping the substrate holding member but not overlapping the film formation substrate during scanning.

According to the foregoing configuration, while the first gap retaining member is responsible for adjustment and retention of the gap between the vapor deposition mask and the film formation substrate, most of the load on the film formation substrate and the substrate holding member can be supported by the second gap retaining member. This makes it possible to greatly reduce the load between the film formation substrate and the first gap retaining member actually touching the film formation substrate, thus making it possible to achieve a very high sensitivity.

This allows the first gap retaining member to highly accurately fulfill its function of retaining and controlling the gap.

Further, as a matter of course, since the film formation substrate is put under less load, damage (such as flaws) to the film formation substrate can be significantly reduced.

The vapor deposition apparatus is preferably configured such that: the second gap retaining member comprises second gap retaining members provided on sides of the mask holding member upstream and downstream of the scanning direction with respect to the vapor deposition mask; and a distance between an edge of the substrate holding member upstream of the scanning direction and an edge of the film formation substrate upstream of the scanning direction is greater than an installation width at which the second gap retaining member provided upstream of the scanning direction and the second gap retaining member provided downstream of the scanning direction are placed from each other.

According to the foregoing configuration, by a point in time where the film formation substrate arrives at a vapor deposition region of the vapor deposition mask during scanning, the substrate holding member is already located above the second gap retaining member; furthermore, at a point in time where the film formation substrate departs from the vapor deposition region of the vapor deposition mask, the substrate holding member is still located above the second gap retaining member.

Therefore, during a period in which a film is being actually formed on the film formation substrate through the vapor deposition mask, the substrate holding member is always located above the second gap retaining member to be in a very stable state. This improves the accuracy with which the gap is retained.

The vapor deposition apparatus is preferably configured such that: the mask holding member includes a stage provided next to a mask holder by which the vapor deposition mask is held; and the gap retaining member is provided in the stage.

The foregoing configuration makes it possible to, in replacing the vapor deposition mask, easily replace the substrate holder while keeping the stage intact. This improves the ease with which replacement is made, and improves mass productivity.

The vapor deposition apparatus is preferably configured such that: the substrate holding member includes (i) a substrate holder for holding the film formation substrate and (ii) a cover member covering part of a vapor deposition surface of the film formation substrate held by the film formation substrate holder, the cover member being fixed to the substrate holder so that a vapor deposition region of the film formation substrate is exposed; and the cover member is provided with a guide groove in which the gap retaining member fits.

According to the foregoing configuration, scanning is carried out with the gap retaining member fitting in the guide groove in the cover member. This makes it possible to more highly accurately perform alignment.

Further, the film formation substrate and the gap retaining member do not directly touch each other. This completely eliminates damage to the film formation substrate. Accordingly, a decrease in yield due to damage to the film formation substrate, generation of dust, etc. is suppressed, and the characteristics of the film formation substrate per se and, furthermore, of the panel per se are stabilized. This makes it possible to improve productivity and improve performance.

It should be noted that the cover member does not hide the vapor deposition region of the film formation substrate, and as such, does not adversely affect productivity.

Furthermore, the cover member can also have an effect as a mask. That is, for example, a non-vapor-deposition region (region where no film needs to be formed) on the film formation substrate where vapor deposition is not carried out, such as a marking portion and a wire portion on the film formation substrate, can be masked in advance.

Furthermore, the cover member can press the film formation substrate against the surface of the substrate holder, and as such, can prevent deflection etc. of the film formation substrate. For this reason, a distribution of the amount of space all over the plane of the film formation substrate is better suppressed. At the same time, this makes it possible to improve alignment accuracy and more highly accurately form the predetermined pattern.

The vapor deposition apparatus is preferably configured such that the guide groove is wider in width at edges of the cover member than in a region of the cover member other than the edges.

According to the foregoing configuration, the gap retaining member surely fits in the guide groove, so as to automatically absorb displacements along the direction perpendicular to the scanning direction. This makes it possible to achieve an improvement yield and an improvement in accuracy.

The vapor deposition apparatus is preferably configured such that the gap retaining member is a roller having a plane of rotation having a raised portion that extends along a center line of the plane of rotation, and the guide groove provided in the cover member has a triangular cross-section.

According to the forgoing configuration, scanning is carried out with the gap retaining member fitting in the guide groove in the cover member. This makes it possible to more highly accurately perform alignment.

The vapor deposition apparatus is preferably configured to further comprising a plurality of guide rollers, supported by shafts on axes perpendicular to that surface of the mask holding member which faces the substrate holding member, which make contact with lateral faces of the substrate holding member along a direction perpendicular to the scanning direction, respectively.

According to the foregoing configuration, the guide rollers are in contact with the lateral faces of the substrate holding member. This makes it possible to adjust and maintain the positional relationship between the film formation substrate and the vapor deposition mask along the direction perpendicular to the scanning direction.

Therefore, according to the foregoing configuration, a displacement of the film formation substrate along the direction perpendicular to the scanning direction can be automatically corrected by the guide rollers, so that the film formation substrate can be aligned in a correct position. Further, according to the foregoing configuration, the provision of guide rollers specialized in an alignment function improves alignment accuracy.

The vapor deposition apparatus is preferably configured such that: the mask holding member includes a stage provided next to a mask holder by which the vapor deposition mask is held; and the guide rollers are provided in the stage.

The foregoing configuration makes it possible to, in replacing the vapor deposition mask, easily replace the substrate holder while keeping the stage intact. This improves the ease with which replacement is made, and improves mass productivity.

The predetermined pattern can be an organic layer of an organic electroluminescence element. The vapor deposition apparatus can be suitably used as an apparatus for manufacturing an organic electroluminescence element. That is, the vapor deposition apparatus may be an apparatus for manufacturing an organic electroluminescence element.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

A vapor deposition apparatus of the present invention is suitably applicable to an apparatus for manufacturing an organic EL display device or a similar apparatus that is used in a film-forming process such as formation of organic layers separately painted in an organic EL display device.

REFERENCE SIGNS LIST

1 Organic EL display device
2 Pixel
2R, 2G, 2B Subpixel
10 TFT substrate
11 Insulating substrate
12 TFT
13 Interlayer film
13a Contact hole
14 Wire
15 Edge cover
15R, 15G, 15B Opening
20 Organic EL element
21 First electrode
22 Truncated conical part
22 Layer that serves both as a positive-hole injection layer and a positive-hole transport layer
23R, 23G, 23B Light-emitting layer
24 Electron transport layer
25 Electron injection layer
26 Second electrode
30 Adhesive layer
40 Sealing substrate
50 Vapor deposition apparatus
51 Vacuum chamber
52 Substrate holder (substrate holding member)
52a Protrusion
52b Hole
52c, 52d, 52e Edge
53 Substrate moving mechanism (moving mechanism)
54 Mask unit
55 Mask unit moving mechanism (moving mechanism)
60 Vapor deposition mask
60a Long side
60b Short side
61 Opening
61a Short side
61b Long side
62 Alignment marker
70 Vapor deposition source
71 Nozzle hole
80 Mask holding member
81 Mask holder (mask holding member)
81a Opening
81b, 81e Depression
81c, 81d Groove
82 Mask tray (mask holding member)
82a Opening
83 Roller (gap retaining member, first gap retaining member)
83a Center line
85 Mask holder fixing member
86 Roller stage (stage)
86a Opening
86b, 86c Depression
91 Substrate holder holding member (substrate holding member)
91a Substrate holder receiving part
92 Substrate holder supporting spring (spring, gap control auxiliary member)
93 Column support (gap control auxiliary member)
94 Bearing
101 Mask holder holding member (mask holding member)
102 Mask holder supporting spring (spring, gap control auxiliary member)
101a Mask holder receiving part
103 Column support (gap control auxiliary member)
104 Bearing
113 Column support (gap control auxiliary member)
120 Roller (gap retaining member)
121 Cylindrical part (gap retaining part)
122 Truncated conical part (substrate guiding part)
123 Boundary
131 Guide roller (second gap retaining part)
133 Guide roller
135 Guide roller
141 Substrate frame (cover member)
142 Opening
143 Roller guide groove (guide groove)
144 Roller guide groove (guide groove)
200 Film formation substrate
200a Short side
200b Long side
201 Panel region (vapor deposition region)
202 Alignment marker
211 Vapor-deposited film

The invention claimed is:

1. A vapor deposition apparatus for forming a film of a predetermined pattern on a film formation substrate on which the film is to be formed, the vapor deposition apparatus comprising:
a substrate holding member for holding the film formation substrate;
a mask unit including (i) a vapor deposition source from which vapor deposition particles are ejected, (ii) a vapor deposition mask which has openings and causes the vapor deposition particles ejected from the vapor deposition source to be vapor-deposited on the film formation substrate through the openings, and (iii) a mask holding member for holding the vapor deposition mask, the vapor deposition mask being smaller in area than the film formation substrate, the vapor deposition source and the vapor deposition mask having their relative positions fixed; and
the vapor deposition apparatus is configured for scanning, wherein at least one of (A) the mask unit and (B) the substrate holding member move relative each other during vapor deposition,
the substrate holding member and the mask holding member being placed opposite each other so that the vapor deposition mask and the film formation substrate face each other during scanning, the substrate holding member being arranged to face the vapor deposition mask during scanning, the mask holding member being arranged to face the film formation substrate during scanning,
the vapor deposition apparatus further comprising at least one gap retaining member provided in a surface of the mask holding member which surface is to face the film formation substrate during scanning, said at least one gap retaining member protruding toward a surface of the substrate holding member, said at least one gap retaining member rotating, during scanning, in a scanning direction while in contact with the member it faces and thereby keeping a gap between the vapor deposition mask and the film formation substrate constant during scanning, at least part of said at least one gap retaining member is disposed between the film formation substrate and the vapor deposition mask, and
said at least one gap retaining member comprising a gap retaining member arranged to directly or indirectly make contact with a non-vapor-deposition region of the film formation substrate.

2. The vapor deposition apparatus as set forth in claim 1, wherein the gap retaining member is a roller.

3. The vapor deposition apparatus as set forth in claim 1, wherein the substrate holding member includes (i) a substrate holder to which the film formation substrate is fixed, (ii) a substrate holder holding member for holding the substrate holder, and (iii) a gap control auxiliary member expandably and contractibly provided between the substrate holder holding member and the substrate holder.

4. The vapor deposition apparatus as set forth in claim 3, wherein the gap control auxiliary member is constituted by a spring and a column support, the spring and the column support being fixed to at least one of (A) the substrate holder holding member and (B) the substrate holder,
the vapor deposition apparatus further comprising a hole or a groove into which the column support is inserted, the hole or the groove being provided in a surface of the other one of (A) the substrate holder holding member and (B) the substrate holder which faces the spring and the column support, the other member facing the one member, wherein
the spring has a larger diameter than the hole or the groove does, and is in contact with that surface of the other member which faces the spring and the column support.

5. The vapor deposition apparatus as set forth in claim 4, wherein:
the substrate holding member is placed beneath the mask holding member so that vapor deposition is carried out by ejecting the vapor deposition particles downward through the openings in the vapor deposition mask;
the substrate holder holding member has a substrate holder receiving part which is in a depressed shape that is larger than the substrate holder; and
at least one of (A) the substrate holder holding member and (B) the substrate holder is provided with the spring and the column support all over a surface of the substrate holder which faces the substrate holder receiving part.

6. The vapor deposition apparatus as set forth in claim 1, wherein the mask holding member includes (i) a mask holder by which the vapor deposition mask is held, (ii) a mask holder holding member for holding the mask holder, and (iii) a gap control auxiliary member expandably and contractibly provided between the mask holder holding member and the mask holder.

7. The vapor deposition apparatus as set forth in claim 6, wherein the gap control auxiliary member is constituted by a spring and a column support, the spring and the column support being fixed to at least one of (A) the mask holder holding member and (B) the mask holder,
the vapor deposition apparatus further comprising a hole or a groove into which the column support is inserted, the hole or the groove being provided in a surface of the other one of (A) the mask holder holding member and (B) the mask holder which faces the spring and the column support, the other member facing the one member, wherein
the spring has a larger diameter than the hole or the groove does, and is in contact with that surface of the other member which faces the spring and the column support.

8. The vapor deposition apparatus as set forth in claim 6, wherein the gap control auxiliary member is fixed to the mask holder holding member.

9. The vapor deposition apparatus as set forth in claim 6, wherein:
the mask holder holding member has such a shape as to hold the mask holder by an edge of an upper surface of the mask holder and an edge of a lower surface of the mask holder; and
the gap control auxiliary member comprises gap control auxiliary members provided between the mask holder holding member and the upper surface of the mask holder and between the mask holder holding member and the lower surface of the mask holder, respectively, so as to make contact with the upper and lower surfaces of the mask holder, respectively.

10. The vapor deposition apparatus as set forth in claim 1, wherein:
the gap retaining member comprises at least two gap retaining members provided on a side of the mask holding member upstream of the scanning direction;
the gap retaining members provided on the side of the mask holding member upstream of the scanning direction each include a rotating body and a substrate guiding part provided at an edge of the rotating body, the rotating body functioning as a gap retaining part to keep the gap between the vapor deposition mask and the film formation substrate constant, the substrate guiding part protruding further than the rotating body in a direction along which the vapor deposition mask and the film formation substrate face each other; and the gap retaining members provided on the side of the mask holding member upstream of the scanning direction are each placed so that a boundary between the gap retaining part and the substrate guiding part meets either edge of the film formation substrate along a direction perpendicular to the scanning direction.

11. The vapor deposition apparatus as set forth in claim 10, wherein:

the gap retaining members respectively provided on right and left edges of the mask holding member upstream of the scanning direction each have a structure including a cylindrical roller and a truncated conical roller provided at one end of the cylindrical roller, the truncated conical roller being axially supported by a rotating shaft by which the cylindrical roller is supported, the truncated conical roller being provided integrally with the cylindrical roller; and the cylindrical roller functions as the gap retaining part, and the truncated conical roller functions as the substrate guiding part.

12. The vapor deposition apparatus as set forth in claim 1, wherein:

the mask holding member includes (i) a mask tray which is frame-shaped and which directly holds the vapor deposition mask and (ii) a mask holder which is frame-shaped and which holds the mask tray; and the gap retaining member is provided in the mask holder.

13. The vapor deposition apparatus as set forth in claim 1, wherein:

the gap retaining member includes (i) a first gap retaining member provided in a first region on a surface of the mask holding member which faces the substrate holding member, the first region overlapping the film formation substrate during scanning, and (ii) a second gap retaining member provided on a second region on that surface of the mask holding member which faces the substrate holding member, the second region overlapping the substrate holding member but not overlapping the film formation substrate during scanning.

14. The vapor deposition apparatus as set forth in claim 13, wherein:

the second gap retaining member comprises second gap retaining members provided on sides of the mask holding member upstream and downstream of the scanning direction with respect to the vapor deposition mask; and a distance between an edge of the substrate holding member upstream of the scanning direction and an edge of the film formation substrate upstream of the scanning direction is greater than an installation width at which the second gap retaining member provided upstream of the scanning direction and the second gap retaining member provided downstream of the scanning direction are placed from each other.

15. The vapor deposition apparatus as set forth in claim 13, wherein:

the mask holding member includes a stage provided next to a mask holder by which the vapor deposition mask is held; and the gap retaining member is provided in the stage.

16. The vapor deposition apparatus as set forth in claim 1, wherein:

the substrate holding member includes (i) a substrate holder for holding the film formation substrate and (ii) a cover member covering part of a vapor deposition surface of the film formation substrate held by the substrate holder, the cover member being fixed to the substrate holder so that a vapor deposition region of the film formation substrate is exposed; and the cover member is provided with a guide groove in which the gap retaining member fits.

17. The vapor deposition apparatus as set forth in claim 16, wherein the guide groove is wider in width at edges of the cover member than in a region of the cover member other than the edges.

18. The vapor deposition apparatus as set forth in claim 16, wherein the gap retaining member is a roller having a plane of rotation having a raised portion that extends along a center line of the plane of rotation, and the guide groove provided in the cover member has a triangular cross-section.

19. The vapor deposition apparatus as set forth in claim 1, further comprising a plurality of guide rollers, supported by shafts on axes perpendicular to that surface of the mask holding member which faces the substrate holding member, which make contact with lateral faces of the substrate holding member along a direction perpendicular to the scanning direction, respectively.

20. The vapor deposition apparatus as set forth in claim 19, wherein:

the mask holding member includes a stage provided next to a mask holder by which the vapor deposition mask is held; and the guide rollers are provided in the stage.

21. The vapor deposition apparatus as set forth in claim 1, wherein the predetermined pattern is an organic layer of an organic electroluminescence element.

22. The vapor deposition apparatus as set forth in claim 1, wherein a height of the gap between the vapor deposition mask and the film formation substrate is in a range of not less than 50 μm but not more than 1 mm.

* * * * *